(12) United States Patent
Wang et al.

(10) Patent No.: US 11,830,954 B2
(45) Date of Patent: Nov. 28, 2023

(54) MICROSTRUCTURE ENHANCED ABSORPTION PHOTOSENSITIVE DEVICES

(71) Applicant: W&WSens Devices, Inc., Los Altos, CA (US)

(72) Inventors: Shih-Yuan Wang, Palo Alto, CA (US); Shih-Ping Wang, Los Altos, CA (US)

(73) Assignee: W&WSens Devices Inc., Los Altos, CA (US)

( * ) Notice: Subject to any disclaimer, the term of this patent is extended or adjusted under 35 U.S.C. 154(b) by 0 days.

(21) Appl. No.: 17/974,325

(22) Filed: Oct. 26, 2022

(65) Prior Publication Data

US 2023/0054279 A1 Feb. 23, 2023

Related U.S. Application Data

(60) Continuation-in-part of application No. PCT/US2021/050717, filed on Sep. 16, 2021, which is a continuation-in-part of application No. 17/182,954, filed on Feb. 23, 2021, now Pat. No. 11,791,432, which is a division of application No. 16/528,958, filed on Aug. 1, 2019, now Pat. No. 11,121,271, which is a continuation-in-part of application No. 15/797,821, filed on Oct. 30, 2017, now Pat. No. 10,446,700, which is a continuation-in-part of application No. 15/309,922, filed as application No. PCT/US2015/061120 on Nov. 17, 2015, now Pat. No. 9,818,893, said application No. 17/182,954 is a continuation-in-part of application No. 15/309,922, filed on Nov. 9, 2016, now Pat. No. 9,818,893, said application No. 15/797,821 is a continuation of application No. 14/947,718, filed on Nov. 20, 2015, now Pat. No. 10,622,498, which is a continuation of application No. PCT/US2014/039208, filed on May 22, 2014.

(Continued)

(51) Int. Cl.
*H01L 31/0236* (2006.01)
*H01L 27/144* (2006.01)
(Continued)

(52) U.S. Cl.
CPC ........ *H01L 31/02363* (2013.01); *G02B 1/002* (2013.01); *G02B 6/4204* (2013.01);
(Continued)

(58) Field of Classification Search
CPC .......... H01L 31/02363; H01L 27/1443; H01L 27/1446; H01L 27/14625; H01L 31/02;
(Continued)

(56) References Cited

U.S. PATENT DOCUMENTS 9,209,320 B1 * 12/2015 Webster ............ H01L 31/02027
9,331,116 B2 * 5/2016 Webster .............. H01L 27/1464
(Continued)

OTHER PUBLICATIONS

Weishuai Chen, Surface silicon nanostructure for enhancement of blue light absorption, Physics 32 (2022), Published by Elsevier B.V., pp. 2211-3797, 2021.

(Continued)

*Primary Examiner* — Eduardo A Rodela
(74) *Attorney, Agent, or Firm* — Wissing Miller LLP

(57) ABSTRACT

Microstructures of micro and/or nano holes on one or more surfaces enhance photodetector optical sensitivity. Arrangements such as a CMOS Image Sensor (CIS) as an imaging LIDAR using a high speed photodetector array wafer of Si, Ge, a Ge alloy on SI and/or Si on Ge on Si, and a wafer of CMOS Logic Processor (CLP) ib Si fi signal amplification, processing and/or transmission can be stacked for electrical interaction. The wafers can be fabricated separately and then stacked or can be regions of the same monolithic chip. The image can be a time-of-flight image. Bayer arrays can be enhanced with microstructure holes. Pixels can be photodiodes, avalanche photodiodes, single photon avalanche photodiodes and phototransistors on the same array and can be Ge or Si pixels. The array can be of high speed photodetectors with data rates of 56 Gigabits per second, Gbps, or more per photodetector.

20 Claims, 45 Drawing Sheets

Related U.S. Application Data

(60) Provisional application No. 63/415,533, filed on Oct. 12, 2022, provisional application No. 63/394,265, filed on Aug. 1, 2022, provisional application No. 63/391,960, filed on Jul. 25, 2022, provisional application No. 63/388,173, filed on Jul. 11, 2022, provisional application No. 63/356,960, filed on Jun. 29, 2022, provisional application No. 63/350,767, filed on Jun. 9, 2022, provisional application No. 63/349,426, filed on Jun. 6, 2022, provisional application No. 63/345,851, filed on May 25, 2022, provisional application No. 63/344,511, filed on May 20, 2022, provisional application No. 63/341,370, filed on May 12, 2022, provisional application No. 63/340,399, filed on May 10, 2022, provisional application No. 63/335,110, filed on Apr. 26, 2022, provisional application No. 63/333,361, filed on Apr. 21, 2022, provisional application No. 63/332,597, filed on Apr. 19, 2022, provisional application No. 63/317,629, filed on Mar. 8, 2022, provisional application No. 63/314,401, filed on Feb. 26, 2022, provisional application No. 63/312,813, filed on Feb. 22, 2022, provisional application No. 63/296,816, filed on Jan. 5, 2022, provisional application No. 63/287,520, filed on Dec. 8, 2021, provisional application No. 63/285,014, filed on Dec. 1, 2021, provisional application No. 63/281,576, filed on Nov. 19, 2021, provisional application No. 63/272,463, filed on Oct. 27, 2021, provisional application No. 63/232,716, filed on Aug. 13, 2021, provisional application No. 63/213,556, filed on Jun. 22, 2021, provisional application No. 63/209,311, filed on Jun. 10, 2021, provisional application No. 63/205,717, filed on Dec. 29, 2020, provisional application No. 62/199,607, filed on Jul. 31, 2015, provisional application No. 62/197,120, filed on Jul. 27, 2015, provisional application No. 62/188,876, filed on Jul. 6, 2015, provisional application No. 62/182,602, filed on Jun. 21, 2015, provisional application No. 62/175,855, filed on Jun. 15, 2015, provisional application No. 62/174,498, filed on Jun. 11, 2015, provisional application No. 62/171,915, filed on Jun. 5, 2015, provisional application No. 62/157,876, filed on May 6, 2015, provisional application No. 62/154,675, filed on Apr. 29, 2015, provisional application No. 62/153,443, filed on Apr. 27, 2015, provisional application No. 62/139,511, filed on Mar. 27, 2015, provisional application No. 62/111,582, filed on Feb. 3, 2015, provisional application No. 62/100,025, filed on Jan. 5, 2015, provisional application No. 62/090,879, filed on Dec. 11, 2014, provisional application No. 62/081,538, filed on Nov. 18, 2014, provisional application No. 61/826,446, filed on May 22, 2013.

(51) Int. Cl.

| G02B 1/00 | (2006.01) |
|---|---|
| G02B 6/42 | (2006.01) |
| H01L 27/146 | (2006.01) |
| H01L 31/02 | (2006.01) |
| H01L 31/0232 | (2014.01) |
| H01L 31/028 | (2006.01) |
| H01L 31/0352 | (2006.01) |
| H01L 31/036 | (2006.01) |
| H01L 31/075 | (2012.01) |
| H01L 31/077 | (2012.01) |
| H01L 31/09 | (2006.01) |
| H01L 31/103 | (2006.01) |
| H01L 31/105 | (2006.01) |
| H01L 31/107 | (2006.01) |
| H01L 31/18 | (2006.01) |
| H04B 10/25 | (2013.01) |
| H04B 10/40 | (2013.01) |
| H04B 10/69 | (2013.01) |
| H04B 10/80 | (2013.01) |

(52) U.S. Cl.
CPC .......... *G02B 6/428* (2013.01); *H01L 27/1443* (2013.01); *H01L 27/1446* (2013.01); *H01L 27/14625* (2013.01); *H01L 31/02* (2013.01); *H01L 31/028* (2013.01); *H01L 31/02016* (2013.01); *H01L 31/0232* (2013.01); *H01L 31/0236* (2013.01); *H01L 31/02325* (2013.01); *H01L 31/02327* (2013.01); *H01L 31/02366* (2013.01); *H01L 31/036* (2013.01); *H01L 31/0352* (2013.01); *H01L 31/035218* (2013.01); *H01L 31/035281* (2013.01); *H01L 31/075* (2013.01); *H01L 31/077* (2013.01); *H01L 31/09* (2013.01); *H01L 31/103* (2013.01); *H01L 31/105* (2013.01); *H01L 31/107* (2013.01); *H01L 31/1075* (2013.01); *H01L 31/1804* (2013.01); *H01L 31/1808* (2013.01); *H04B 10/25* (2013.01); *H04B 10/40* (2013.01); *H04B 10/691* (2013.01); *H04B 10/6971* (2013.01); *H04B 10/801* (2013.01); *G02B 1/005* (2013.01); *Y02E 10/547* (2013.01); *Y02P 70/50* (2015.11)

(58) Field of Classification Search
CPC ........... H01L 31/0232; H01L 31/02325; H01L 31/02327; H01L 31/0236; H01L 31/02366; H01L 31/028; H01L 31/035218; H01L 31/035281; H01L 31/09; H01L 31/103; H01L 31/107; H01L 31/1075; H01L 31/1804; H01L 31/1808
See application file for complete search history.

(56) References Cited

U.S. PATENT DOCUMENTS

| 9,876,045 | B2* | 1/2018 | Komori | H01L 27/1464 |
|---|---|---|---|---|
| 11,594,657 | B2* | 2/2023 | Dheeraj | H01L 31/1852 |
| 2010/0271524 | A1* | 10/2010 | Venezia | H01L 27/1463 |
| | | | | 257/292 |
| 2014/0167066 | A1* | 6/2014 | Kashima | H01L 33/20 |
| | | | | 257/98 |
| 2018/0033895 | A1* | 2/2018 | Mazzillo | G01J 1/44 |
| 2020/0135776 | A1* | 4/2020 | Finkelstein | H01L 27/14636 |
| 2021/0305440 | A1* | 9/2021 | Zang | H01L 31/02027 |

OTHER PUBLICATIONS

Takashi Takemoto, A 50-GB/s High-Sensitivity (−9.2 dBm) Low-Power (7.9 pJ/bit) Optical Receiver Based on 0.18-μm SiGe BiCMOS Technology, IEEE Journcal of Solid-State Circuits, vol. 53, No. May 2018, pp. 1518-1538.

Dhruv Patel, A 112 GB/s −8.2 dBm Sensitivity4-PAM LinearTIA in 16nm CMOS with Co-Packaged Photodiodes Dhruv Patel, IEEE CICC 2022, 2 pages.

A. Sammak, A 270×1 Ge-on-Si photodetector array for sensitive infrared imaging, Optical Sensing and Detection III, vol. 9141, 2014, 7 pages.

(56) References Cited

OTHER PUBLICATIONS

Shou-Gwo Wuu, A Review of 3-Dimensional Wafer Level Stacked Backside Illuminated CMOS Image Sensor Process Technologies, IEEE Transactions on Eelctron Devices, 2022, pp. 1-13.

Michael Oehme, Backside Illuminated "Ge-on-Si" NIR Camera, IEEE Sensors Journal, vol. 21, No. 17, Sep. 1, 2021, pp. 18696-18705.

Densely packed 1.1 µm-band vertical cavity surface emitting laser array for co-packaged optics, Japanese Journal of Applied Physics, 2022, pp. 1-16.

Anastassios Mavrokefalos, Efficient Light Trapping in Inverted Nanopyramid Thin Crystalline Silicon Membranes for Solar Cell Applications, NANO Letters, Department of Mechanical Engineering, Massachusetts Institute of Technology, 2012, vol. 12, pp. 2792-2796.

Jinwen Song, High-efficiency and high-speed germanium photodetector enabled by multiresonant photonic crystal, Nanophotonics 2020, pp. 1-25.

Hilal Cansizoglu, IEEE PTL-Dramatically Enhanced Efficiency Ultra-fast Silicon MSM Photodiodes Photon-trapping Structures, IEEE Photonics Technology Letter, 2019, pp. 1-4.

Eli Yablonovitch, Intensity Enhancement Textured Optical Sheets Solar Cells, IEEE Transactions on Electron Devices, vol. ED-29, No. 2, Feb. 1982, pp. 300-305.

Jun Yang, Light Trapping in Conformal Graphene/Silicon Nanoholes for High Performance Photodetectors, Applied Materials & Interfaces, 2019, vol. 11, pp. 30421-30429.

William Shockley, Detailed Balance Limit-of-efficiency of pn Junction Solar Cells, Journal of Applied Physics, vol. 32, No. 3, Mar. 1961, pp. 510-519.

Y. Ebiko, Low Power Consumption and High Resolution 1280X960 Gate Assisted Photonic Demodulator Pixel for Indirect Time of Flight, IEEE, 2020, pp. 721-724.

Clifford King, Monolithic Germanium SWIR Imaging Array, Research Gate, Infrared Technology and Applications XXXI, 2008, vol. 6940, 10 pages.

Yang Gao, Photon-trapping microstructures enable high-speed high-efficiency silicon photodiodes, Nature Photonics, Apr. 3, 2017, pp. 1-23.

Willie Padilla, Imaging with Metamaterials, Nature Reviews Physics, https://www.nature.com/natrevphys, 16 pages.

Orit Skorka, Tradeoffs With RGB-IR Image Sensors, IEEE Transaction on Electron Devices, 2022, pp. 1-9.

Sungbong Park, A 64Mpixel CMOS Image Sensor with 0.56µm Unit Pixels Separated by Front Deep-Trench Isolation, IEEE, ISSCC, 2022, 3 pages.

Jae Hyeon Park, Optimization of Photodiode Design through Analysis of Full-Well Capacity and Image Lag in 0.5 µm CMOS Image Sensors with Vertical Transfer Gates, IEEE Electron Device Letters, 2022, pp. 1-4.

\* cited by examiner

Photovoltaic vs Photodiode

| | Solar Cell | W&Wsens Devices Photodetctor |
|---|---|---|
| Mode | Photovoltaic | Photodiode |
| External Bias | No | Yes (reverse bias) |
| Gain | No | Yes (avalanche gain) |
| Time Constant | No | Yes (as short as pico seconds) |
| Cell / Device Size (cm$^2$) | 243 | $10^{-4} - 10^{-8}$ |
| Thickness (micron) | 180 – 240<br>3 – 10 with light trapping structures | 0.1 – 5 with light trapping microholes |
| Efficiency | 25% power efficiency with or without light trapping structures | 85% external quantum efficiency at 850 nm |
| Commercial Product with light trapping structures | No | Yes |
| | | |

*FIG. 3*

MICROSTRUCTURE ENHANCED ABSORPTION PHOTOSENSITIVE DEVICES

REFERENCE TO RELATED APPLICATIONS

This application is a continuation-in-part of each of:
International Patent Appl. No. PCT/US21/50717 filed Sep. 16, 2021.
U.S. patent application Ser. No. 17/182,954 filed Feb. 23, 2021;
International Patent Appl. No. PCT/US20/51733 filed Sep. 21, 2020;
U.S. patent application Ser. No. 17/707,429 filed Mar. 29, 2022;
International Patent Appl. No. PCT/US18/43289 filed Jul. 23, 2018; and
International Patent Appl. No. PCT/US18/57963 filed Oct. 29, 2019.

This application incorporates by reference the entirety of the foregoing patent applications and claims the benefit of the filing date of each of the above-identified patent applications, as well as of the applications that they incorporate by reference, directly or indirectly, and the benefit of which they claim, including U.S. provisional applications, U.S. non-provisional applications, and International applications.

This patent application claims the benefit of and incorporates by reference each of the following provisional applications:
U.S. Prov. Ser. No. 63/415,533 filed Oct. 12, 2022;
U.S. Prov. Ser. No. 63/396,091 filed Aug. 8, 2022;
U.S. Prov. Ser. No. 63/394,265 filed Aug. 1, 2022;
U.S. Prov. Ser. No. 63/391,960 filed Jul. 25, 2022;
U.S. Prov. Ser. No. 63/388,173 filed Jul. 11, 2022;
U.S. Prov. Ser. No. 63/356,960 filed Jun. 9, 2022;
U.S. Prov. Ser. No. 63/350,767 filed Jun. 9, 2022;
U.S. Prov. Ser. No. 63/349,426 filed Jun. 6, 2022;
U.S. Prov. Ser. No. 63/345,851 filed May 20, 2022;
U.S. Prov. Ser. No. 63/344,511 filed May 20, 2022;
U.S. Prov. Ser. No. 63/341,370 filed May 12, 2022;
U.S. Prov. Ser. No. 63/340,399 filed May 10, 2022;
U.S. Prov. Ser. No. 63/335,110 filed Apr. 26, 2022;
U.S. Prov. Ser. No. 63/333,361 filed Apr. 21, 2022;
U.S. Prov. Ser. No. 63/332,597 filed Apr. 19, 2022;
U.S. Prov. Ser. No. 63/317,629 filed Mar. 8, 2022;
U.S. Prov. Ser. No. 63/314,401 filed Feb. 26, 2022;
U.S. Prov. Ser. No. 63/312,813 filed Feb. 2, 2022;
U.S. Prov. Ser. No. 63/296,816 filed Jan. 5, 2022;
U.S. Prov. Ser. No. 63/287,520 filed Dec. 8, 2021;
U.S. Prov. Ser. No. 63/285,014 filed Dec. 1, 2021;
U.S. Prov. Ser. No. 63/281,576 filed Nov. 19, 2021; and
U.S. Prov. Ser. No. 63/272,463 filed Oct. 27, 2021.

All of the above-referenced provisional and non-provisional patent applications are collectively referenced herein as "the commonly assigned incorporated applications."

FIELD

This patent specification relates mainly to photosensitive devices. More particularly, some embodiments relate to photosensitive devices having microstructure enhanced absorption characteristics and photosensitive devices being bonded or stacked with CMOS circuits.

BACKGROUND AND SUMMARY OF THE DISCLOSURE

Complementary metal oxide semiconductor (CMOS) image sensors (CIS) are used in many products including cameras for smartphones, tablets, laptops, smart television, interactive devices such as Amazon Alexa, gaming, virtual reality, augmented reality, home and business security, automotive products such as advanced driver assist systems (ADAS), and in medical imaging such as in endoscopy. There is a need for higher spatial resolution, smaller chip size, and/or extended range of wavelength responses are desired for such products, to the near infrared (NIR) region, for example 750-1050 nm in silicon (Si) and 750-1700 n nm with germanium (Ge) on Si. Ge with a thickness of 350 nm on Si can achieve an absorption efficiency of 80% at 1520 nm wavelength and a data bandwidth of 56 Gbps, gigabits per second, see Reference Song et al, High-efficiency and high-speed germanium photodetector enabled by multiresonant photonic crystal.

As semiconductor thickness decreases, the optical absorption efficiency also deceases. To improve absorption efficiency, micro/nano hole or holes are used for light trapping, extending thin Si operating wavelength range of 300-1050 nm and thin Ge, Ge alloy wavelength range of 300-1700 nm. As reported in Ref. Song, Si on Ge on Si photodetector pixel structures with holes have demonstrated high efficiency and speed. Holes in CIS can have a lateral dimension range of 10-2000 nm and in some cases 10-10000 nm and a depth range of 10-2000 nm and can be arranged periodic, aperiodic, random and any combination thereof. Hole or holes can be same or different in dimension and or shape and can be spaced 10-1500 nm and in some cases can overlap and or intersect.

Other applications include three-dimensional (3D) imaging using two or more cameras such as in human or insect vision, or time of flight (ToF), frequency modulation constant wave (FMCW), and/or light distance and ranging (LiDAR), using a light source in constant wave mode (CW) for indirect ToF or a pulse of light mode for direct ToF measurement of distance and topology of objects. Applications include facial recognition, LiDAR for ADAS, virtual and augmented reality, gaming, robotics, machine vision, medical imaging, drones.

To satisfy higher spatial resolutions with smaller chip size, low jitter and high modulation frequency (for ToF), pixels dimensions are in the microns and submicron range where each pixel is a square in most cases and the thickness of Si ranges from 1 to 6 microns and some cases is sub-micron. The thin silicon allows for a fast rise time and therefore a low jitter time and can be in the range of tens of picosecond and in some cases 10 picosecond or less and modulation in the GHz range for FMCW. Depths of millimeters and in some cases sub millimeter can be resolved. However, with thin silicon the external quantum efficiency is degraded due to weak optical absorption. To enhance optical absorption, technology such as photon or light or lightwave trapping can be used to enhance photon absorption and therefore increase the external quantum efficiency (EQE) that is directly proportional to photon absorption. This is particularly important at NIR wavelengths where the Si absorption coefficient is low; for example at 800 nm the absorption coefficient is 850/cm and at 980 nm the absorption coefficient is 96/cm as compared to blue 400 nm at 95000/cm, green 530 nm at 7800/cm and red 700 nm at 1900/cm. As the pixels size approaches one micron or less, a single microstructure hole and or multiple clustered nanoholes on one or more surfaces can significantly enhance absorption and therefor EQE as disclosed in this patent specification.

CIS can be monolithically integrated with ASICs in the case of front illumination, and in some cases such as back illuminated CIS, can have monolithically integrated active silicon electronics such as transistors, and other ASICs for signal acquisition, integration, processing, transmission to name a few, Stacking of logic integrated circuits, memory, artificial intelligence and other functional ASICs wafers can improve performance and reduce overall system power usage, see Reference Wuu, et al, A Review of 3-Dimensional Wafer Level Stacked Backside Illuminated CMOS Image Sensor Process Technologies.

Leveraging CIS stacking technology to co-packaging optics, CPO, for optical interconnects for data centers, high performance computers, 5G and NG networks where N is greater than 5, and any other high speed data links, can significantly improve performance, reduce power consumption per Gbs and reduce cost per Gbs. See for example, Reference Dong et al, Densely packed 1.1 µm-band vertical cavity surface emitting laser array for co-packaged optics.

Using stacking technology for CPO optical receivers, an interposer layer of electrodes in dielectric such as silicon oxide for example can be formed between the high speed photodetector wafer and the transimpedance amplifier, TIA, clock data recovery, CDR, linear amplifiers, equalizer, to name a few to match up the transmission and or biasing electrodes between the photodetector array and ASIC wafers. Additional logic integrated circuits, memory, signal processing, buffering, acquisition, transmission to name a few, artificial intelligence, edge computing to name a few to improve performance and functionality can be stacked.

In some cases, ASICs can be monolithically integrated on the high speed photodetector wafer, for example biasing circuit and can include active electronics.

Photosensors with a single or plural microstructure hole to enhance sensitivity, EQE, photon absorption can improve products in three major multi-billion USD business sectors. Market size for CIS imaging/3D/ToF is a multi-billion USD market growing at CAGR of 44%; see reference 3D Imaging & Sensing—Market and Technology www.yole.fr 2018. Market size for LiDAR for ADAS is also multi-billion USD; The Automotive LiDAR Market April 2018, Yole. Optical interconnect for Data Center is also a multi-billion USD market. See e.g., Light Counting April 2018, https://www.lightcounting.com, all of which are incorporated by reference herein.

SUMMARY OF INITIALLY CLAIMED SUBJECT MATTER

According to some embodiments, a semiconductor device comprises: an I-region of undoped or low doped semiconductor material; a top doped region of semiconductor material over at least a part of the I-region; a bottom doped region of semiconductor material under at least a part of the I-region; wherein the doped regions are doped to opposite polarities and each is doped more than the I-region; one or more deliberately formed nanoholes extending up from a bottom surface of the bottom doped region; wherein the top doped region has a top surface free of deliberately formed nanoholes; a cover layer and a microlens over said top doped layer; a dielectric base region comprising solid material that is under said bottom doped region; an ASIC monolithically integrated with said I-region and doped regions; an ASIC wafer mounted under said dielectric base region; a first set of electrical contacts in said dielectric base region operatively coupled with said ASIC and a second set of electrical contacts in said dielectric base region operatively coupled with said ASIC wafer; and deep trench insulation at each lateral side of said I-region and top and bottom doped regions.

According to some embodiments, the semiconductor device can include one or more of the following: (a) the one or more nanoholes can have lateral dimensions of 10-10,000 nm and heights of 20-5,000 nm; (b) the top doped region can comprise side portions that are adjacent to lateral sides of said I-regions; (c) the device can further comprise at least one nanohole extending up from a bottom surface of at least one of said side portions of the top doped region; (d) said one or more nanoholes extending up from at least one of the side portions of the top doped region can be narrower and/or shallower that said one or more nanoholes extending up from a bottom surface of said bottom doped layer; (e) the I-region and the top and bottom doped regions can comprise Si; and (f) said cover layer can comprise one or more of a solid dielectric material, an antireflection material, and a color filter.

According to some embodiments, a semiconductor device comprises: an I-region of undoped or low doped semiconductor material comprising Ge or an alloy thereof; a first top doped region of semiconductor material comprising Ge or an alloy thereof over at least a part of the I-region; a second top doped region of semiconductor material comprising Si over said first doped region; a bottom doped region of semiconductor material comprising Ge or an alloy thereof under at least a part of the I-region; wherein the first and second top doped regions are doped to one polarity and the bottom doped region is doped to another polarity and each is doped more than the I-region; one or more deliberately formed nanoholes extending up from a bottom surface of the bottom doped region; wherein the second top doped region has a top surface free of deliberately formed nanoholes; a cover layer and a microlens over said top doped layer; a dielectric base region comprising solid material that is under said bottom doped layer; an ASIC monolithically integrated with said I-region and doped regions; an ASIC wafer mounted under said dielectric base region; a first set of electrical contacts in said dielectric base region operatively coupled with said ASIC and a second set of electrical contacts in said dielectric base region operatively coupled with said ASIC wafer; and deep trench insulation (1280) at each lateral side of said I-region and top and bottom doped regions.

According to some embodiments, the device described in the immediately preceding paragraph can include one or more of the following: (a) the one or more nanoholes can have lateral dimensions of 10-10,000 nm and heights of 20-5,000 nm; (b) at least one of said first and second top doped regions can comprise side portions that are adjacent to lateral sides of said I-region; (c) the device can further comprise at least one nanohole extending up from a top surface of said dielectric base region; (d) said one or more nanoholes extending up from said dielectric base region can be narrower and/or shallower that said one or more nanoholes extending up from a bottom surface of said bottom doped layer; (e) the device can further include a semiconductor region that is under the bottom doped region; (f) said one or more nanoholes extending up from the bottom surface of the bottom doped region and said one or more nanoholes extending up from said dielectric base region can pass through said semiconductor region that is under the bottom doped region; and (g) said cover layer comprises one or more of a solid dielectric material, an antireflection material, and a color filter.

According to some embodiment, a semiconductor device comprises: an I-region of undoped or low doped semiconductor material; a first doped region of semiconductor material at one side of the I-region; a second doped region of semiconductor material at another side of the I-region; wherein the doped regions are doped to opposite polarities and each is doped more than the I-region; one or more deliberately formed nanoholes extending into the second doped region from a surface thereof that faces away from the I-region; wherein the first doped region has a surface that faces away from the I-region and is free of deliberately formed nanoholes; a cover layer and a microlens over said first doped layer; a dielectric base region comprising solid material that is adjacent to said surface of the second doped region that faces away from the I-region; an ASIC monolithically integrated with said I-region and doped regions; an ASIC wafer mounted adjacent said dielectric base region; a first set of electrical contacts in said dielectric base region operatively coupled with said ASIC and a second set of electrical contacts in said dielectric base region operatively coupled with said ASIC wafer; and deep trench insulation at outwardly facing sides of said I-region and top and bottom doped regions.

According to some embodiments, the device described in the immediately preceding paragraph can include one or more of the following: (a) the one or more nanoholes can have lateral dimensions of 10-10,000 nm and heights of 20-5,000 nm; (b) the first doped region can comprise side portions that are adjacent to lateral sides of said I-regions; (c) the device can further comprise at least one additional nanohole extending from said dielectric base region into material that is outside said second doped region; and (d) said one or more nanoholes extending from said dielectric base region into said material that is outside the second doped region can be narrower and/or shallower that said one or more nanoholes extending into said second doped layer.

The term "hole" refers in this patent specification to a deliberately formed volume of material shaped and dimensions as specified, that differs from surrounding material in specified electrical and/or optical properties. The material of a hole can be solid, such as a semiconductor with such different electrical/optical properties, or a dielectric, or a gas such as air, or even vacuum. A hole can be into a top surface of a layer, or into a bottom surface, or can be an internal volume that is between a top layer and a bottom layer of a device. Numerous examples of such holes are described in detail infra., and some are interchangeably called protrusions, for example when a hole in the underside of an I-layer is an indentation filled with material protruding from a layer below.

The term "electrode" refers in this specification to material that serves to create desired electrical fields in the disclosed devices and to extract desired electrical signals that the devices produce in response to light illumination. Numerous examples of electrodes are described in detail infra., for example electrodes that comprise electrically conductive material in ohmic contact with doped regions of a device, or electrically conductive material that makes other types of contact such as Schottky junctions.

The terms "top" and "bottom" and similar terms refer to a specified orientation of a device so that, for example, the top of a device being described below becomes its bottom when the device is flipped over or becomes its left or right side when the device is turned 90 degrees.

The term "inverted pyramid" refers to a hole that is pyramid-shaped and has a square top from which it tapers downwardly to a point or a smaller area. Anisotropic wet etch of crystalline silicon (100) surface along (111) crystal facets forms an angle of 54.7 degrees with respect to the (100) crystal plane and can result in an inverted pyramid hole. An inverted pyramid often has a square base (top area) but in some cases can have a rectangular base, for example when several inverted pyramids are in contact or very close proximity. See for example reference. Yokogawa1.

As used herein, the terms "BOX" and "buried oxide" can refer in this patent specification to a buried silicon dioxide material, as in silicon-on-insulator (SOI) structures where the BOX layer is between the Si device layer and the Si handle substrate, but also can encompass any insulating and/or dielectric material. Examples of such insulating materials include, without limitation, silicon oxide, silicon nitride, hafnium oxide, aluminum oxide, molybdenum oxide, titanium oxide, aluminum nitride, and also amorphous semiconductor material and combinations of said materials. Furthermore, the terms "BOX" and "buried oxide" can refer to material that is not yet buried, or never buried, such as material that is deposited or formed on a surface.

As used herein the term "doping polarity" refers to doping of a semiconductor material to P or N type, where P and N are opposite polarities.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIG. 3 is a table comparing properties of photovoltaic (solar cells) versus photodiode according to some embodiments described herein;

DETAILED DESCRIPTION

Figure 1A:
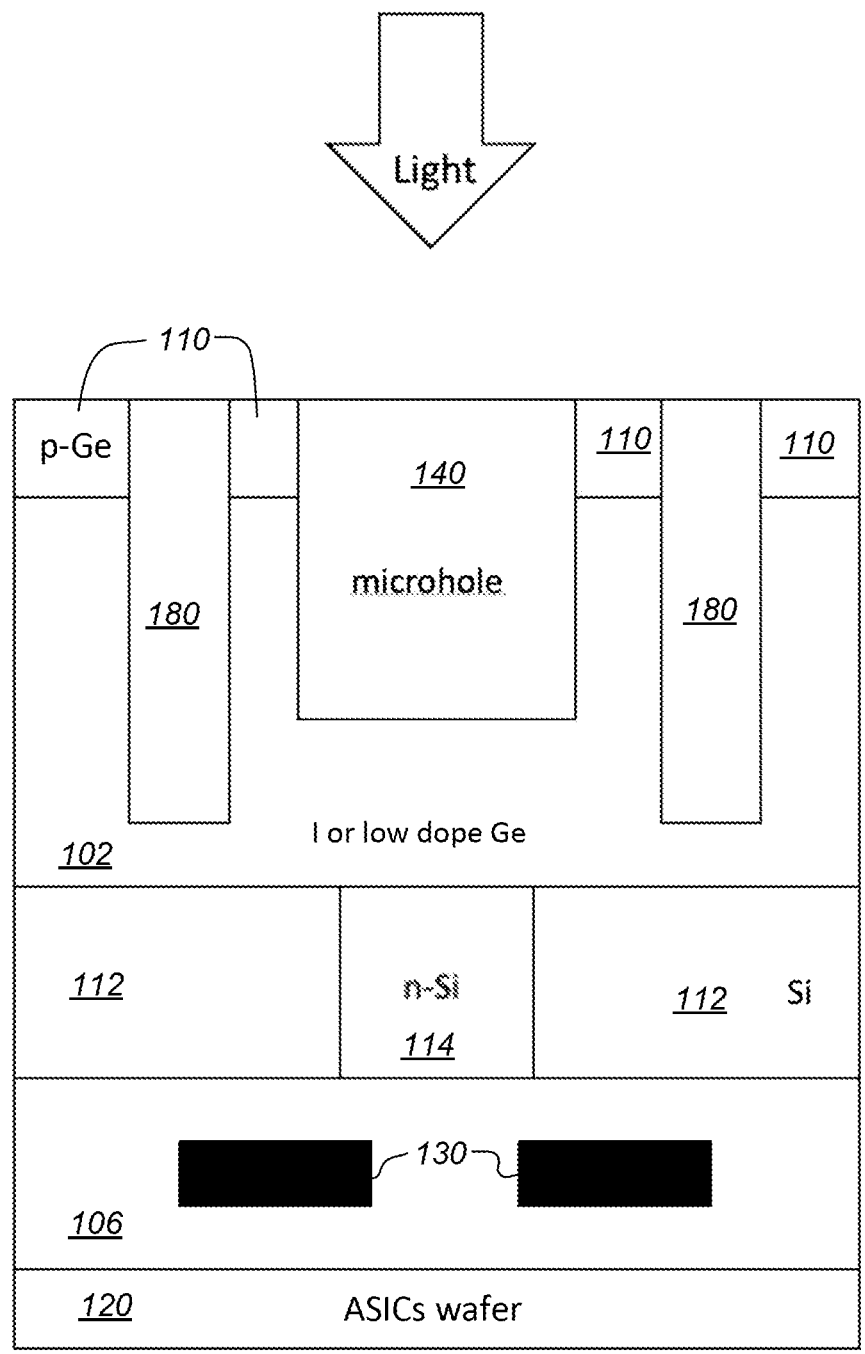
FIGS. 1A and 1B show a simple partial cross sections of a germanium and/or GE alloy pixels for detecting light, according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

All publications cited in this patent specification are hereby incorporated by reference. Some of the figures described herein are simplified in that for clarity they may omit elements of structures that skilled persons would understand need not be shown expressly and the figures may show only a portion of a structure that comprises repeated patterns of the shown portions. For example, a figure may show a device with a single pair of laterally spaced electrodes where the actual device being described includes a collection of two or more such regions on or in the same substrate. The Greek letters ν (nu) and π (pi) denote in this specification semiconductor material that is low doped to N and P doping, respectively, e.g., to no more that about $10^{12}$ per $cm^3$ doping. The semiconductor material regions described in this patent specification are material that is single-crystal or essentially single-crystal except for the deliberately formed "holes" described below, unless otherwise specified. The terms "partial" or "partially" regarding the depth of holes or of etching refer in this specification to holes that extend partway into a region rather than through the entire region.

The photodetectors described herein can be pixels/photosensors for CMOS imaging, and for 3D Time-of-Flight imaging and for high speed photodetectors for optical data communication. These photodetectors can operate as a photodiode (PD), avalanche photodiode (APD), and/or single photon avalanche photodiode (SPAD) with a reverse external bias voltage. In some cases, the photodetectors can operate in a photo transistor mode where forward source drain voltage can be applied with or without a gate voltage which normally is reverse bias. In some cases, the photodetectors can operate in a photoconductor mode where it can be biased either in the forward or reverse direction. In addition to external bias used for the operation of these photodetectors, a time constant is normally associated with each application. For example, for CMOS image sensors, the time constant can range from seconds to milliseconds, for 3D imaging or Time-of-Flight applications the time constant can range from 10's of nano seconds to pico seconds, and for optical data communication applications the time constant can range from nanoseconds to picoseconds, or from 1 Gb/s to 100 Gb/s or more. In addition, each application can be associated with a 2D array size for example for 3D imaging the array can range from 1 million to 100 million pixels or more. For Time-of-Flight the array size can range from 1000 to 10 million or more, and for optical data communication the array can be 1D or 2D and can range in size from 4 to 100 or more. For high spatial resolution CMOS imaging and 3D imaging the pixel size can range from 0.5 microns to 5 microns, and in some cases for lower spatial resolution the pixel size can range from 10 microns-100 microns or more, and for optical data center applications the photodetector can have a lateral dimension ranging from 2 microns to 100 microns, and in some cases 5 microns to 30 microns. In most cases pixels are in a square configuration, however other configurations are possible, and the dimensions given represent a typical lateral dimension of the pixels—for example a pixel can be triangular or polygonal in which the lateral dimension can be the height of the triangle or a diagonal of the polygonal shape. For optical data communications the photodetectors are typically circular, and the dimensions represent the diameter, and in some cases can be polygonal in which case the lateral dimension can represent the largest diagonal for example.

Throughout this description, it is understood that P and/or N type doped regions can be formed in the photodetector such as PN, PIPN, PIP, NIN, PNP, NPN, to name a few to operate in a PD/APD/SPAD/photoconductor/phototransistor modes for example. A voltage bias range can be 0.1-3.3 volts for photodiodes, 3 volts-35 volts for APD, SPAD, and 1 volt-15 volts for phototransistors. The bias voltages can be applied to P and N regions, and in some cases to P and P, N and N.

Throughout this description, it is understood that the photodetectors can be front side illuminated or back side illuminated, and in some cases front side and back side illuminated. These photodetectors can be monolithically integrated with CMOS (complementary metal oxide semiconductor) ASICs (application specific integrated circuits) where the ASICs can be designed for specific applications such as image sensors, Time-of-Flight, or optical data communication. In some cases, the photodetector array can be stacked with CMOS ASICs where the photodetector array or arrays are fabricated on a separate wafer from the CMOS ASICs wafer, and then the wafers are bonded together and interconnect metal electrodes and/or silicide electrodes are formed between the detector array and CMOS ASICs.

In some cases, multiple P and N regions can be formed in or on a photodetector which can be a pixel photosensor, photodiode, photoconductor, phototransistor, photogating, APD, SPAD, silicon photomultiplier to name a few and is some cases there can be multiple pn junctions. In some cases, metal oxide semiconductor (MOS) junctions and/or Schottky junctions can be formed. In some cases, the photodetector can have and/or intrinsic or low doped region.

Photodetectors such as pixel-photosensors, photodiodes, APDs, SPADs, photoconductors, phototransistors with a microstructure hole or holes or with composite micro hole or holes can have a higher external quantum efficiency than comparable photodetectors without microstructure hole or holes or composite micro hole or holes at certain wavelength ranges. Some small photodetectors with lateral dimensions of approximately equal to or less than 3 microns and in some cases approximately equal to or less than 5 microns with only a single microstructure hole or single composite microstructure hole can have an external quantum efficiency greater than a comparable photodetector without a microstructure hole or composite microstructure hole at certain wavelength ranges.

Figure 1B:
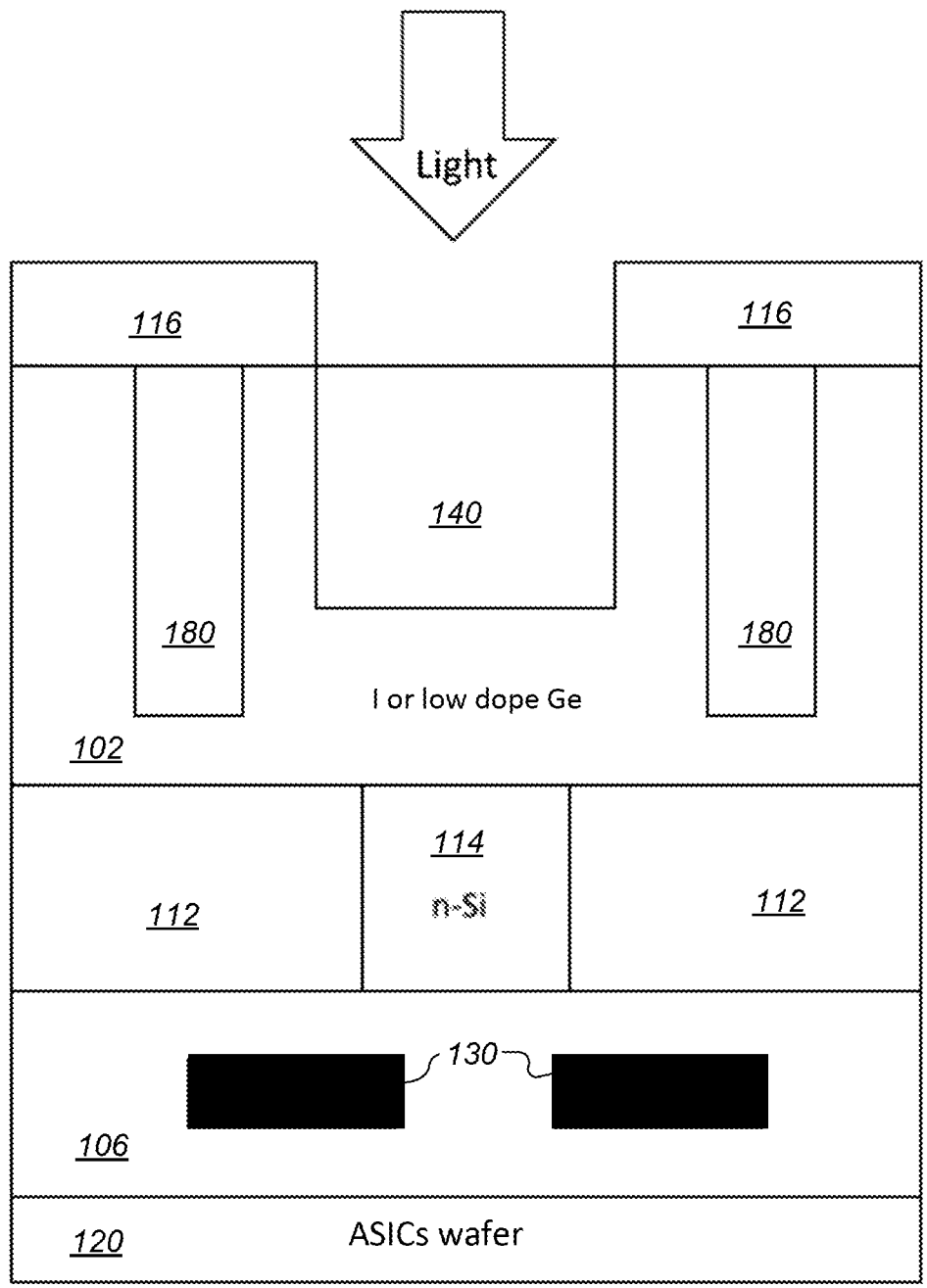

FIGS. 1A and 1B show simple (i.e., simplified) partial cross sections of germanium and/or GE alloy pixels for detecting light, according to some embodiments. The Ge portions can be germanium and/or a Ge alloy, such as GeSi, GeSiSn. As used herein, the term "pixel" refers to a pixel, photodetector and/or photosensor. The pixel shown in FIG. 1A shows a pixel with a microstructure hole or holes 140. The pixel is configured for detecting light in the wavelength range 400-1700 nm and in some cases 700-1650 nm and in some cases 900-1800 nm. Applications include CMOS (complementary metal oxide semiconductor) image sensors, CIS, image sensors, light distance and ranging, LiDAR, high speed optical interconnect, spectroscopic imaging, to name a few.

Microhole(s) 140 in thin semiconductor can enhance optical absorption efficiency and can enable high speed or high bandwidth response to time varying optical signals, for example for LiDAR timing jitter or rise time of the pixel/photodetector can be 100 picosecond or less and in some cases 10 picoseconds or less for applications in time of flight such as LiDAR for example.

Giga hertz, GHz, bandwidths can be 20 GHz or more and in some cases 40 GHz or more and in some cases 60 GHz or more and in some cases 100 GHz or more for applications in LiDAR constant wave and/or optical interconnect receivers for example.

The pixels can be arranged in an array with array size from a few, 2-100, to thousands and millions and tens and hundreds of millions.

The pixels can operate in photodiode, avalanche photodiode, APD, single photon APD, SPAD, with a reverse external bias, with bias voltage ranges 0.1-3.3 volts, V, and in some cases 1-10V, and in some cases 1-30V, where the p doped region is at a more negative electric potential than the n doped region. Ohmic contact can be for on a portion of the p, anode and n, cathode, doped region. The junctions can be pn, pin, nip, pipn, pipin, ninip to name a few. In addition the p and n and i or low dope regions can be in the same or different semiconductor, for example p and i or low doped and n regions can all be in Ge and/or Ge alloys, or p and i or low dope region in Ge and/or Ge alloys and n dope region in Si, or p dope region in amorphous or polycrystalline Si, i or low doped egion in Ge and/or Ge alloys and n dope region in silicon, Si. Dope region polarity p and n can be interchanged.

In some cases, photo transistors with nin. pip, npn, pip junctions can be formed with source drain bias voltages.

As disclosed in the commonly assigned incorporated applications, the microhole 140 can be conformally doped such that the doped region follows the contour of the microhole and in addition on the top surface.

In some cases, Ge or Ge alloy such as GeSi can have a thickness ranging from 50 nm-1000 nm, and in some cases the thickness can range from 100 nm-500 nm, and in some cases 200 nm-400 nm.

FIG. 1A shows a simple partial cross section of a Ge 102 on silicon, Si 112, on dielectric 106 with buried connecting electrodes 130 to cathode and/or anode and to electrode bond pads for stacking with electronic CMOS application specific integrated circuits, ASICs 120, such as imaging processors, memories, amplifiers, data processing units, artificial intelligence, machine learning, data transmitters, signal processing, to name a few. The dielectric 106 can be a single material and/or a composite of materials of silicon oxide, silicon nitride, aluminum oxide, aluminum nitride, hafnium oxide, silicon carbide, titanium oxide, titanium nitride to name a few.

The Si layer or region 112 can be partially or entirely doped n type with single and/or multiple levels of dopant concentration (e.g. n-Si region 114). The Si layer thickness can range from 10 nanometers, nm, to 2000 nm, onto which Ge, Ge alloy 102 can be epitaxially grown and in some cases, selective area epitaxial growth, SAG. The Ge and/or Ge alloy layer or region 102 can be intrinsic or not intentionally doped, i, and/or low doped, with a layer thickness ranging from 100 nm to 1000 nm and in some case 300-500 nm. A p type dopant 110 can be formed on the Ge, Ge alloy surface and in some cases can follow the contour or walls of the microhole or holes. The p doped region 110 can have a single and/or multiple doping levels and can have a depth ranging from 10-300 nm. The doping polarities p and n can be interchanged.

The pixels/photodetectors can be square, rectangle, hexagonal, polygonal, circular and the array can have the same and/or a mixture of shapes and sizes of pixels/photodetectors.

The pixel/photodetector can have a lateral dimension or diameter ranging from 0.5-10 microns and in some cases 1-100 microns.

The hole or holes (microhole(s)) 140, can have the following shapes, circular, square, rectangular, polygonal, oval, amoebic star, chevron, with lateral dimension(s) or diameter ranging from 10-10000 nm and in some cases the holes can overlap and/or intersect, for example two rectangular holes can intersect to form a cross pattern and two cross patterns can intersect to form a tic tac toe pattern. Rectangle hole 140 can have a width of 100 nm and a length of 1000 nm for example.

The hole cross section can be cylindrical, conical, funnel, semicircle, trapezoidal, dovetail, diamond, formed with dry and/or wet etch. The depth of the hole can range from 50-1000 nm. Pixels, photodetectors with multiple holes can have holes with different depths.

The pixel/photodetector can have a single or multiple holes of same or different shapes and of same or different sizes and can be arranged periodically and/or aperiodic and/or randomly.

Deep trench isolation, DTI 180, can be etched in the Ge, Ge alloy layer 102 and in some cases through the Ge, Ge alloy layer into the Si layer 112. DTI 180 are etched between adjacent pixel/photodetector and can have a width ranging from 50-250 nm and a depth ranging from 100-3000 nm and in some cases through the Si layer 112 to the oxide/dielectric layer 106. In some cases, the DTI can be etched ½ to ¾ the thickness of Ge, Ge alloy layer, and in some cases ½ to ¾ into the Si layer. The DTI 180 can be filled fully or partially with Si oxide/nitride, metal oxide/nitride, amorphous Si, a-Si, Ge, Ge alloy, and/or any combinations thereof.

The microhole(s) 140 can be filled with Si oxide/nitride, metal oxide/nitride, amorphous Si, a-Si, Ge, Ge alloy and/or any combinations thereof.

Not shown are planarization layers, optical filters, microlens, connecting electrodes, contact electrodes and/or layers to anodes and cathodes to name a few for simplicity.

FIG. 1B is similar to FIG. 1A but instead of p-regions 110 has of p layer 116 which can be p type amorphous and/or polycrystalline Si and/or SiGe and/or Ge, Ge alloy layer on the crystalline Ge Ge alloy i or low doped layer 102. In some cases, p layer 116 can be a silicide such as metal silicide such as Pt silicide, Al silicide, W silicide to name a few, which can be used as electrodes to anodes and cathodes and in some cases as a Schottky junction to low doped Ge, Ge alloy layer or layers. Thickness range of the p layer and/or silicide 116 can be 10-200 nm for example.

In some cases, the deep trench isolation, DTI 180, can be covered to minimize optical cross talk between adjacent pixels. The cover can be amorphous semiconductor, metal, polymer, dye, alloy, ohmic alloy to name a few.

Figures 1C, 1D:
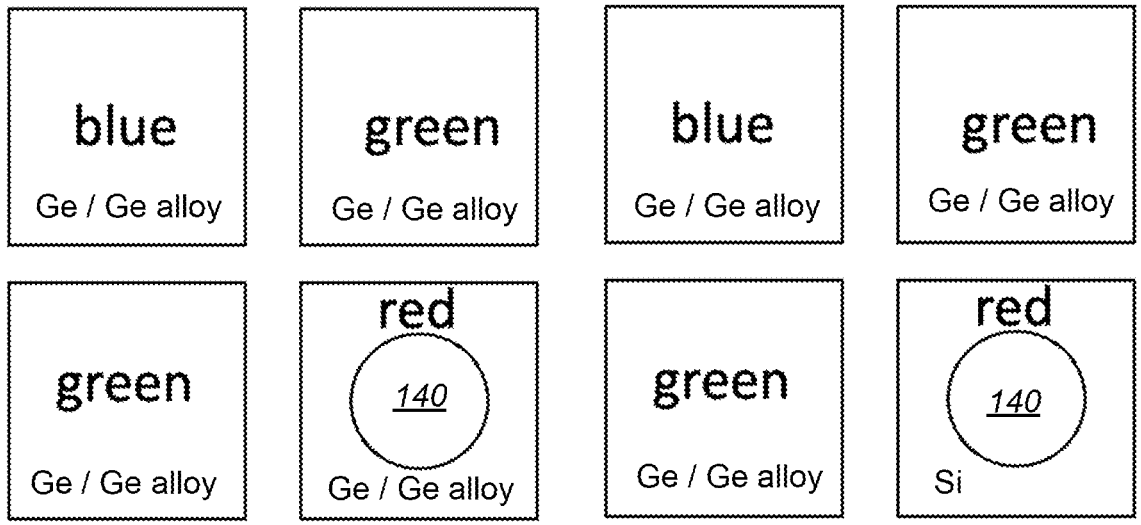
FIGS. 1C to 1D are simple partial top views of variations of Bayer RGB pattern pixels, according to some embodiments.

FIGS. 1C and 1D are simple partial top views of variations of Bayer RGB pattern pixels, according to some embodiments. FIG. 1C shows a simple partial top view of a Bayer pattern Ge and/or Ge alloy(s) on Si pixels with red, green, blue, RGB filter, not shown, and where at least one pixel (the red pixel in this example) has a microstructure hole or holes.

FIG. 1D is similar to FIG. 1C except there is a combination of Si and Ge, Ge alloy pixels, for example as shown, the red pixel can be Ge and the blue, green pixels can be Si.

Figure 1E:
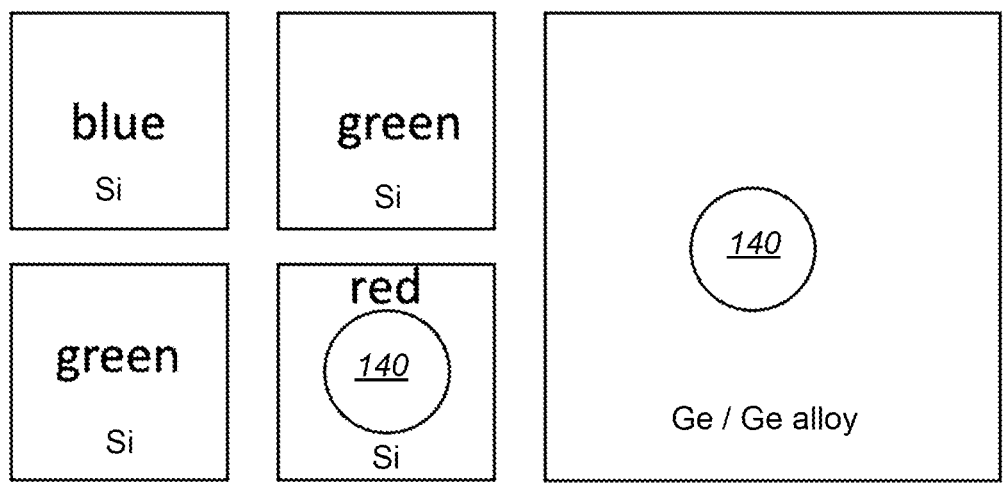
FIG. 1E shows a simple partial to view of a Bayer RGB pattern pixel together with a larger Ge, Ge alloy on Si pixel, according to some embodiments.

FIG. 1E shows a simple partial to view of a Bayer RGB pattern pixel together with a larger Ge, Ge alloy on Si pixel and where the Ge pixel can be approximately the size of a Bayer RGB pattern and in some cases the size of multiple Bayer patterns. The larger Ge pixel allow more sensitive IR light detection at wavelength ranges 800+1600 nm with lower spatial resolution than the smaller pixels in the Bayer RGB pattern. The density of the larger Ge pixels can be the same or less than the Bayer patterns and the larger pixels can be distributed uniformly or non-uniformly. In some cases, the larger Ge pixels can be in the periphery and the Bayer pixels at the center. The Bayer pixels can be Si, and in some cases Ge, Ge alloy, and in some cases a combination of Si and Ge, Ge alloy pixels.

The large Ge pixel can have one or more holes to optimize its IR sensitivities at certain IR wavelengths.

The combination of RGB and Ge based pixels as in FIGS. 1C, 1D, and 1E allows simultaneous visible and IR, infrared, imaging, including three-dimensional, 3D, imaging, with applications in facial recognition, virtual augmented reality, light distance and ranging, LiDAR flash and constant wave, biomedical imaging, spectroscopic, robotic, night vision to name a few.

In some cases, the RGB pixels can all have one or more microstructure holes, and in some cases the microstructure hole(s) can be a composite microstructure hole. The addition of microstructure hole(s) can significantly increase the optical sensitivity at infrared wavelength, which can be beneficial in applications such as low light vision, night vision for security for example, facial recognition, and LiDAR. Other applications can include augmented reality/virtual reality, machine vision, robotics and automotive to name a few.

Figure 1F:
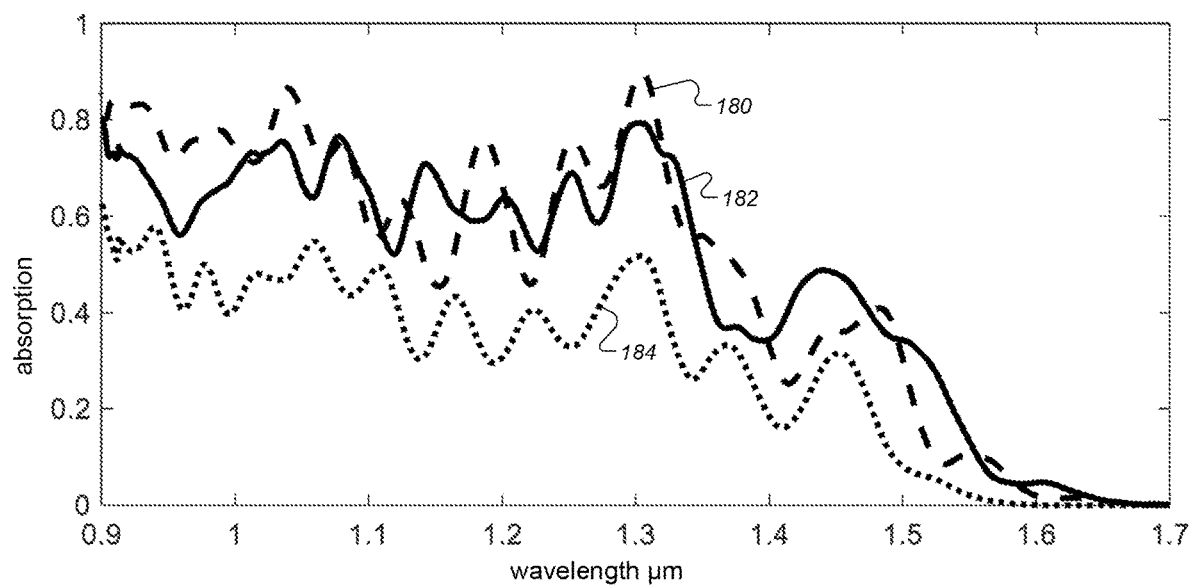
FIG. 1F is a plot of a lumerical simulation of Ge on Si pixels with a microstructure hole on all the RGB pixels which include color filters and microlens of absorption vs wavelength from 900 nm-1700 nm, according to some embodiments.

FIG. 1F is a plot of a lumerical simulation of Ge on Si pixels with a microstructure hole on all the RGB pixels which include color filters and microlens of absorption vs wavelength from 900 nm-1700 nm, according to some embodiments. The pixel size is 1.12 um×1.12 um (micrometeres), and the pixels are separated by a deep trench isolation with a width of 150 nm and a depth of 1500 nm. The Ge has a layer thickness of 500 nm on top of Si with a layer thickness of 2000 nm which in turn in on Si dioxide of 4000 nm thickness.

The dashed curve 180 shows the case of a pixel an inverted pyramid hole of 800 nm×800 nm with an angle to the plane of the surface of 54 degrees, and the solid curve 182 shows the case of a pixel with a cylindrical microstructure hole with a diameter of 800 nm and a depth of 1500 nm. The dotted curve 184 is for a flat pixel without any microstructure holes. As can be seen from the curves the enhancement can range from approximately 10%-20%, and in some cases as high as 50% with the addition of a microstructure hole as compared to a flat pixel.

Figure 1G:
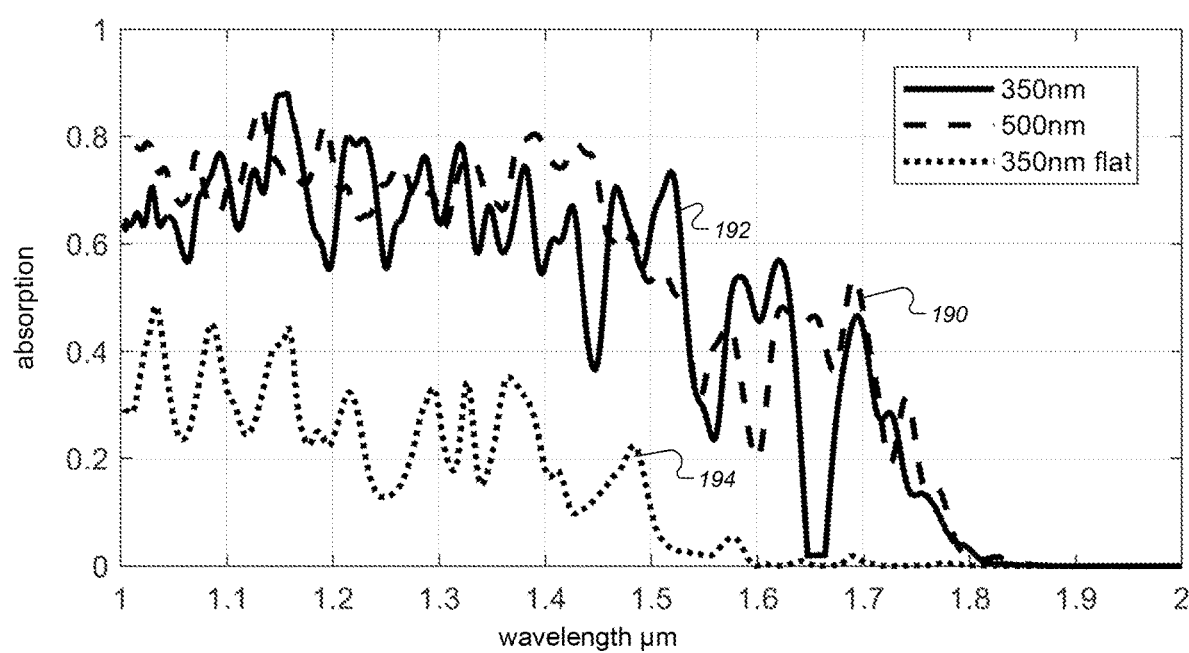
FIG. 1G is a plot of a lumerical simulation optical absorption vs wavelength for 1.12 micron×1.12 micron pixel, according to some embodiments.

FIG. 1G is a plot of a lumerical simulation optical absorption vs wavelength for 1.12 micron×1.12 micron pixel, according to some embodiments. In FIG. 1G, the Ge layer thickness is 500 nm (curve 190) and 350 nm (curve 192) with an 800 nm diameter cylindrical hole with a depth half the thickness of the Ge layer and with isolation trenches of 150 nm width and a depth the thickness of the Ge layer. For comparison, curve 194 shows a Ge layer thickness of 35 nm which is flat (no hole). The absorption vs wavelength plots were generated with lumerical software. The Si layer and the dielectric layer beneath the Si are similar to of the case of FIG. 1F. As can be seen the absorption of the 350 nm thick Ge and the 500 nm thick Ge are similar expect for a few wavelengths showing some resonance. At 1550 nm wavelength the absorption is approximately 50% or more for pixels with holes compared to a flat pixel with no holes.

Figure 2A:
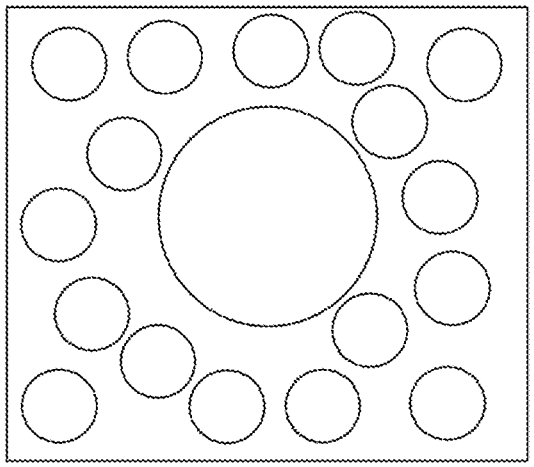
FIGS. 2A-2C are simple partial top views of photodetectors, according to some embodiments.
Figure 2B:
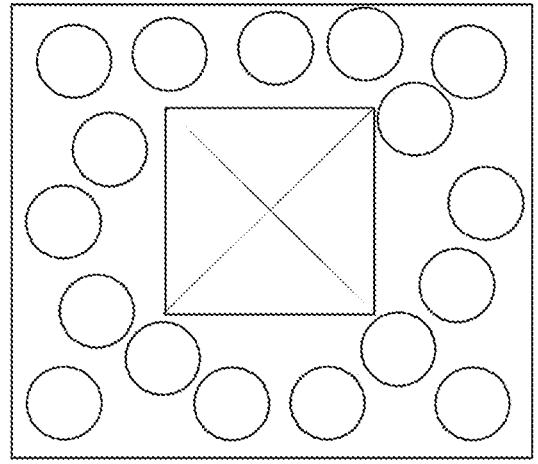
Figure 2C:
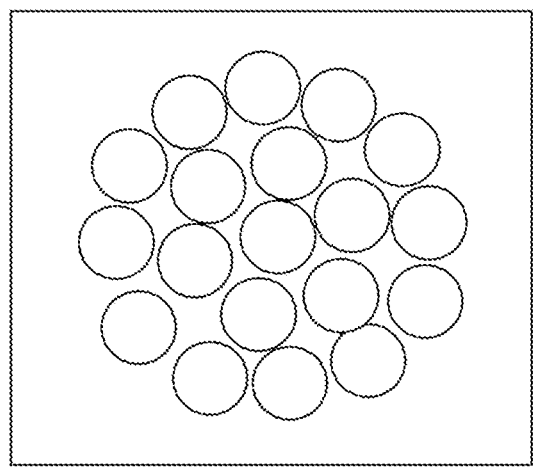

FIGS. 2A-2C are simple partial top views of photodetectors, according to some embodiments. The photodetectors can be pixels of a CMOS image sensor, or a LiDAR range and distance photosensor array that can also image, or high speed high optical sensitivity photodetector array for optical communication. In addition, other applications include biomedical detection and imaging, spectroscopy, remote monitoring of pollution, gas emission, particulates, space optical communication, deep sea imaging and communication optically, and facial recognition, augmented reality, AR, virtual reality, VR, robotics, night vision, thermal imaging, to name a few.

Graphene can be conformally grown on semiconductor surfaces, and on the sidewalls and any exposed surfaces of nano and microholes on silicon and germanium and any alloys containing Si and/or Ge, see for example the paper by J. Yang et al, Light Trapping in Conformal Graphene/Silicon Nanoholes for High Performance Photodetectors, ACS Appl. Mater. Interfaces 2019, 11, 30421-30429, shows conformal growth of graphene in Si nanoholes.

Graphene in Si nano/micro hole(s) can extend the optical sensitivity of the graphene Si photodetector to wavelength of 5000 nm or more, in some cases from 100-10000 nm, and in some cases 100-6000 nm. To use light trapping holes, the lateral dimensions of the hole can be approximately in the range of the wavelength of the incident light and in some cases larger than the incident wavelengths and in some cases smaller than the incident wavelengths. The wavelength can in some cases be the wavelength in the medium in which the light is propagating.

For simplicity, pn, pin, pipn, pipin doped regions are not shown, nor ohmics, connecting electrodes for applying a reverse bias, dielectrics beneath and above the Si layer to name a few.

In some cases the micro and/or nano hole(s) can be filled and/or deposited and/or grown with Ii-VI, Iii-V quantum dots, perovskite, Ge to name a few, to extend the optical sensitivity wavelength of Si past 1100 nm.

FIG. 2A shows a partial schematic top view of a photodetector, in this case a pixel for imaging with a single microhole that is circular, surrounded by nanoholes on Si. In some cases, for larger pixels there can be multiple microholes. The microhole can be of any shapes for example, rectangular, polygonal, donut, circular, oval, square, amoebic, dogbone, irregular, star, chevron, to name a few, with lateral dimensions ranging from 100-10000 nm and in some cases greater than 10000 nm. In the case of multiple microholes, the holes can overlap or intersect to form a cross or tic-tac-toe pattern of 2 or more rectangular holes at orthogonal intersecting angles and in some cases non orthogonal angles for example. The microholes can be arranged in a periodic, aperiodic, random and/or any combination thereof fashion and can have spacings between adjacent microholes ranging from 0-5000 nm. The microholes can be different shape and/or size and/or etch depth in the same pixels or among different pixels. Cross sections of the microholes can be trapezoidal, inverted pyramid, conical, funnel, half dome, cylindrical, gourd, and the side walls can have one or more angle(s), negative and/or positive angle with respect to the normal to the surface. The microhole can have one or more etch depth ranging from 100-10000 nm. and in some cases 50-5000 nm.

Nanoholes with lateral dimensions ranging from 10-1000 nm and in some cases 10-500 nm and in some cases more than 1000 nm can surround the microhole entirely or partially in a random, and/or periodic and/or aperiodic fashion. As with the microhole, the nanohole can have various shapes circular, irregular, polygonal, rectangular, square, amoebic to name a few, and various cross section cylindrical, inverted pyramid, conical, funnel to name a few, and etch depth ranging from 100-10000 nm. Spacing between adjacent nanoholes can range from 0-1000 nm. Where both microhole(s) and nanohole(s) are present, the difference between them is that the nanoholes are smaller than the microholes.

Both micro and nanohole(s) can have graphene single or multiple monolayers deposited on all the surfaces of the micro nano hole(s) and in some cases also on the surface of the Si layer. The micro and/or nano hole(s) can be partially or entirely filled with one or more dielectrics.

FIG. 2B is similar to FIG. 2A except the microhole is an inverted pyramid.

FIG. 2C is similar to FIG. 2A except lacking a microhole, and where the composited nanoholes can have different etched depth such that the overall cross sections of all the nanoholes form a conical or funnel composite microhole as disclosed in earlier applications.

FIG. 3 is a table comparing properties of certain known photovoltaic (solar cells) versus photodiode according to some embodiments described herein.

In photodiodes operate with an external reverse bias, respond times, transit and RC (resistance capacitance) times can be from seconds to picosecond, and are important properties and characteristics of photodiodes that can be optimized for specific applications such as imaging, optical data transmission, time of flight such as light distance and ranging, LiDAR, time transient spectroscopy, to name a few. In addition, avalanche gain can be important in a device such as an avalanche photodiode with or without additional doped regions, such as pn, pin, pipn, pipin to name a few. Photransistors, npn, npn, nin, pip, and metal semiconductor junctions such as Schottky junctions, metal semiconductor metal, MSM, can all be variation of the photodiode.

Light or photon trapping applied to silicon, Si, photodiode can significantly improve the external quantum efficiency at the infrared wavelength as disclosed in U.S. Pat. No. 9,496, 435 and compatible with mature complementary metal oxide semiconductor, CMOS, manufacturing process allowing for mass production at a CMOS foundary, particularly for CMOS image sensors, CIS, optical data communication and LiDAR.

In addition, a single microhole can also significantly enhance absorption in photodiodes for CIS application for example.

Solar cells operate in photovoltiac mode with no external bias, no time constant, and harvest energy from sunlight. Light trapping structures were discussed since 2009 or earlier to enhance optical absorption in Si in the solar spectrum and demonstrated 25% power conversion efficiency in thin Si solar cells with thicknesses of 5 and 10 microns for reducing cost of Si solar cell by using less Si material. See, e.g. A. Mavrokefalos, et al, 2012 paper Efficient Light Trapping in Inverted Nanopyramid Thin Crystalline Silicon Membranes for Solar Cell Applications, Nano Letters 2021. However, the extra processing to thin Si may not be less costly than commercial thick Si solar cells which also has 25% power conversion efficiency.

A. Mavrokefalos, et al, Efficient Light Trapping in Inverted Nanopyramid Thin Crystalline Silicon Membranes for Solar Cell Applications, Nano Letters 2012, hereinafter referred to as "Mavrokefalos, et al 1012," discusses power efficiency at approximately 25% with 5 and 10 micron thick silicon and with light trapping and 25% flat with 300 micron thick silicon (see, e.g. Mavrokefalos, et al 1012, FIG. 3). Experimental data points with power efficiency greater than 25% with light trapping have not been found in this literature. For example, at 300 micron thick silicon and with light trapping the power efficiency should be approximately 30% according to FIG. 3 of Mavrokefalos 1012, which would be a major achievement for silicon solar cells. At least since 2009 or earlier a 25% power efficiency barrier has apparently not been broken for silicon solar cells with or without light trapping structures.

Recombination of photo generated electron-hole, e-h, pairs before the photo generated carriers can contribute to photocurrent can limit the power efficiency.

Consider a whirlpool as a recombination center potential and if a rowboat is a free electron for example, and within the whirlpool capture zone, the rowboat will be sucked into the whirlpool whereas a speedboat in the same situation can escape capture by the whirlpool.

Thus, by applying an external reverse bias between the anode and cathode, the external applied potential can convert the rowboats to speed boats and improve the external quantum efficiencies of the reverse biased photodiode.

U.S. Pat. No. 9,496,435, one of the commonly assigned incorporated applications, discusses reverse external bias between anode and cathode of a photodiode that can significantly improve external quantum efficiency. Together with silicon surface passivation and external reverse bias the external quantum efficiency can be increased over 4 times as shown in FIG. 3. See, e.g.: H. Cansizoglu et al, Dramatically Enhanced Efficiency in Ultra-fast Silicon MSM Photodiodes with Photon-trapping Structures, IEEE Photonic Technology Letters 2019.

The light trapping effect using surface structure to improve photovoltaic solar cell efficiency (Yablonovitch, Intensity Enhancement in Textured Optical Sheets for Solar Cells, IEEE TRANSACTIONS ON ELECTRON DEVICES, VOL. ED-29, NO. 2, FEBRUARY 1982) has been studied and known for the photovoltaic application for nearly forty years. However, it is not known to have led to commercial mass production because it has not provided real extra efficiency advantages. Mavrokefalos, et al 1012 shows experimental results using light trapping structure not exceeding 25% efficiency, which is as in bulk Si solar cells without light trapping structures.

The application of light trapping using more specifically defined surface structure such as microstructured holes, for the photodiode application and through external reverse bias of the photodiode could significantly increase the quantum efficiency with the photodiode reversed biased and with silicon thickness in the range 100-5000 nm and with microstructured hole or holes to enable high external quantum efficiency at the infrared and high speed with response times as short as picoseconds. See, U.S. Pat. No. 9,496,435.

Figure 4:
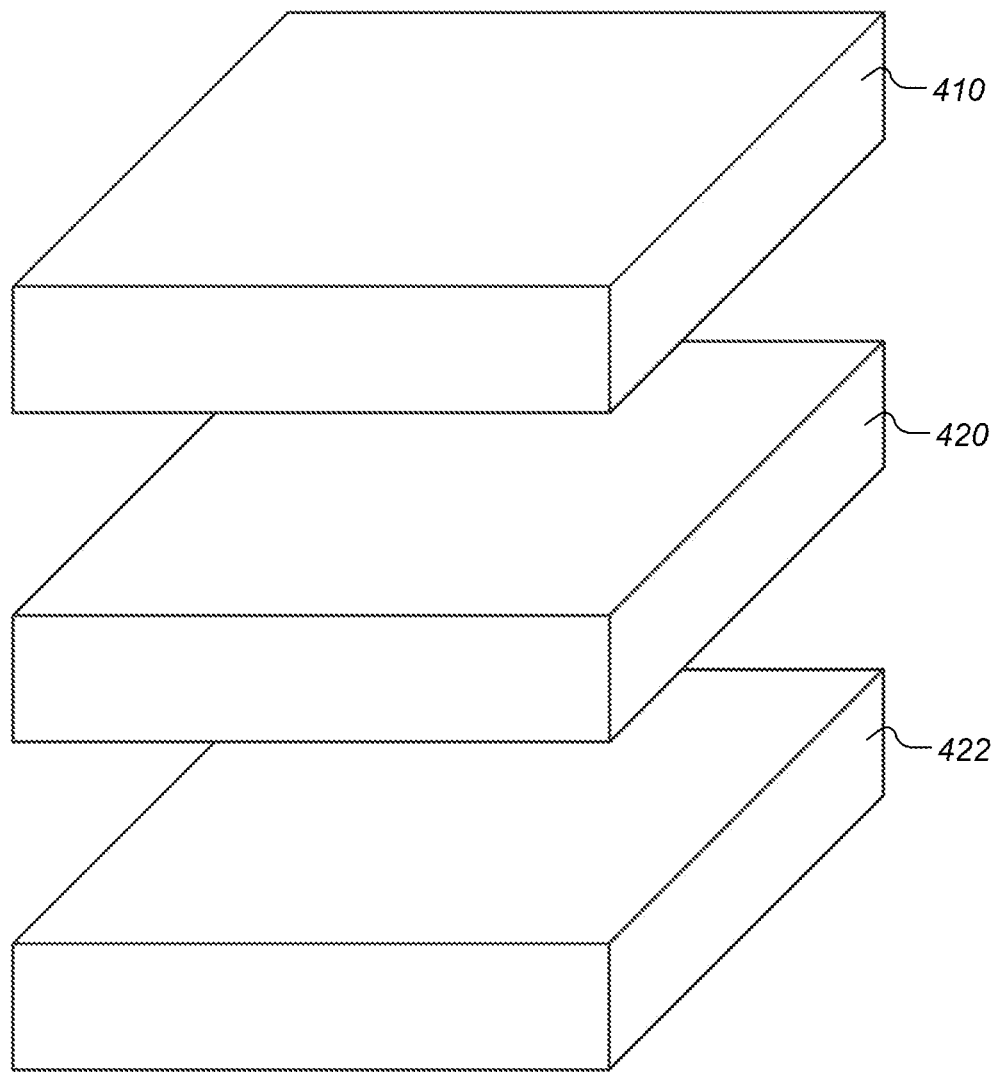
FIG. 4 shows a simple schematic of multi-layer stacking of an image sensing layer with one or more ASICs layers, according to some embodiments.

FIG. 4 shows a simple schematic of multi-layer stacking of an image sensing layer with one or more ASICs layers, according to some embodiments. The image sensing layer 410 can include an array of photodiodes (PD), avalanche photodiodes (APD), single photon avalanche photodiode (SPAD), Silicon photomultiplers (SiPM) which is similar to SPAD, phototransistors and/or any combinations thereof. In some cases, a thin layer of Ge and/or its alloys can be grown on Si epitaxially, and in some cases can be grown using selective area growth epitaxy to increase the detection of light with wavelength from 400 nm-1700 nm or more. In some cases, the wavelength of optical detection with the addition of Ge or Ge alloys can be extended to 1600 nm (400-1600 nm). ASICs 420 and 422 (application specific integrated circuits) can be bonded to the imaging wafer 410 and where the ASICs 420 and 422 can comprise of signal processing CMOS transistors, central processing units (CPU), graphic processing units (GPU), amplifiers, noise reduction circuitry, memories, data transmission circuitries to name a few, and any combinations thereof. Further, in some cases additional ASICs wafers can be bonded to further increase functionality such as artificial intelligence, machine learning, machine vision, and further image process, and communications electronics to other control or ASICs modules for example for autonomous vehicles, cloud, and other data networks within a system to name a few.

Applications can be for LiDAR (light detection and ranging) imaging where the photosensor array can consist of Si pixels and/or Ge alloys pixels and/or different sizes of pixels and/or different types of photodetectors such as PD, APD, SPAD, phototransistors and/or any combination thereof. The ASICs layers can be one or more ASICs wafers bonded for image processing, AI, communications electronics, memory, and/or any other functionalities necessary for autonomous vehicles operation for example.

Multiple stacking of sensor wafer with one or more ASICs wafers can have applications in CMOS imaging sensors where Si pixels and/or Ge alloy pixels can coexist on the same wafer, and in some cases only Ge, Ge alloy pixels on the optical imaging wafer, and in some cases can include Time-of-Flight applications together with imaging.

For high speed optical data communications where the sensor wafer can use arrays of PD and APDs with Si and/or Ge, Ge alloys photodetectors and/or any combination thereof for different wavelength applications, for example in the wavelength range 500-1600 nm.

The microstructure hole or holes used to enhance optical absorption in thin Si and/or thin Ge/Ge alloy crystalline layers can be inverted pyramids, cylindrical holes, cross rectangular holes, tic-tac-toe intersecting rectangular holes, clover leaf holes, amoebic holes, and can be periodic, aperiodic, random or any combination thereof. In some cases, the hole can be overlapping or intersecting and can have geometric or non-geometric shapes for example.

Wuu et al, A Review of 3-Dimensional Wafe rLevel Stacked Backside Illuminated CMOS Image Sensor Process Technologies, IEEE TRANSACTIONS ON ELECTRON DEVICES, 2022, hereinafter "Wuu et al," shows stacking technology for CMOS image sensor wafer to circuit wafer, see for example FIG. 1 of that reference.

Stacking of high-speed photodiodes, HSPD, can include photodiodes and/or avalanche photodiode, APD, array with array size ranging from 1-100 and in some cases 4-16 where each HSPD can have a data rate of 25 gigabits per second, Gbps or Gbs, or more and in some cases 56 Gbps and in some cases a data bandwidth range of 10-112 Gbps, and in some cases more than 112 Gbps. At high data rate bandwidths, circuit parasitics such as resistance, capacitance and inductance can degrade electrical performance and, in some cases, consume excess power. By stacking HSPD(s) with high-speed electronics, circuit parasitics can be significantly reduced due to the proximity of the HSPD array to the high speed electronic circuit. Distance between HSPD and circuits can range from 10-100 microns approximately rather than 1000s of microns or more in conventional lateral packaging. See, e.g. Reference Takemoto et al, A 50-Gb/s High-Sensitivity (−9.2 dBm) Low-Power (7.9 pJ/bit) Optical Receiver Based on 0.18-μm SiGe BiCMOS Technology, IEEE JOURNAL OF SOLID-STATE CIRCUITS, VOL. 53, NO. 5, MAY 2018, FIG. 1.

Wafer level stacking also enable mass parallel assembly of 100-1000 s of optical receivers simultaneously.

The embodiments shown and described herein can be assembled with circuit wafers using wafer level stacking.

Figure 5A:
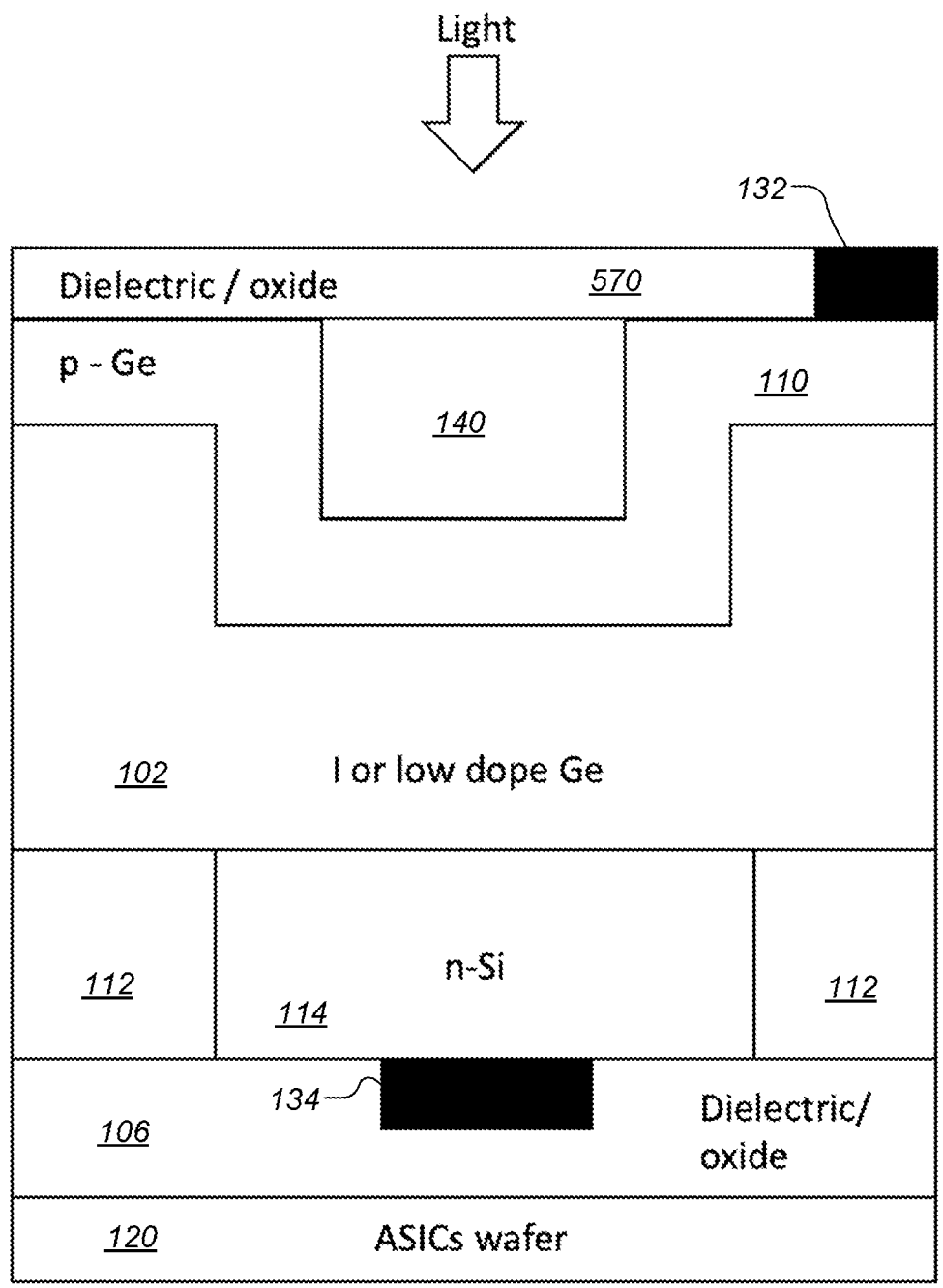
FIGS. 5A and 5B show simple partial schematic cross sections of a Ge and/or Ge alloy on Si pixel and/or high-speed photodetector, according to some embodiments.
Figure 5B:
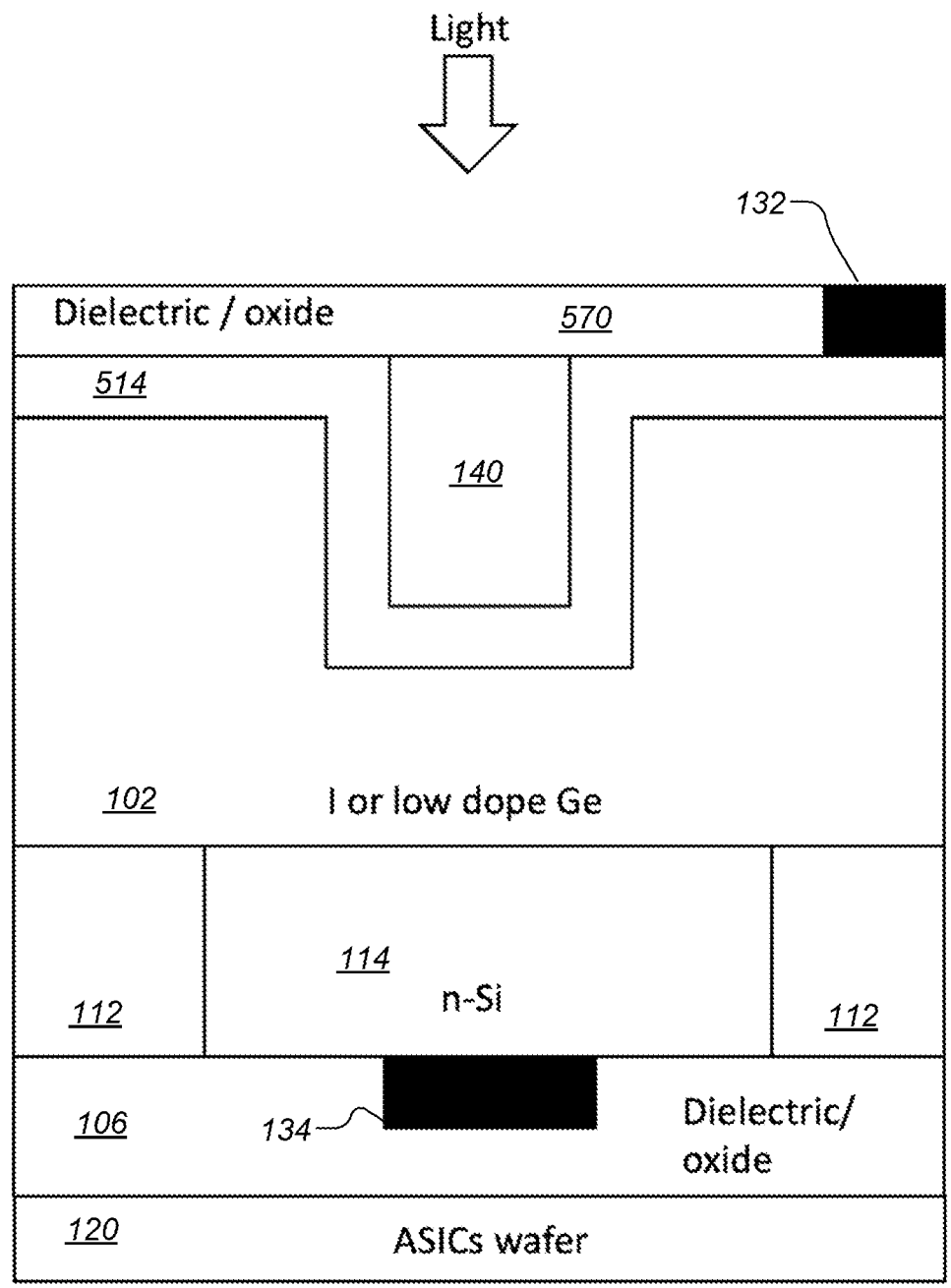

FIGS. 5A and 5B show simple partial schematic cross sections of a Ge and/or Ge alloy on Si pixel and/or high-speed photodetector, according to some embodiments. The p region can be either doped homojunction (110 in FIG. 5A) and/or heterojunction consisting of amorphous or microcrystalline p-Si (514 in FIG. 5B) that follows the contour of the microhole 140. In some cases the p and n regions can be interchanged. In some cases the p region can be delta doped or degenerative doped to minimize surface leakage current. Passivation layers 570 such as high k dielectric such as Hf oxide, Ta oxide to name a few can be deposited on the surface and the contours of the microhole 140 using atomic layer deposition for example and can be followed by other filler oxides such as Si oxide or nitride for planarization. Electrodes 132, 134 can be formed on the n and p doped regions to provide a reverse bias to the pixel and/or high-speed photodetector. The thickness of the Ge and/or Ge alloys (102) can range from 10-1000 nm, and in some cases 100-500 nm. The pixel and/or high-speed photodetector can be square, rectangular, polygonal, circular to name a few. The lateral dimension can range from 0.5 microns-25 microns, and in some cases more than 25 microns. The microhole or holes 140 can be circular, polygonal, square, rectangular, and in some cases can intersect for example forming a cross pattern, tic-tac-toe pattern, or any other intersecting patterns, which can be periodic and/or aperiodic and can be regular or irregular and can have lateral dimensions ranging from 20 nm-25,000 nm, and in some cases 100 nm-3,000 nm as shown in the simple schematic cross section a single microhole, however multiple microholes can be formed on the pixel and/or high speed photodetector. The depth of the microhole can range from 100 nm-1,000 nm, and in some cases from 100 nm-250 nm.

Deep trench isolation, DTI (not shown), can be used in some cases for optical isolation, and in some cases for electrical isolation, and in some cases for both optical and electrical isolation. Ge, Ge alloys pixel/high speed photodetector arrays are shown for cases where microhole or holes can be formed prior to wafer bonding of optical sensor wafer with ASICs wafer(s) and for cases where the microhole or holes are formed after the optical sensor wafers and the ASICs wafers are bonded.

Also, for simplicity not shown are wafer bonding metal pads, interconnecting electrodes within the dielectric of the photosensor wafer and the ASICs wafers.

FIG. 5A shows a p region 110 that is formed on the surface and along the contours of the microhole 140. An n region 114 is formed below the I or low dope Ge or Ge alloys 102 followed by an electrode 134 contacting the n region. A dielectric region 106 is formed. Not shown are bonding and connecting electrodes for stacking with ASICs wafer(s).

FIG. 5B is similar to FIG. 5A but uses a p region 514 for a heterojunction with the I or low dope Ge and/or Ge alloy region 102 rather than material 110 as in FIG. 5A. P region 514 can be amorphous or polycrystalline Si for example. In both FIGS. 5A and 5B the p and n regions can be interchanged.

Figure 5C:
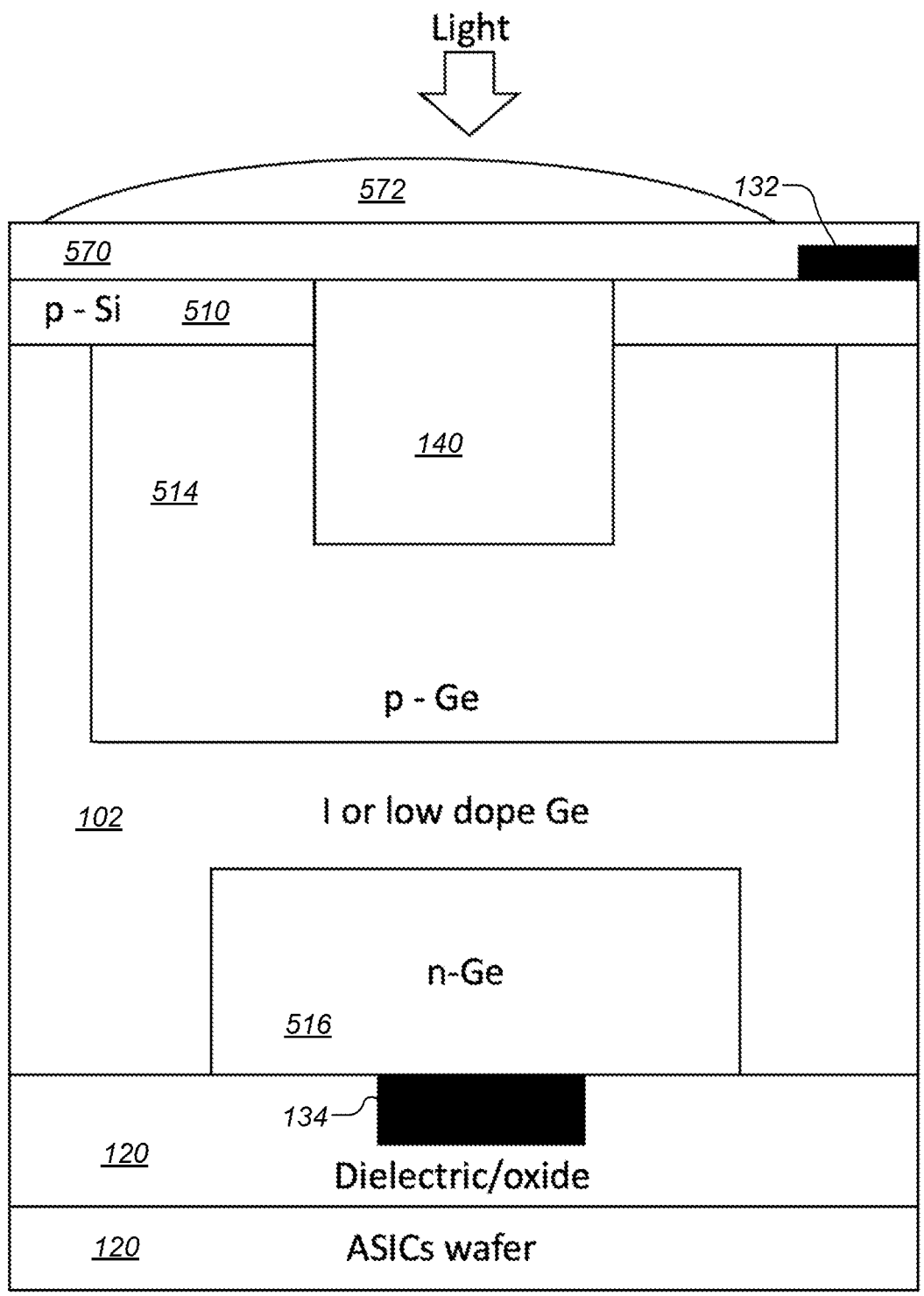
FIGS. 5C, 5D, 5G, 5H, 5P, 5Q, 5R and 5S show simple partial schematics of a Ge, Ge alloy pixel/high speed photodetector, according to some embodiments.

FIGS. 5C, 5D, 5G, 5H, 5P, 5Q, 5R and 5S show simple partial schematics of a Ge, Ge alloy pixel/high speed photodetector, according to some embodiments. In the case of FIG. 5C, the microhole or holes 140 are formed after removing partially or entirely the supporting Si substrate. For simplicity only single pixel/High speed photodetector (HSPD) is shown and only a single hole is shown and other elements such as deep trench isolation, optical filters to name a few are not shown. With these pixels/HSPDs can have a single microhole each and in some cases multiple microholes each. The p-Si layer 510 can be partially or entirely removed and the microhole 140 can be coated with a high K dielectric (570) to reduce dark current, and in some cases can be filled with one or multiple dielectrics, and the microhole or holes can be filled entirely and planarized. Optical filters can be fabricated on top of the photodetector or pixel and the filter can be in the near infrared wavelength range. A microlens 572 in some cases can be formed on the pixel/HSPD and in some cases anti reflection coatings can be formed on the lens and/or at the interface between the microlens 572 and the pixel/HSPD. FIG. 5C shows P and N doped regions 514 and 516 and I or low dope regions in Ge/Ge alloys 102. In some cases the P and N can be interchanged.

In some cases, a P—Ge region 514 may not be needed if a P—Si layer 510 is in contact with the I or low dope Ge 102 creating a hetero junction between the Si and the Ge.

Figure 5D:
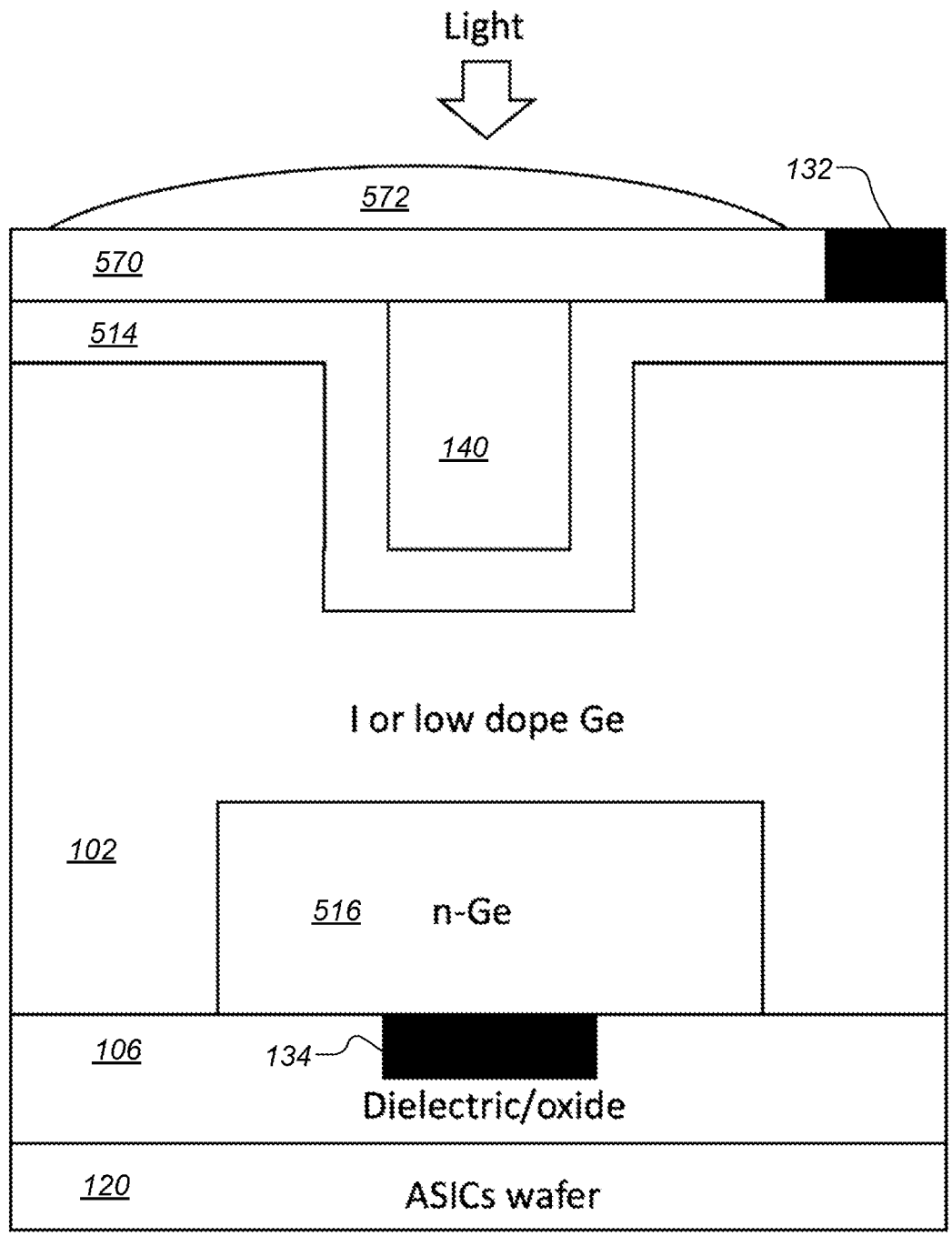

FIG. 5D is similar to FIG. 5C but the P region 514 is amorphous or polycrystalline Si.

Figure 5E:
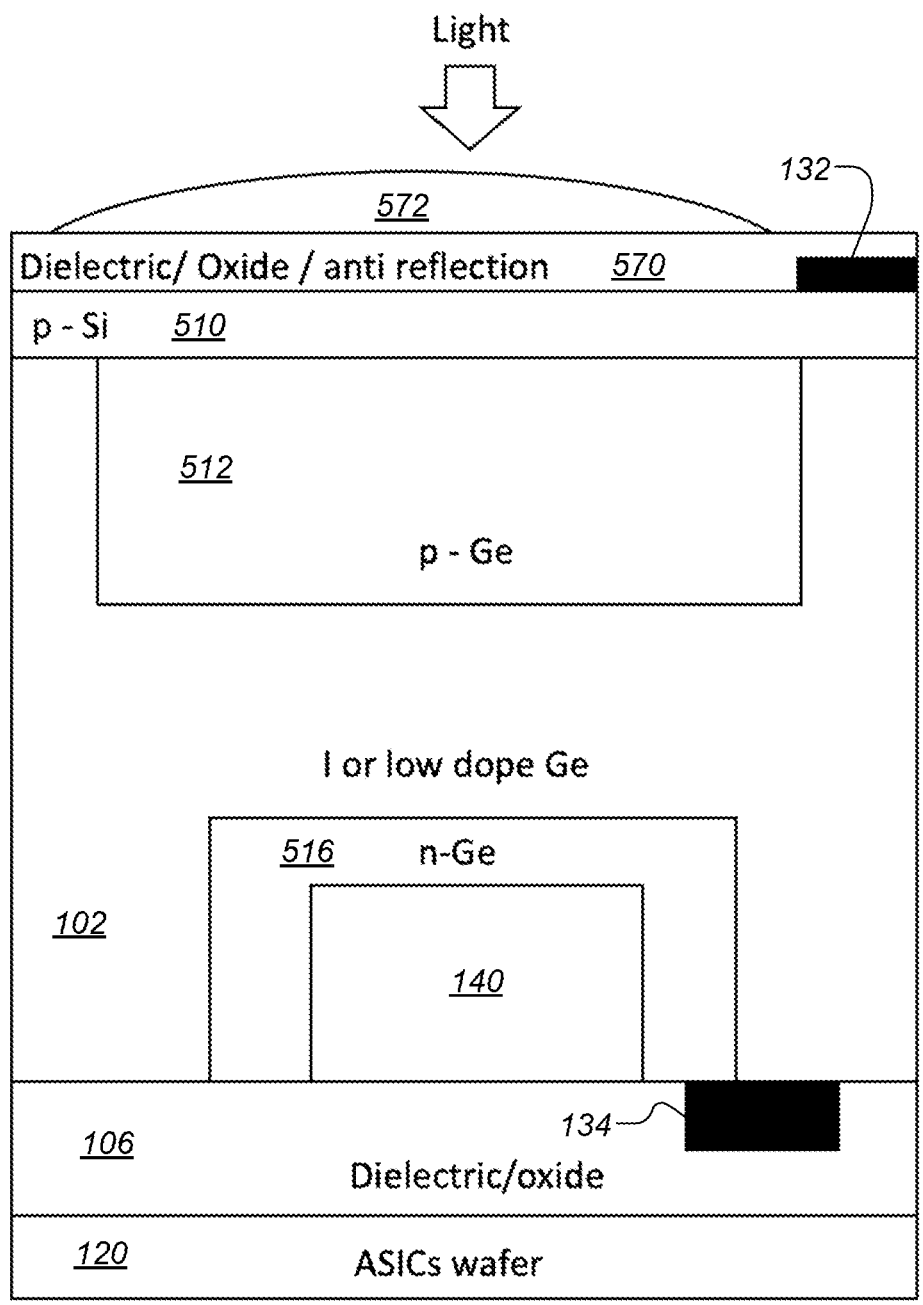
FIGS. 5E, 5F, 5I, 5J, 5K and 5L show simple partial schematics of Ge/Ge alloy pixel/HSPD with one or more microholes, and where a microhole is on the opposite surface of the microlens surface where the incident photons impinge on, according to some embodiments.

FIGS. 5E, 5F, 5I, 5J, 5K and 5L show simple partial schematics of Ge/Ge alloy pixel/HSPD with one or more microholes, and where a microhole is on the opposite surface of the microlens surface where the incident photons impinge on, according to some embodiments. In FIG. 5E, the microhole 140 resides in the N region 516, which itself resides in the Ge/GeSi alloy or any Ge alloys such as GeSn (102). The P—Ge region 512 is in contact with a P—Si region 510.

Figure 5F:
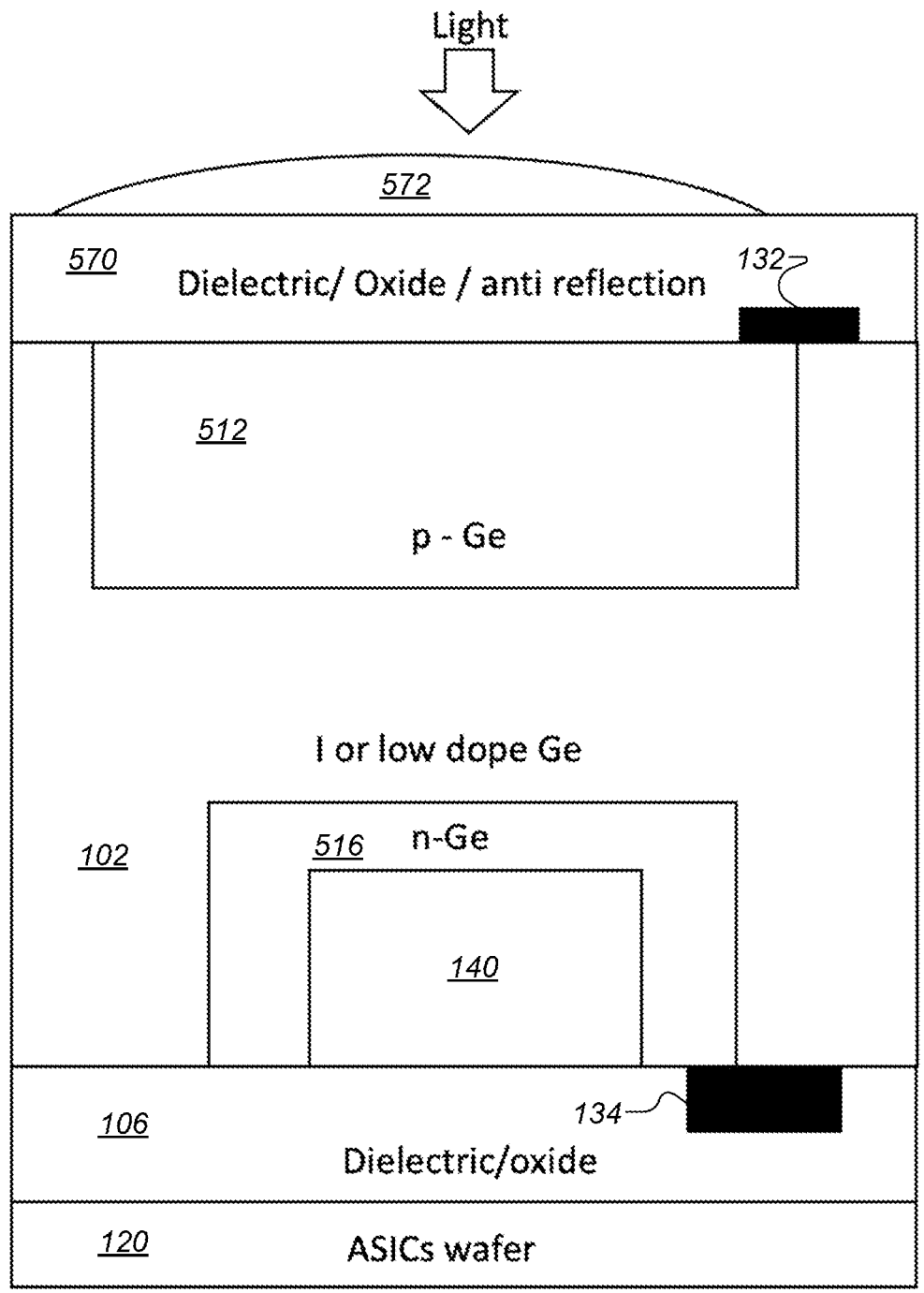

FIG. 5F is similar to FIG. 5E with the exception that the P—Si region is removed.

The thickness of the Ge/Ge alloys 102 ranges from 100-500 nm, and the P—Si 510 thickness ranges from 20-200 nm, and the oxide or dielectric layers 106, 570 thickness can range from 50-5,000 nm. The microhole 140 is filled completely with one or more dielectrics, and planarized. Cathode 134 and anode 132 electrodes are attached to the N and P regions 516 and 510 respectively. Not shown are electrodes for the cathode or anode to connect to a plurality of adjacent pixels/HSPD. Not shown are electrodes connecting to corresponding bond pads to the ASICs wafer.

For simplicity many elements comprising stacked CMOS image sensor pixel or high-speed photodetector array are not shown such as color filters, passivations, connecting electrodes between pixels/photodetector to ASICs circuits, deep trench isolation, planarization layers to name a few. As used herein, the terms "layer" and "layer" can refer to deposition of material such as epitaxial growth of semiconductor material that can be N or P doped and can be I or low dope and can also include atomic layer deposition of material. As used herein, the terms "region" and "regions" refer in some cases to P and N wells that can be formed in I or low dope layers, and in some cases can be formed in P or N layers, and in some cases doped layers can have low or undoped regions. Doped regions are often formed by ion implantation and/or by diffusion of dopants.

Microhole lateral dimension can range from 100-10,000 nm, and in some cases from 400-2,000 nm. In some cases microhole can have multiple lateral dimensions; for example in the case of a rectangular microhole it can have 2 lateral dimensions, and the smaller lateral dimension can range from 10-500 nm, and the larger lateral dimension can range from 400-10,000 nm, and in some cases microholes can intersect for example forming a cross or tic-tac-toe structure with rectangular microholes in which case there can be multiple lateral dimensions and the range for such lateral dimensions can be from 10-10,000 nm.

Figure 5G:
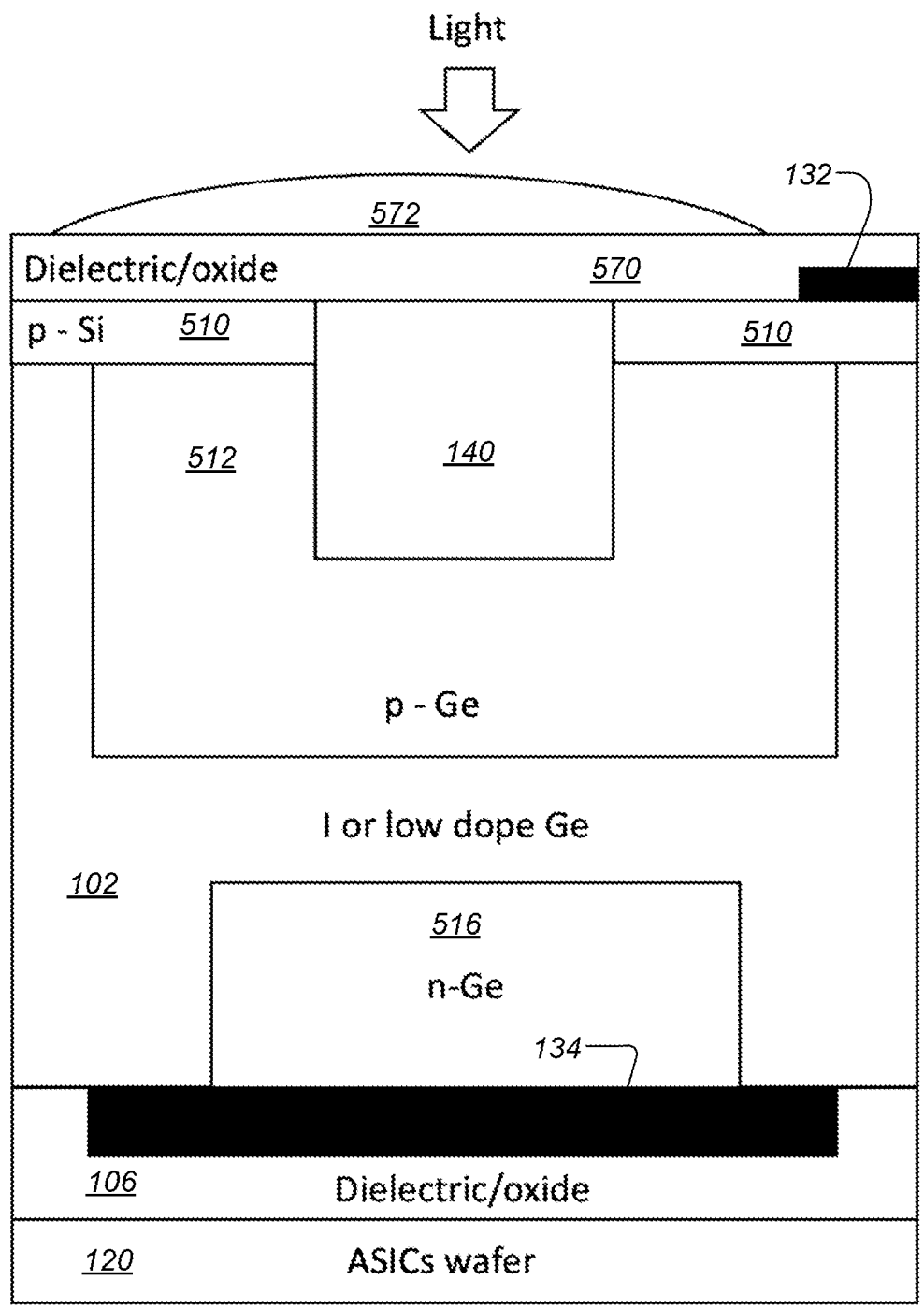

FIG. 5G is similar to FIG. 5C with the exception that the cathode 134 can extend across the n-Ge region 516 and in some cases to the I or low dope Ge region and can act as an optical reflector.

Figure 5H:
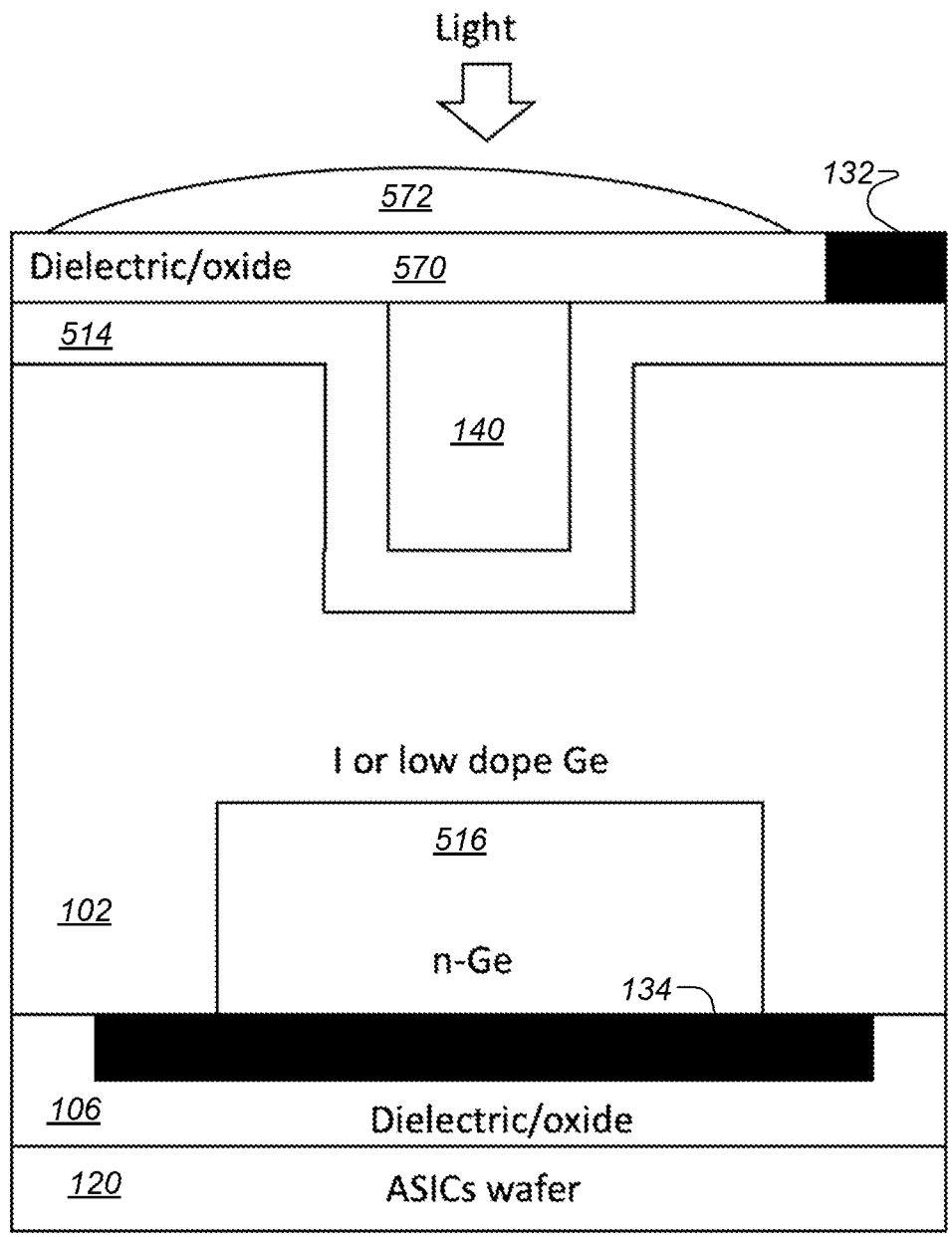

FIG. 5H is similar to FIG. 5D except for the width of the cathode 134 which can extend laterally across most of the pixel to act in addition as a cathode, but also as an optical reflector. In some cases, the P and N region can be interchanged in which the cathode will be an anode.

Figure 5I:
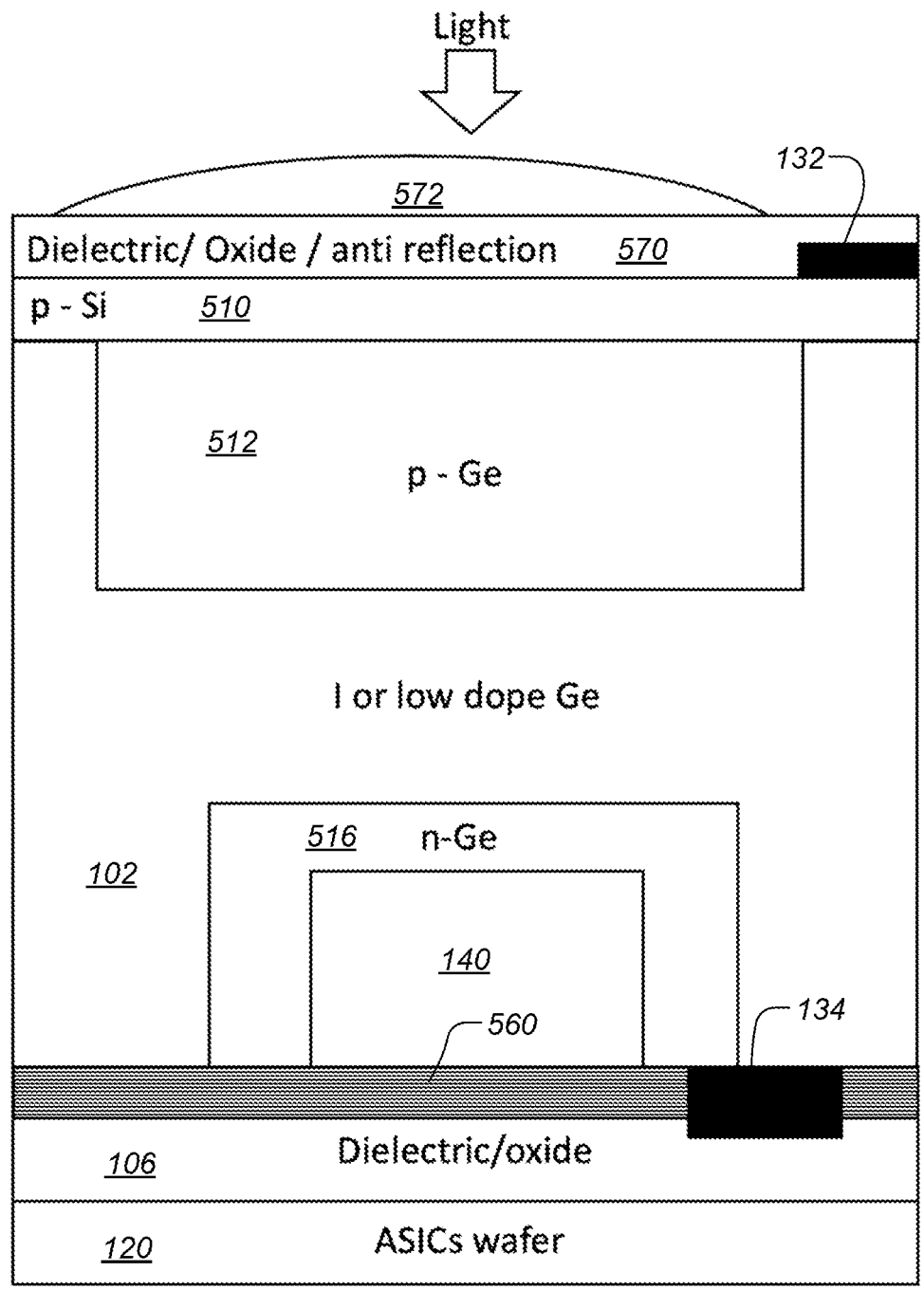

FIG. 5I is similar to FIG. 5E with the exception that a Bragg reflector 560 is added comprising of multiple layers of dielectric material with different refractive indexes for example layers with refractive index n1, and dielectric layer with refractive index n2 and where the layers alternate to form a Bragg reflector and can also form an optical filter to select certain wavelengths. Such Bragg reflectors can be called Bragg mirrors, and in some cases are also known in the scientific literature as distributed Bragg reflectors.

Figure 5J:
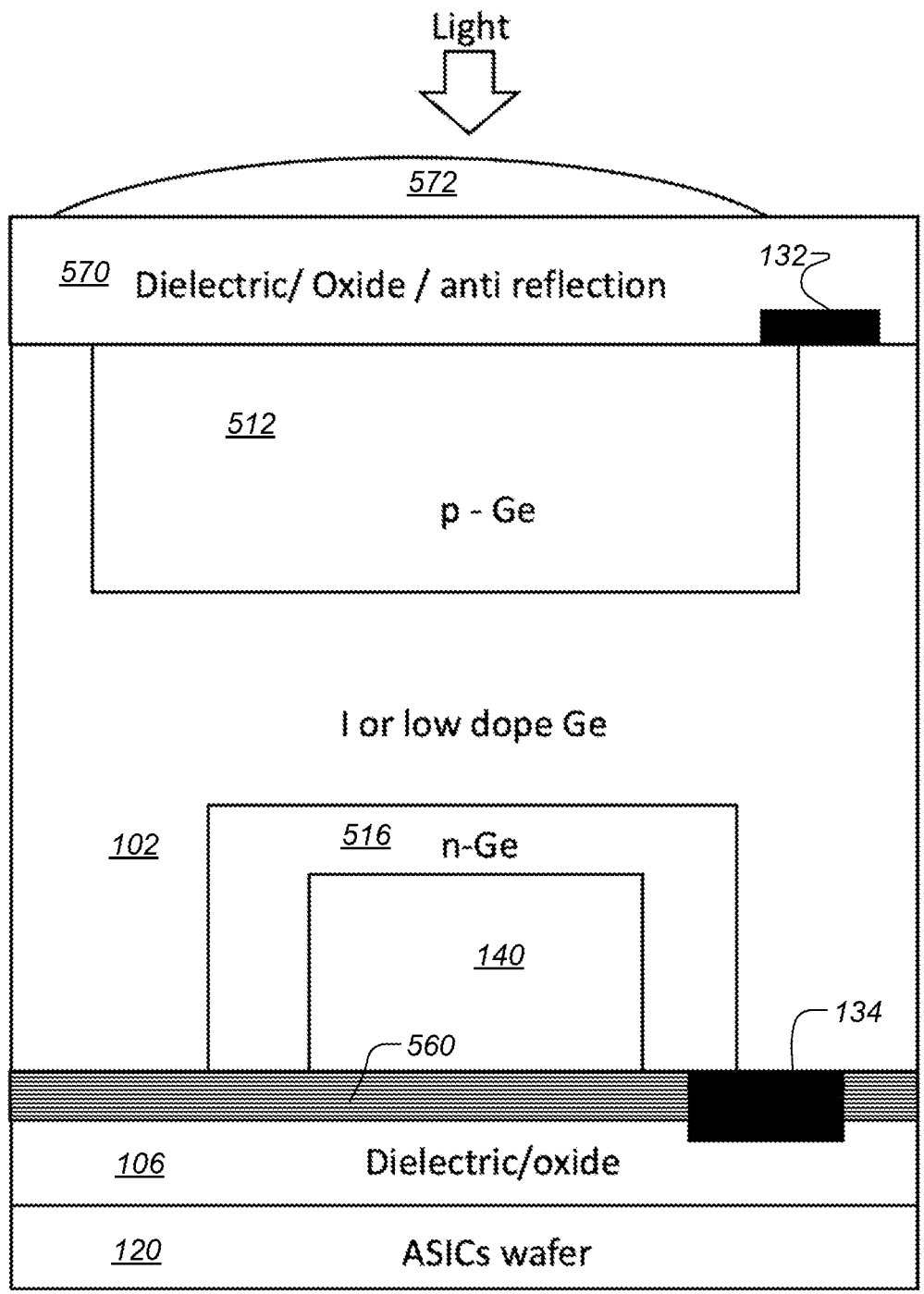

FIG. 5J is similar to FIG. 5F but with the addition of Bragg reflector 560 at the interface between the Ge and oxide layer.

Figure 5K:
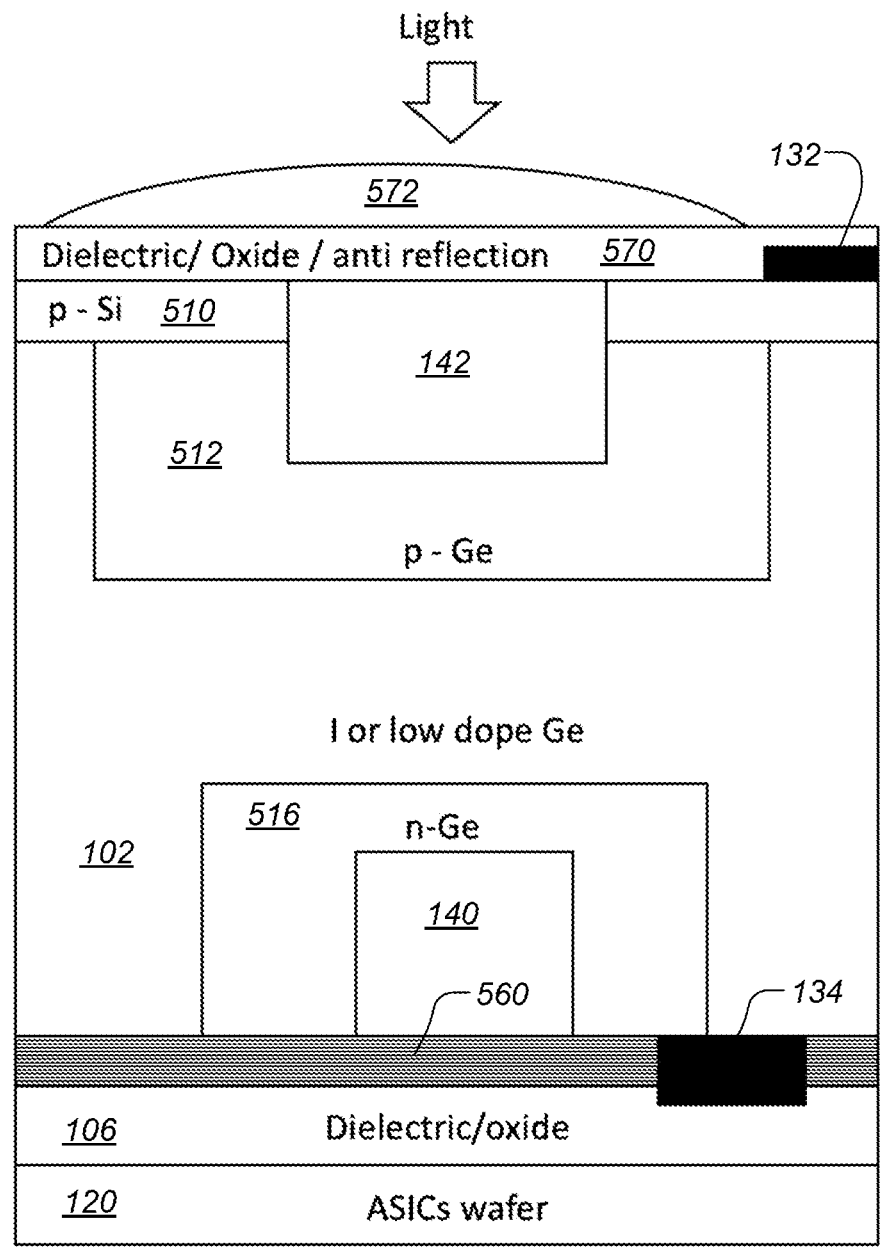

FIG. 5K is similar to FIG. 5I with the addition of a microhole 142 in P region. For small pixels and/or photodetectors a single microhole either at one surface or at both surfaces may suffice to significantly improve the optical absorption at infrared wavelengths as compared to a similar pixel or photodetector without microhole. In some cases, multiple microholes on one or both surfaces can be formed to improve optical absorption which is directly proportional to quantum efficiency. In some cases, larger pixels or photodetectors can have multiple microholes on one surface and/or both surfaces.

Figure 5L:
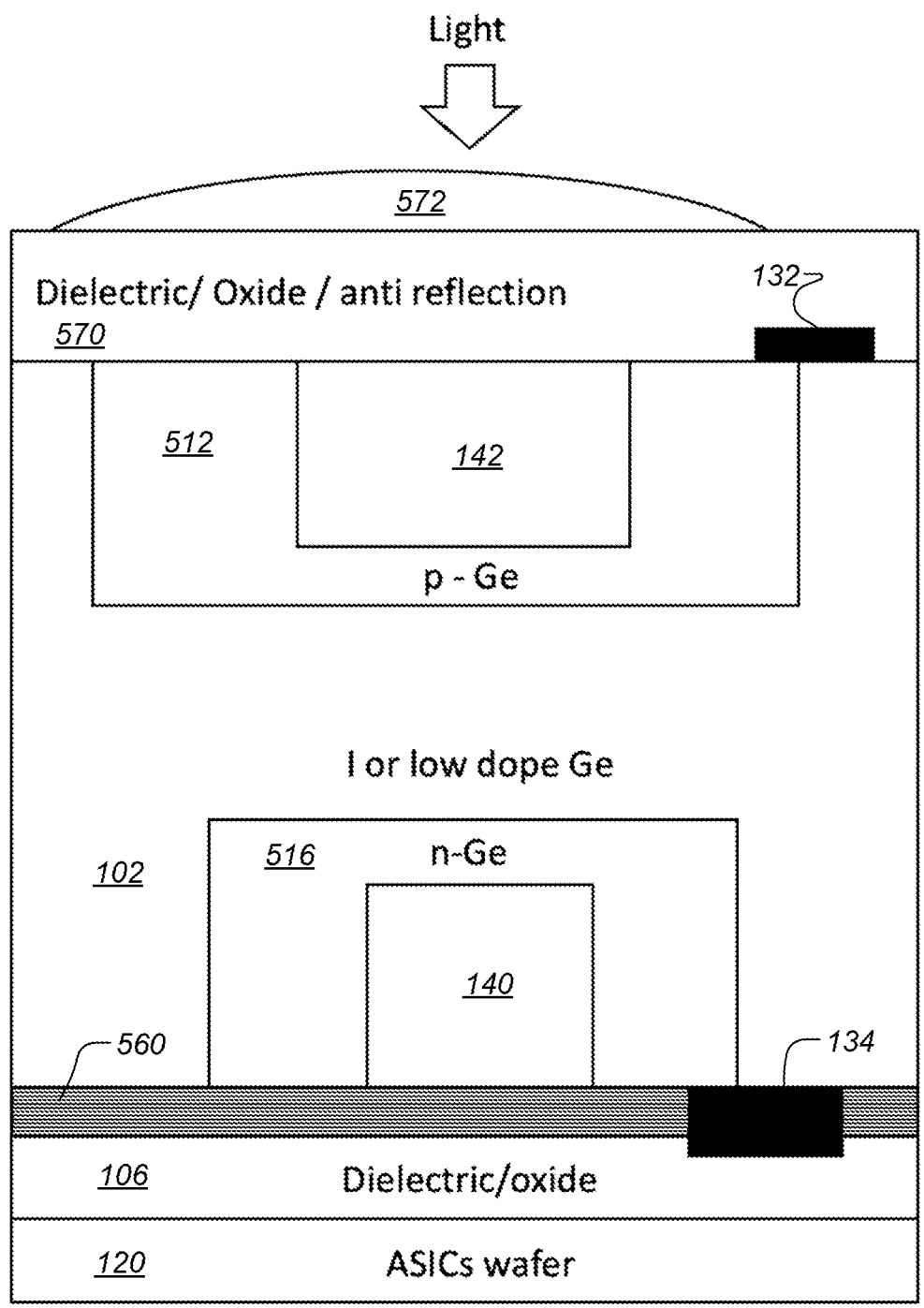

FIG. 5L is similar to FIG. 5K but without the Si layer 510 on the Ge layer 512.

In some cases, one surface can have one microhole, and the second surface can have one or more microholes, and in some cases both surfaces can have one microhole, and in some cases only one surface has a microhole, and in some cases both surfaces can have multiple microholes, and in some cases one surface can have multiple microholes and the other surface has no microholes. The term "surfaces" here refers to the surface on which the light impinges on and the surface on which the sensor wafer is in contact with dielectric layer or layers for stacking to the ASICs wafer. In some cases the term surface refers to the surface on which light impinges on and the other surface is the surface that interfaces with the stacking ASICs wafer, and in some one surface is the surface on which the light impinges on, and the other surface is the surface opposite to the surface that the light impinges on.

Figure 5M:
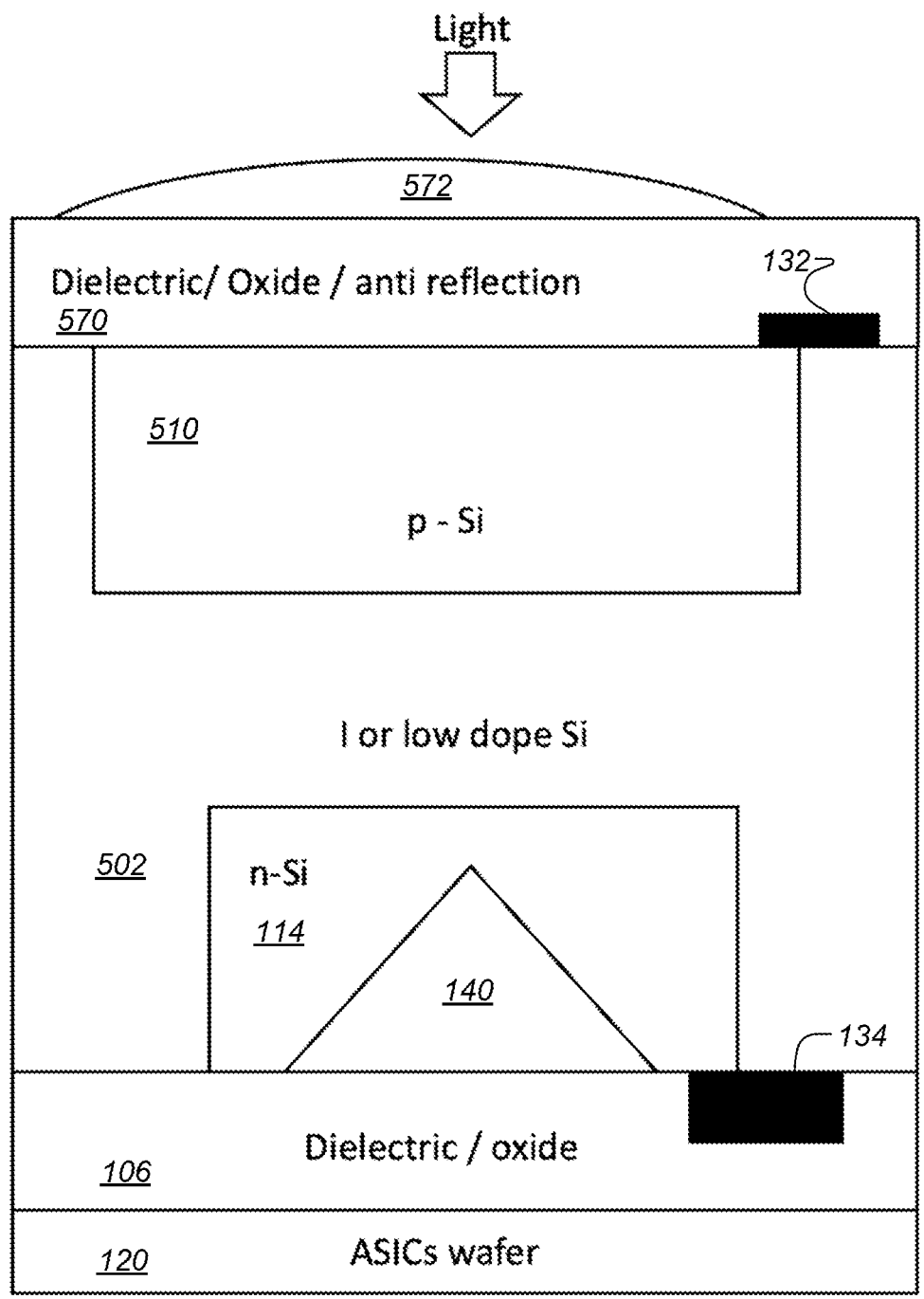
FIGS. 5M, 5N and 5O show a simple partial cross section of a pixel or high speed photodetector having a I or low dope Si region, according to some embodiments.
Figure 5N:
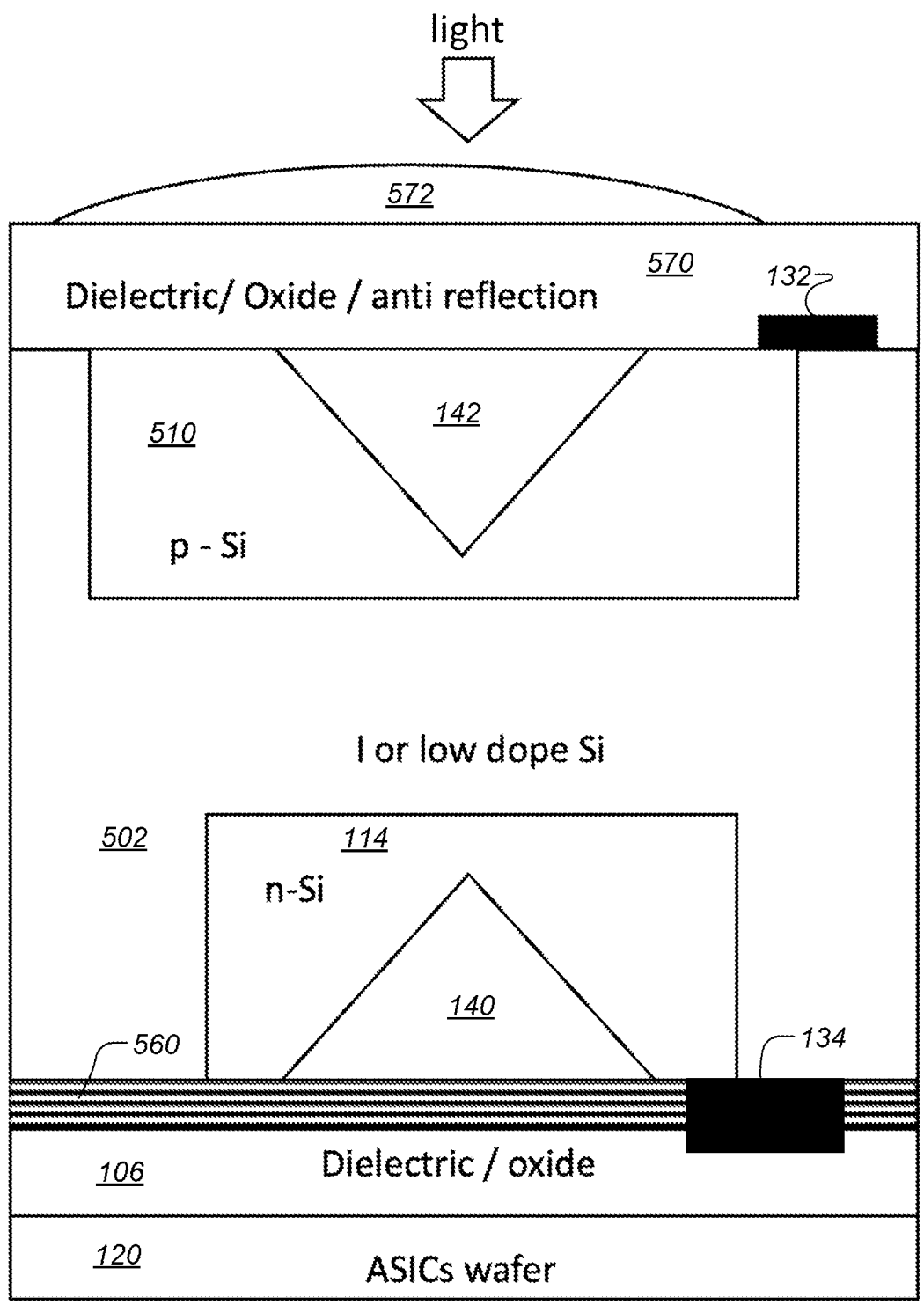
Figure 5O:
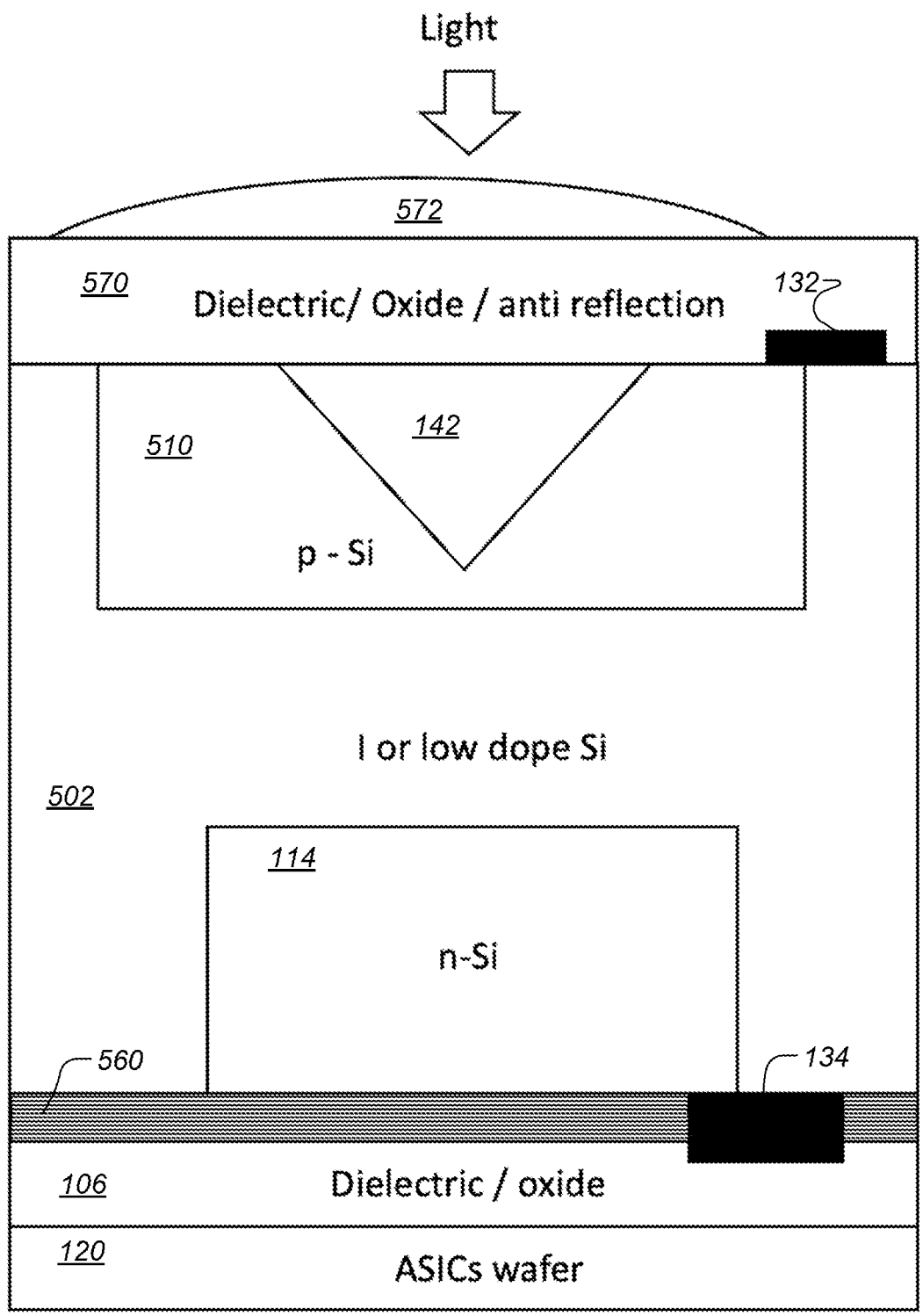

FIGS. 5M, 5N and 5O show a simple partial cross section of a pixel or high speed photodetector having an I or low dope Si region 502, according to some embodiments. In FIG. 5M the microhole or holes 140 can be formed on the surface opposite to the surface on which light impinges and the microhole or holes 140 can be formed in the n-Si region 114 or well and the well or n-Si region 114 are formed in I or low dope Si 502, and a P—Si region 510 is formed at the surface on which light impinges. Cathodes and anodes 132 and 134 are formed on the N and P regions 510, 114 respectively.

FIG. 5N is similar to FIG. 5M with the addition of a Bragg reflector 560 at the interface between the Si 502, 114 and the stacking dielectric 106, and with the addition of one or more holes 142 on the surface on which light impinges in the P region. The P and N regions 510, 114 in some cases be interchanged. As in FIG. 5L, the top and bottom surfaces can have one or more microholes, and in some cases one surface can have one microhole, and the second surface can have multiple microholes, and in some cases the number of microholes or holes can be the same or different for each of the surfaces, and in some cases the dimension and shape of the microholes or holes can be different on each of the surfaces, and in some cases can be the same on each of the surfaces.

The thickness of the I or low dope Si 502 can range from 100-6,000 nm, and in some cases from 300-3,000-nm. The microhole or holes in some cases reside fully in the P and/or N wells or regions 510, 114.

FIG. 5O is similar to FIG. 5N with the exception that there are only one or more microholes only on the surface onto which light impinges.

Growing Ge on Si often involves multiple steps and layers that are not shown in our simple partial schematic cross section drawings. There can be a single or multiple doping and/or not intentionally doped or i regions and/or low doped regions and multiple Ge, Ge alloy, Si, Si alloy, SiGe alloy layers. See e.g. Oehme et al, Backside Illuminated "Ge-on-Si" NIR Camera, 18696 IEEE SENSORSJOURNAL, VOL. 21, NO. 17, Sep. 1, 2021. In this reference, FIG. 5 shows multiple Ge and Si doped layers and thermal annealing. The Ge layer can be cladded top and bottom by Si layers at least one of which is crystalline. In some cases, both bottom and top Si layers that are highly doped to opposite polarities can be crystalline or mostly crystalline.

Selective area growth, SAG, of epitaxially grown Ge on Si can be utilized as discussed in Rafferty et al, Monolithic germanium SWIR imaging array, Proc. of SPIE Vol. 6940, 69400N, (2008), where FIG. 2a of that reference shows lateral overgrowth over silicon dioxide to reduce dislocations in the Ge layer. Ref. Sammak et al, A 270×1 Ge-on-Si photodetector array for sensitive infrared imaging, Proc. of SPIE Vol. 9141 914104-1, 2014, hereinafter "Sammak et al," also discusses employing SAG to grow one micron thick Ge on Si. SAG can be used to minimize wafer warp due to lattice mismatch between Ge and Si.

In some cases, the Ge can be a Ge alloy such as GeSi (also can be written SiGe), with different ratios of Ge and Si, and in some cases any alloy containing Ge.

Figure 5P:

FIG. 5P shows a simple partial cross section similar to FIG. 5C except the hole or holes 140 are formed in the Si layer 510 and in some cases can extend into the Ge layer 102. The Si layer 510 can be P doped substrate for example and in some cases can be further doped to a higher doping level by ion implantation, and the Ge layer 102 can be I, intrinsic or not intentionally doped, or low doped. N well or region 516 is formed in the Ge layer 102. In some cases, a portion of the Ge layer 102 can have a P doped region in contact with portion of the P Si layer 510. P and N doping in some cases can be interchanged. Ge layer 102 can in some cases be Ge alloy of Si. The Si layer 510 thickness can range from 0.5-3 microns in some cases, and the Ge layer 102 thickness can range from 200-1000 nm in some cases.

Figure 5Q:
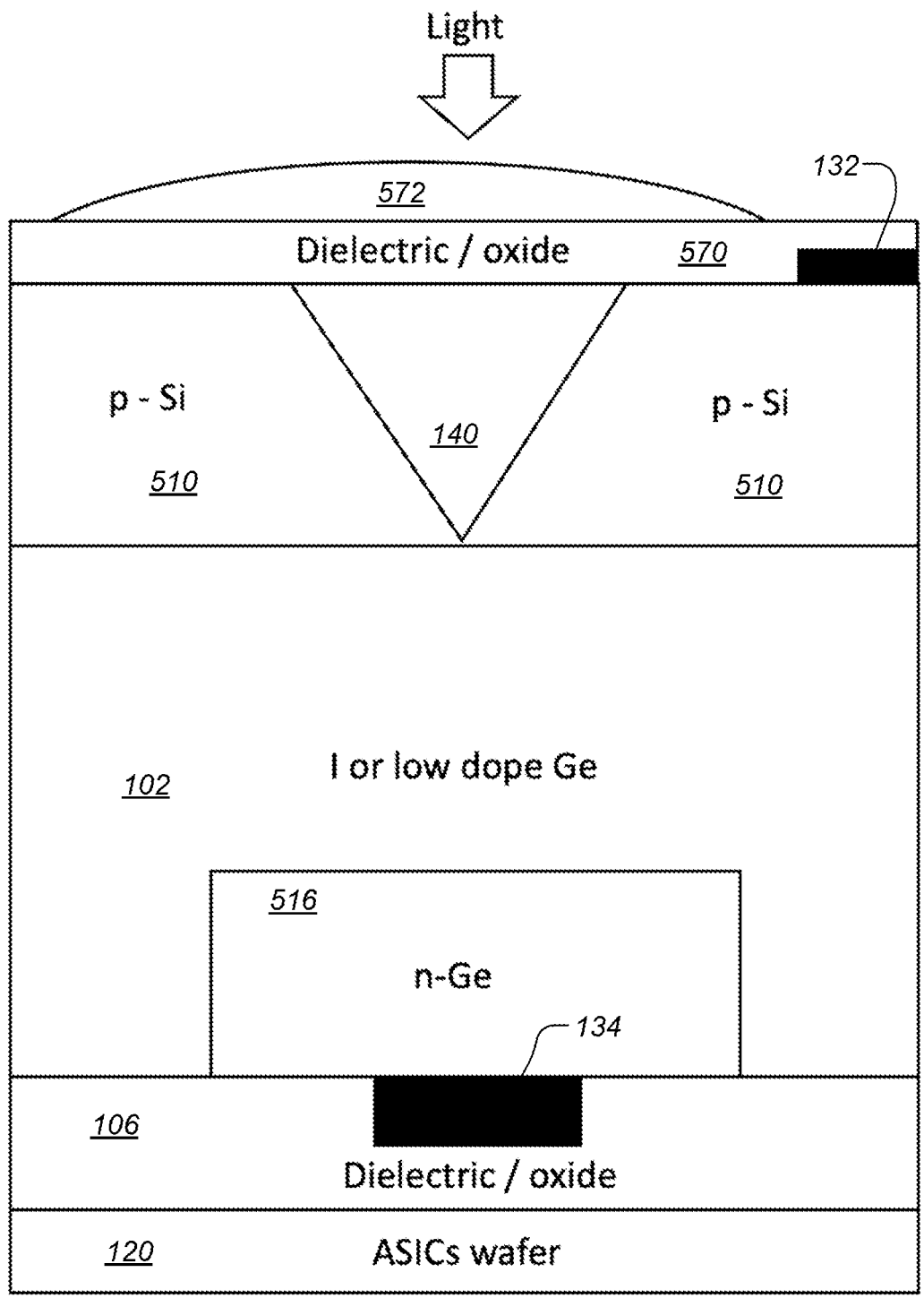

FIG. 5Q is similar to FIG. 5P except the hole or holes in Si 510 is an inverted pyramid.

Figure 5R:
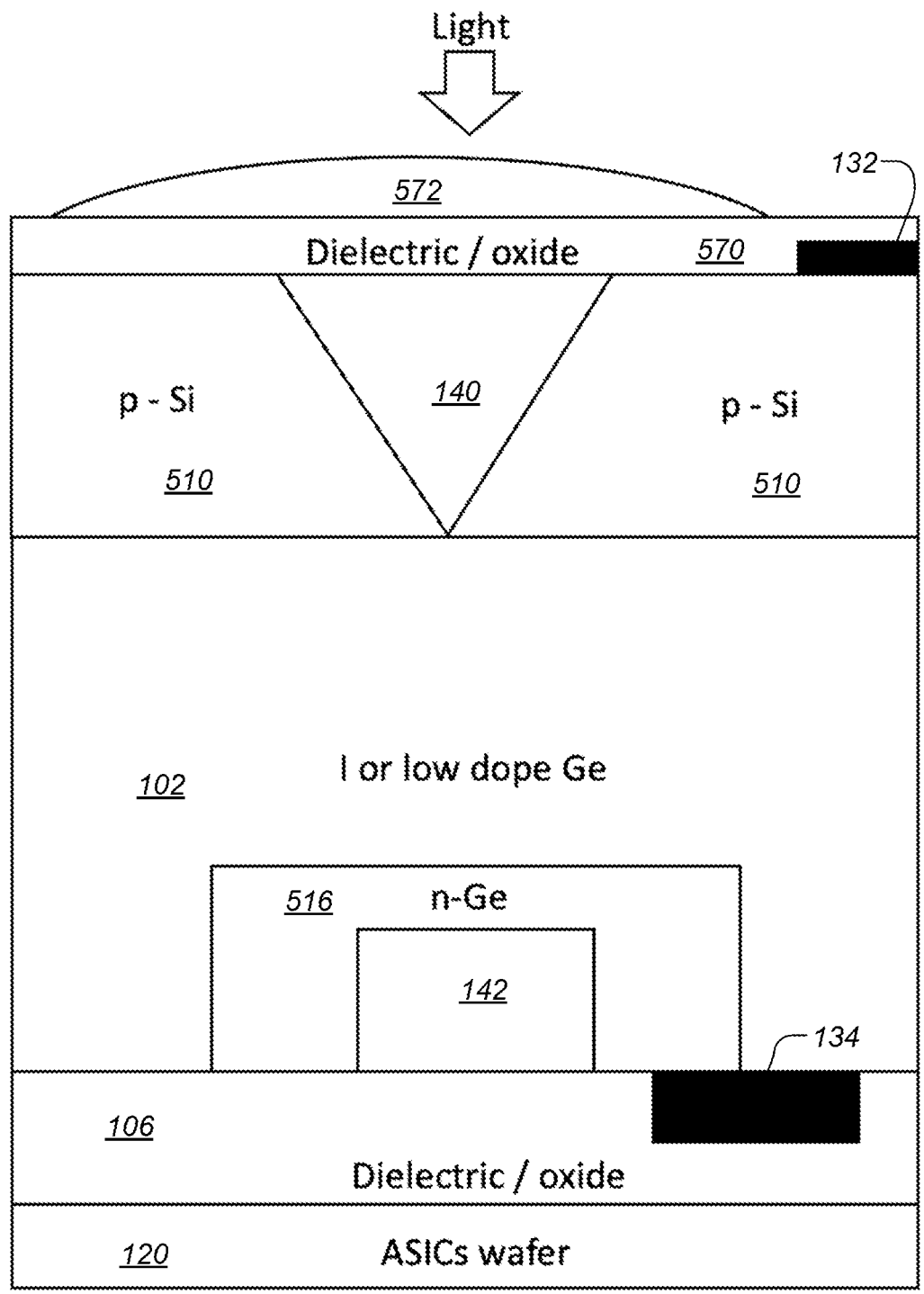

FIG. 5R is similar to FIGS. 5Q and 5E and includes hole or holes 140 and 142 on both Si 510 and Ge 516 layers and the hole can be any shape or size and can be centered or off centered and can be periodic or aperiodic. The depth of the hole can range from 30% to 100% the thickness of the Si 510 or Ge 516.

Any other combinations of structures disclosed are possible for example Ge and/or GeSi also can be written as SiGe, can be cladded top and bottom by Si and/or alloys of Si in some cases.

Figure 5S:
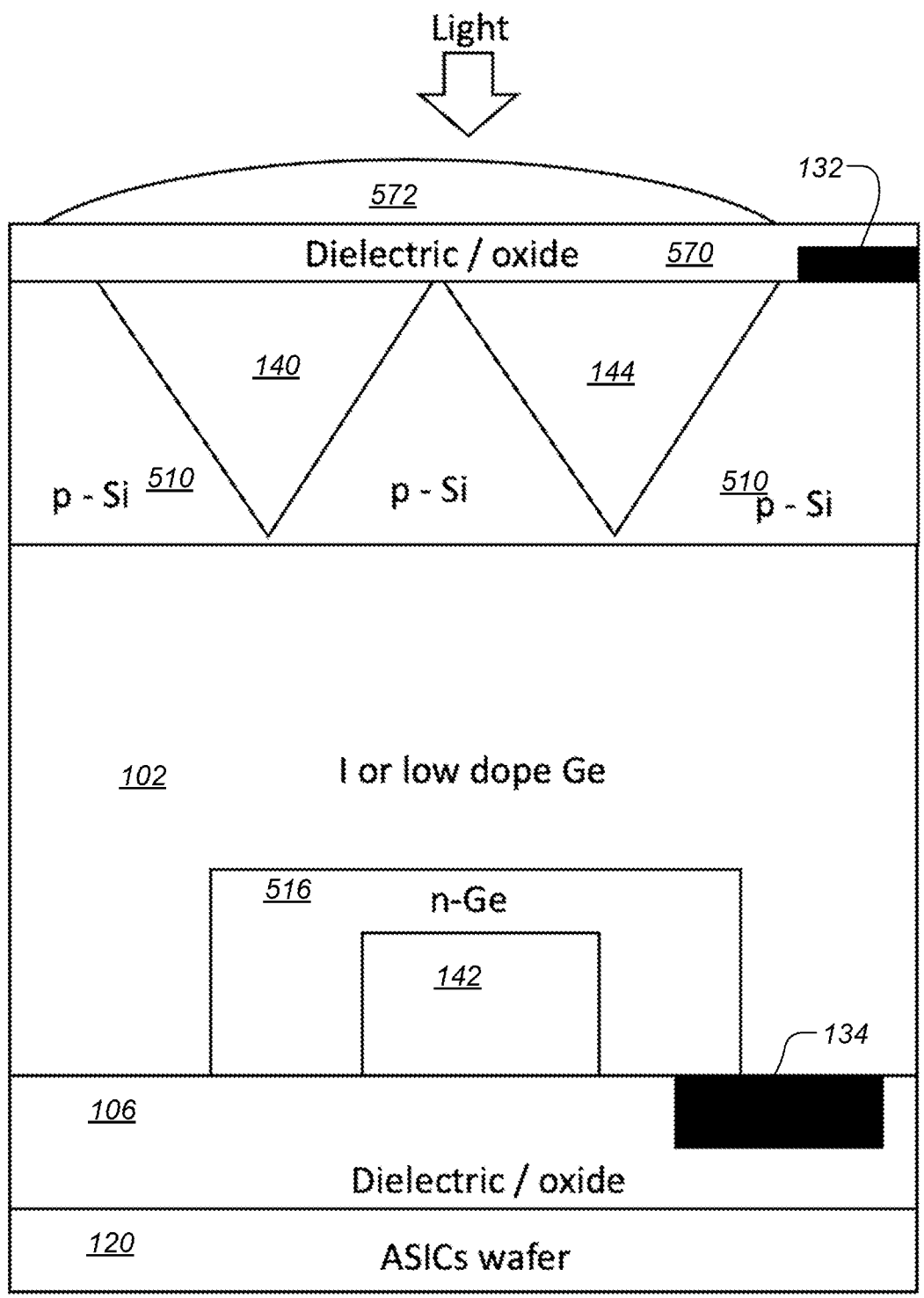

FIG. 5S is similar to FIG. 5R, but with more than one inverted pyramid in the Si layer 510.

Lateral dimensions of the hole can range from 400-200 nm and in some cases 400-1500 nm. The hole or holes can be filled with one or more dielectrics, for example in some cases high k dielectric such as Hf oxide can be deposited on the inside surfaces of the hole by atomic layer deposition, ALD, for example and the hole filled with Si oxide or nitride for example and planarized. Deep trench isolation can be similarly coated with high k dielectric and filled with another dielectric.

Pixel and/or photodetector lateral dimension can range from 0.5-5 microns and in some cases 1-20 microns.

An array of photosensors, comprising pixels and/or photodiodes and/or avalanche photodiodes, can have same or different lateral dimensions. Array size can range from 2 to 100 million or more.

FIGS. 5A to 5S show a single microhole and in some cases multiple microholes on one and/or both surfaces to enhance photon absorption which is directly proportional to quantum efficiency to improve optical sensitivity at near infrared wavelengths. The absorption region is crystalline and in some cases can be polycrystalline, and the microhole or holes can be regular or irregularly shaped and in the case of multiple microholes can be periodic or aperiodic, and in some cases the holes can be identical or have different shapes and depths, and in some cases the microholes can intersect and/or overlap to form a single hole with multiple lateral dimensions for example such as a cross or tic-tac-toe patterns.

For simplicity deep trench isolation, DTI are not shown separating pixels in a pixel array for electrical and/or optical isolation, and in some cases the deep trench isolation can be etched partially into the photon absorbing region 102, and in some cases can be etched to the dielectric or oxide layer 106. The width of the deep trench isolation can range from 50-250 nm, and in some cases from 100-200 nm. The deep trench isolation can be filled with a single or multiple dielectrics and can include high K dielectrics. The microhole(s) can also be filled in some cases with one or more dielectrics and can include a high K dielectric such as Hf oxide, Ta oxide to name a few.

Also not shown are connecting electrodes from the photodetector to the ASICs where in stacking technology the stacking interface between the photodetector wafer and the ASICs wafer has corresponding pads on which the electrical signals from the photodetector wafer are transmitted to the ASICs wafer and a reverse bias can be provided from the ASICs wafer to the photodetector wafer for biasing the photodetectors in a reverse bias mode between the anode and cathode of the photodetector.

The reverse bias voltage for the photodetector which includes either the pixels and/or highspeed photodetectors can range from 0.5 volts-3 volts, and in some cases can range from 1 volt-10 volts.

Microstructure hole or holes for enhancing optical absorption in thin semiconductor at near infrared, NIR, wavelengths, are formed on crystalline semiconductor and in some cases polycrystalline semiconductor and in some cases a combination of crystalline and polycrystalline semiconductor. One or plurality of holes can be formed on one semiconductor surface and in some cases on two semiconductor surfaces and in some cases on more than one semiconductor surface.

The microhole(s) surfaces can be conformally coated with doped p or n semiconductor which in some cases can be amorphous semiconductor such as amorphous Si, a-Si, for example. In some cases, the surface of the hole can be delta doped p or n and in some cases the surface of the hole can be coated with a high k dielectric such as Hfoxide for example, and in some cases any combination of delta doping, high k dielectric, a-Si, metal silicide such as Al, Ti, W silicide to name a few. The hole/microhole or holes are filled with one or more dielectric and can be planarized for further processing such as ohmic anode, cathode, connecting electrodes, color filters, NIR filters, microlens to name a few.

Holes, microholes, nanoholes can be used interchangeably. In some cases narrow rectangular holes can be called trenches which is different from deep trench isolation are used for optical and/or electrical isolation from adjacent pixel or high speed photodetector arrays. Hole(s) formed on pixels, photodetectors are to enhance optical absorption in thin semiconductors, with thickness range of 100 nm to 6000 nm and in some cases 300 nm to 3000 nm, at NIR wavelengths with wavelength range of 700 nm to 2000 nm.

Pixels, photodetectors with microhole(s) have higher quantum efficiency, QE, or external quantum efficiency, EQE, than a similar pixel, photodetector without microhole(s) by 1.1 times or more at certain NIR wavelengths in the range of 700-1000 nm for Si and 1000+1600 nm for Ge on Si. In some cases the ratio of QE with hole(s)/QE without hole(s) can be 1.5 or greater at certain NIR wavelengths.

FIGS. 6A-6E show simple partial schematic cross sections of avalanche photodiode structure, according to some embodiments. The cross sections are similar to those shown in FIGS. 5A-S5 with the addition of a p charged region 610 in contact with the I or low dope Ge or Ge alloy 102, 112 forming PIPIN avalanche photodiode structure where the photon absorption occurs in the Ge or GeSi region, and the multiplication also known as avalanche gain occurs in the Si region. In some cases, the avalanche photodiode can be a PIPN structure. The p and n in some cases can be interchanged.

Figure 6A:
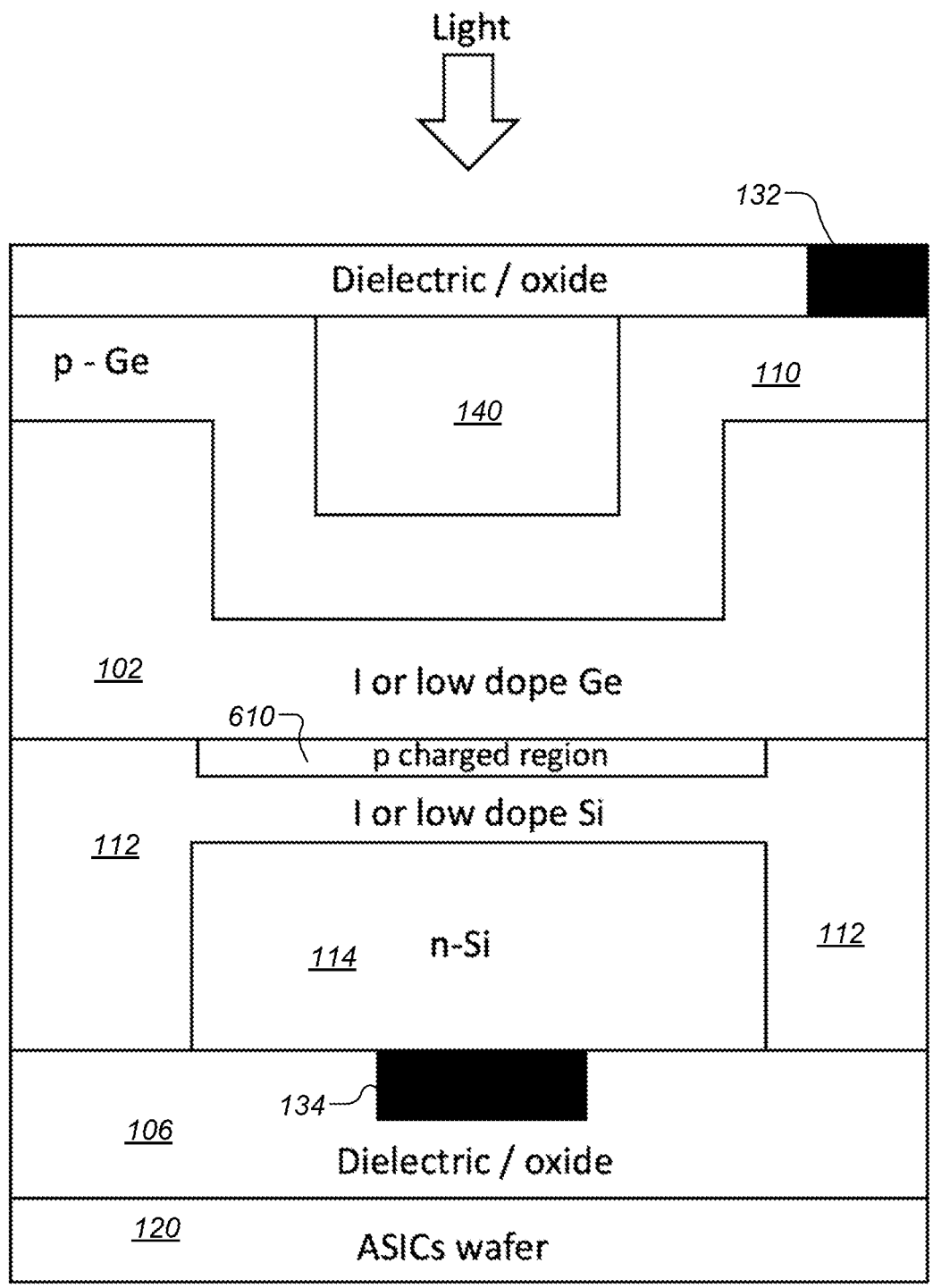
FIGS. 6A-6E show simple partial schematic cross sections of avalanche photodiode structure, according to some embodiments.

FIG. 6A is similar to FIG. 5A with a homojunction of a p doped region 110 following the contour of the hole or holes 140.

Figure 6B:
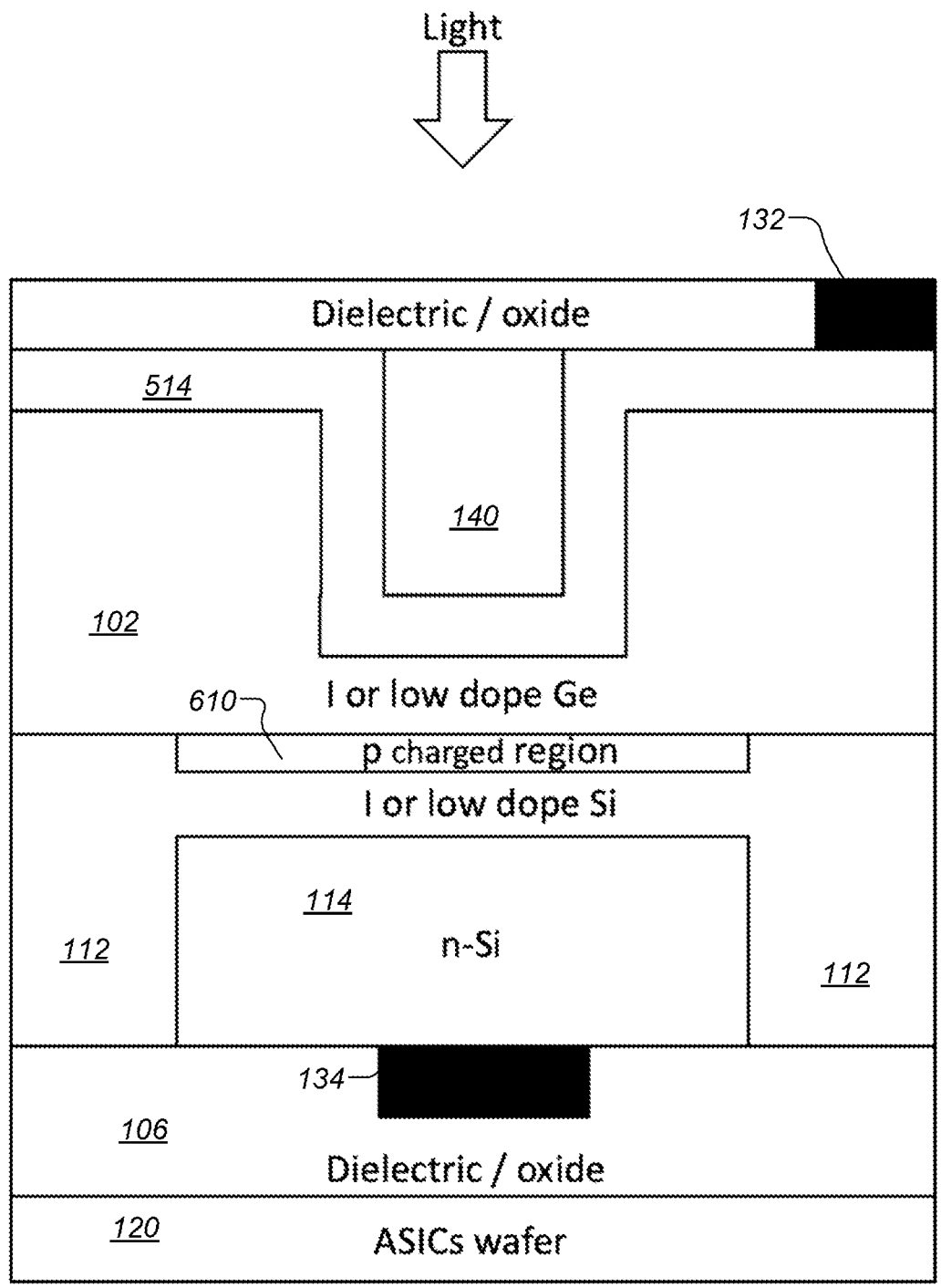

FIG. 6B is similar to FIG. 6A with the exception that the p region 514 forms a heterojunction with the I or low dope Ge or GeSi alloys 102.

Figure 6C:
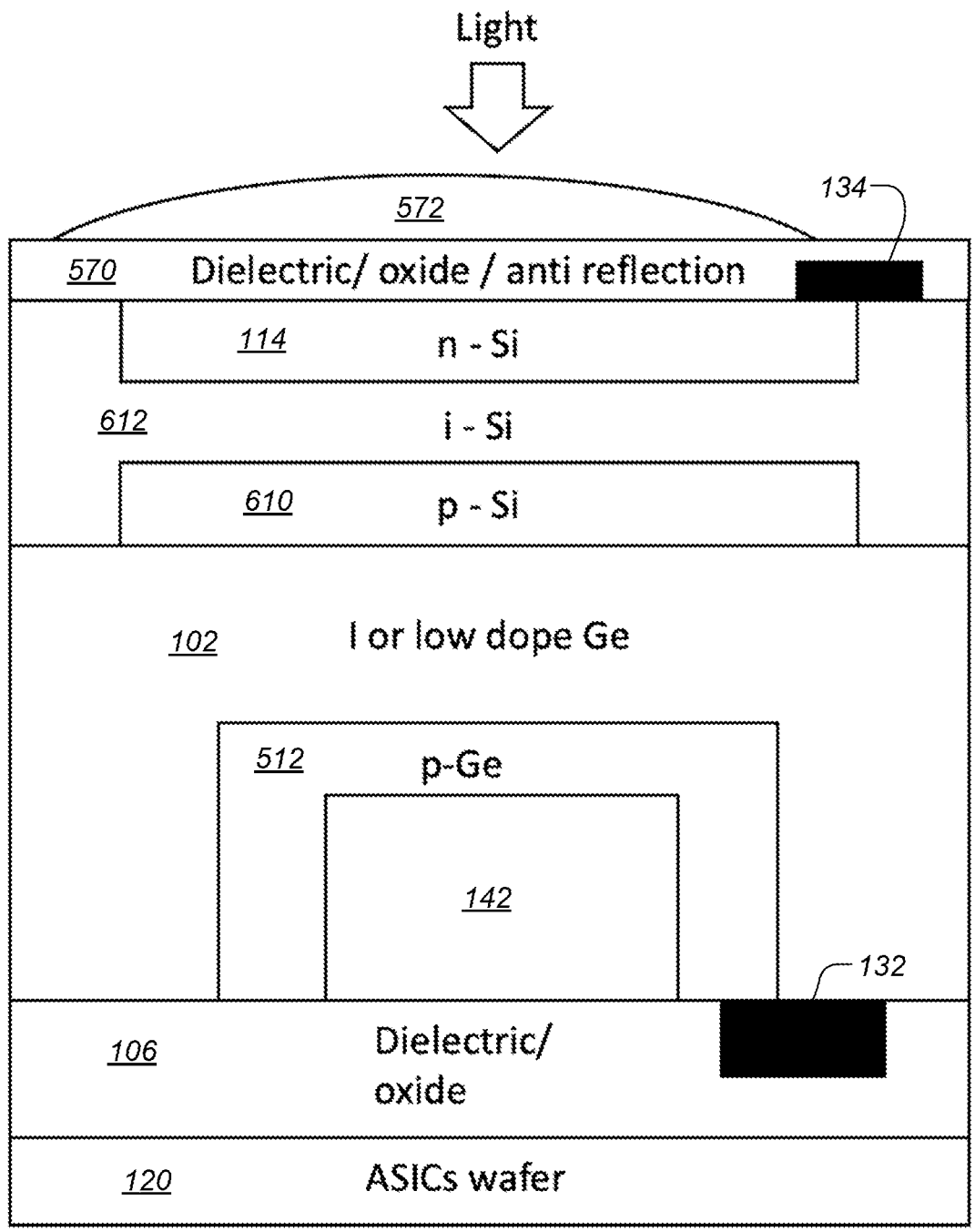

FIG. 6C shows a simple partial cross section of Ge/Ge alloy pixel/HSPD avalanche photodiode where the microhole or holes 142 are formed on the opposite surface from the microlens 572 on which incident NIR photons impinge. The NIR wavelength can range from 1000-2000 nm, and in some cases from 1100-1700 nm. As shown the avalanche multiplication or gain occurs in the Si, and the photon absorption generating electron hole pairs occurs in the Ge/Ge alloy I or low dope region 102, and where the microhole resides entirely in a doped region, in this case a P doped region. In some cases, the P and N can be interchanged. A reverse bias is applied between the cathode 134 and anode 132 by an external source with a voltage range of −2−−30 volts, and in some cases −4−−10 volts, and in some cases −1−−15 volts and the avalanche gain can range from 2-1000, and in some cases greater than 1000. The Ge/Ge alloy I or low dope layer 102 can have a thickness range of 100-500 nm, and the P Ge/Ge alloy layer/region 512 can have a thickness ranging from 50-500 nm, and the P—Si charged layer/region 610 can have a thickness ranging from 10-200 nm, and the I or low dope Si 612 can have a thickness ranging from 10-1000 nm, and where the n-Si layer/region 114 can have a thickness ranging from 10-1000 nm. It should be noted that layers can also be regions.

Figure 6D:
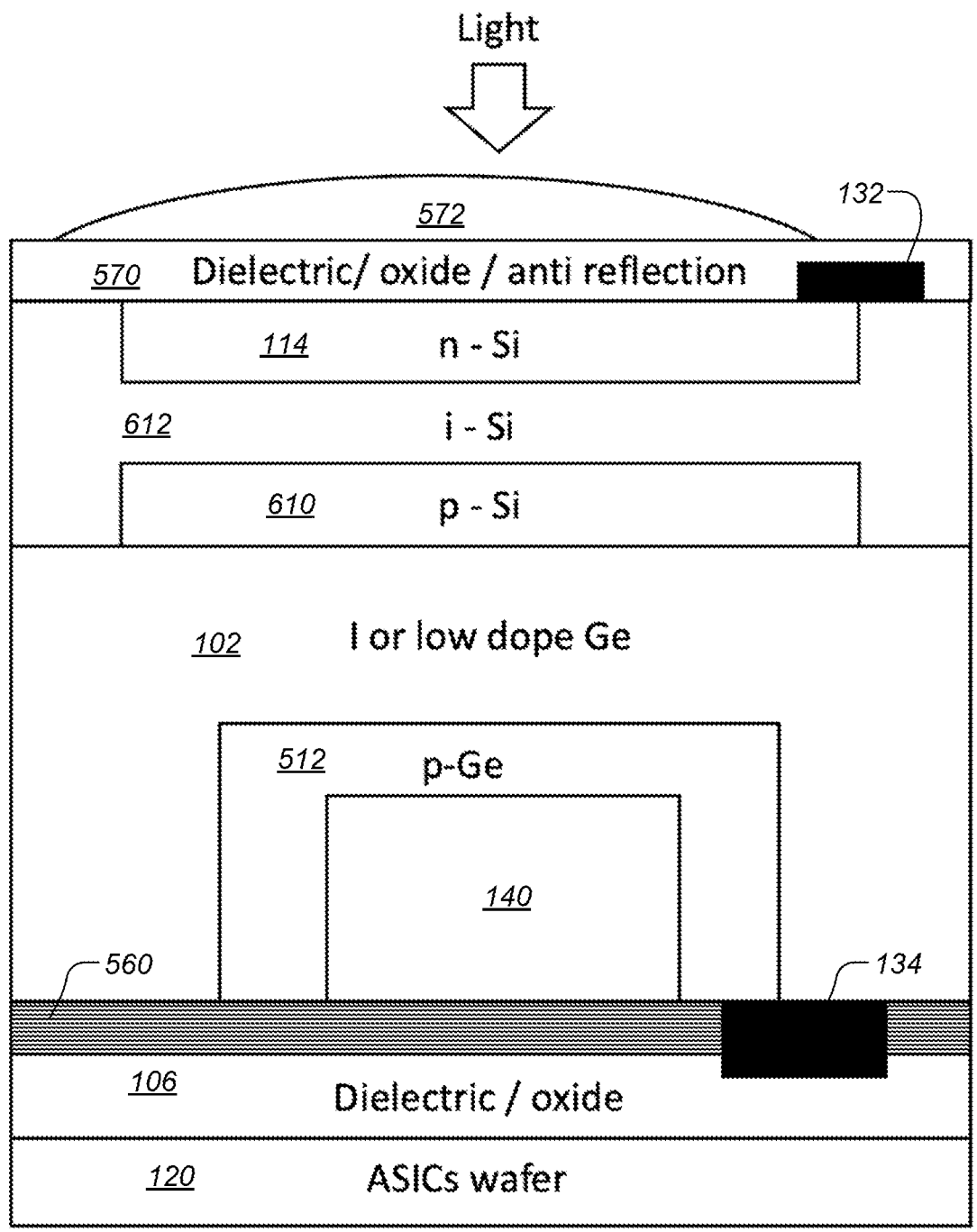

FIG. 6D is similar to FIG. 6C with the addition of a reflector that can be metal, dielectric, multiple layers of dielectric such as a Bragg reflector 560 at the interface between Ge and the bonding oxides/dielectrics for stacking purposes (over dielectric 106).

Figure 6E:
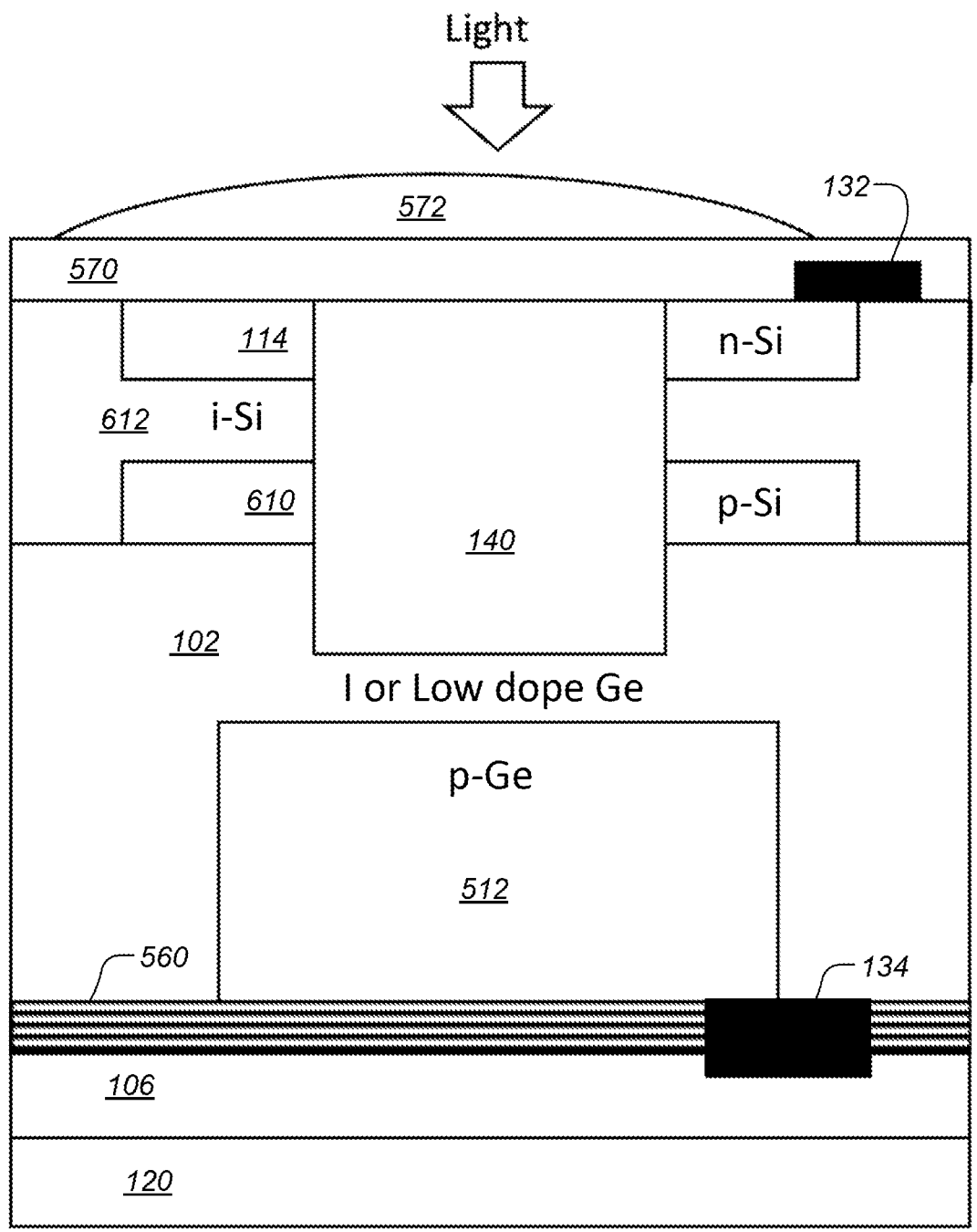

FIG. 6E shows a simple partial cross section schematic of an avalanche photodiode where the microhole or holes 140 can be etched in the Si regions 114, 612, 610 and into the I or low dope Ge region 102 where enhanced photon absorption occurs. In addition, a metal reflector or dielectric or multiple dielectrics such a Bragg reflector 560 can be formed at the interface of the Ge or Ge alloy 102 with the bonding dielectric oxide layer 106 in some cases. The microhole or holes 140 can be filled with one or more dielectric material, and in some cases can include a high K dielectric 570 that can be formed to follow the contour of the microhole.

As in FIGS. 5A-5S, the DTI are not shown for simplicity and connecting electrodes to the anodes and cathodes that are connected to bond pads which coincide with ASICs bond pads to receive the electrical signals from the photodetectors and to provide reverse bias voltage are also not shown. A reverse bias voltage can range from 1-35 volts and in some cases from 2-10 volts, and can provide avalanche gain of 2 or more, and in some cases can provide avalanche gain in the range of 2-1000, and in some cases greater than 1000 when the avalanche photodiode is operated in the Geiger mode as a single photon avalanche photodiode.

Figure 7A:
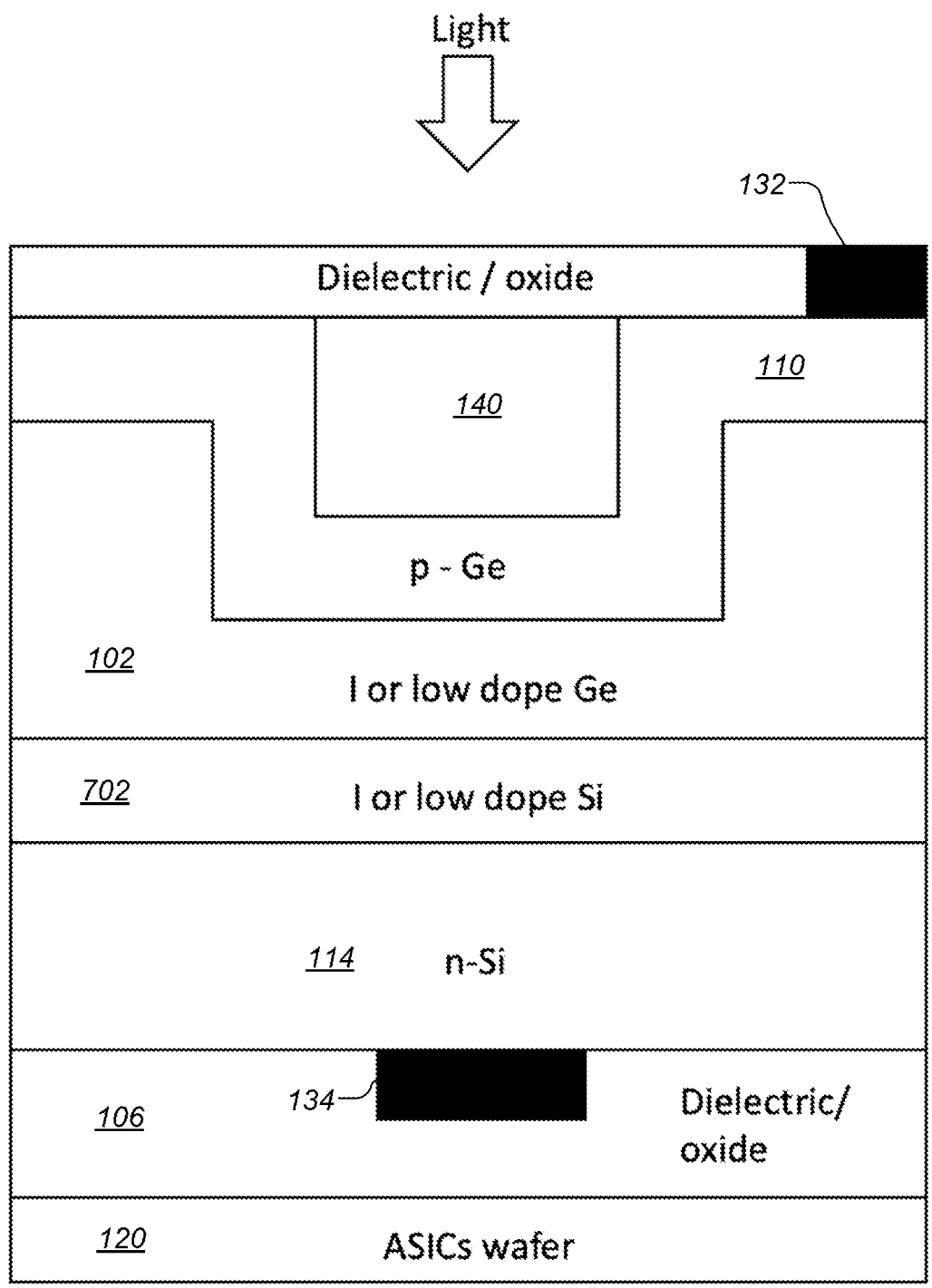
FIGS. 7A-7B show simple partial schematic cross sections of a pixel or high speed photodetector, according to some embodiments.
Figure 7B:
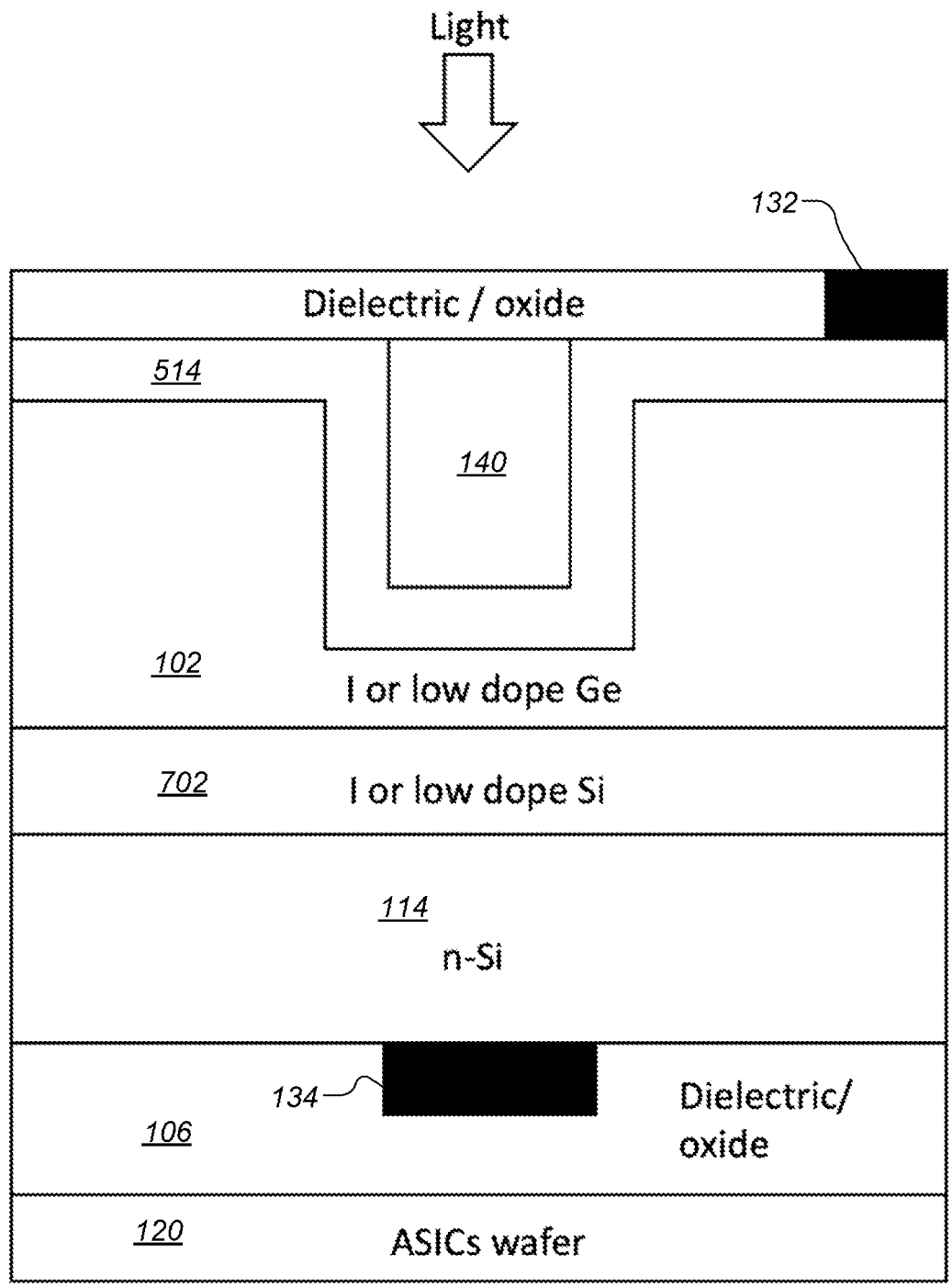

FIGS. 7A-7B show simple partial schematic cross sections of a pixel or high speed photodetector, according to some embodiments. FIGS. 7A-7B are similar to FIGS. 5A-5S with the addition of I or low dope Si region 702 beneath the I or low dope Ge or GeSi alloy region 102 to reduce the device capacitance.

FIG. 7A is similar to FIG. 5A with a homo p n junction for the P and I Ge regions 110, 102.

FIG. 7B is similar to FIG. 5B with a heterojunction between the p and the I or low dope Ge or Ge alloy regions 514, 102.

The p and n region can be interchanged in some cases. The I or low dope Si region 702 can have a thickness ranging from 100-1,000 nm. Arrays of pixels and/or high speed photodetectors, HSPD, as shown in FIGS. 1,5,6,7, in some cases, can have a common anode or cathode of two or more pixels and/or HSPDs connected by semiconductor doped regions and/or metal electrodes, in some cases, the pixel and/or HSPD can be individually biases, and in some cases a combination of Common and independent biasing of pixels and/or HSPD. The array size can range from two to millions to 10s and 100s of millions.

In the case of HSPDs, which can be photodiodes and/or avalanche photodiode, an array of 16 HSPDs with diameter or lateral dimensions ranging from 2-25 microns and in some cases 5-15 microns with or without near infrared filters that can be narrow band, and with micro lens on each HSPD, the array can match the pattern of a 16 multicore fiber for co-packaging. See for example, reference: Dong, et al, Densely packed 1.1 μm-band vertical cavity surface emitting laser array for co-packaged optics, Japanese Journal of Applied Physics, 2022, where array of 16 VCSELs (vertical cavity surface emitting lasers) are developed for co-packaging with multicore fiber, see FIG. 1B of Dong ref. for example.

The HSPD array as surface illuminated can be stacked with application specific integrated circuits, ASICs, which can be transimpedance amplifiers, linear amplifiers, clock data recovery, normalizer, signal processing, RF and mix signal circuits, logic processors, memories, graphic processors, to name a few.

In the case of small diameter HSPDs, 2-5 microns, a single microhole may suffice. In some cases two or more microholes can be formed, and the microholes can intersect forming a cross or X pattern or with any intersecting angle and can have multiple intersections. The microholes can be periodic, aperiodic, and/or random in distribution.

The microhole(s) can be a regular geometric shape or irregular amoebic shaped and/or any combination thereof.

Reference Song et al, High-efficiency and high-speed germanium photodetector enabled by multiresonant photonic crystal, De Gruyter 2020 demonstrated a 56 Gbps Ge on Si photodiode. Data range of 25-112 Gbps and in some cases greater than 112 Gbps can be achieves at wavelength range of 1000-1700 nm for Ge on Si photodiodes.

Figure 8:
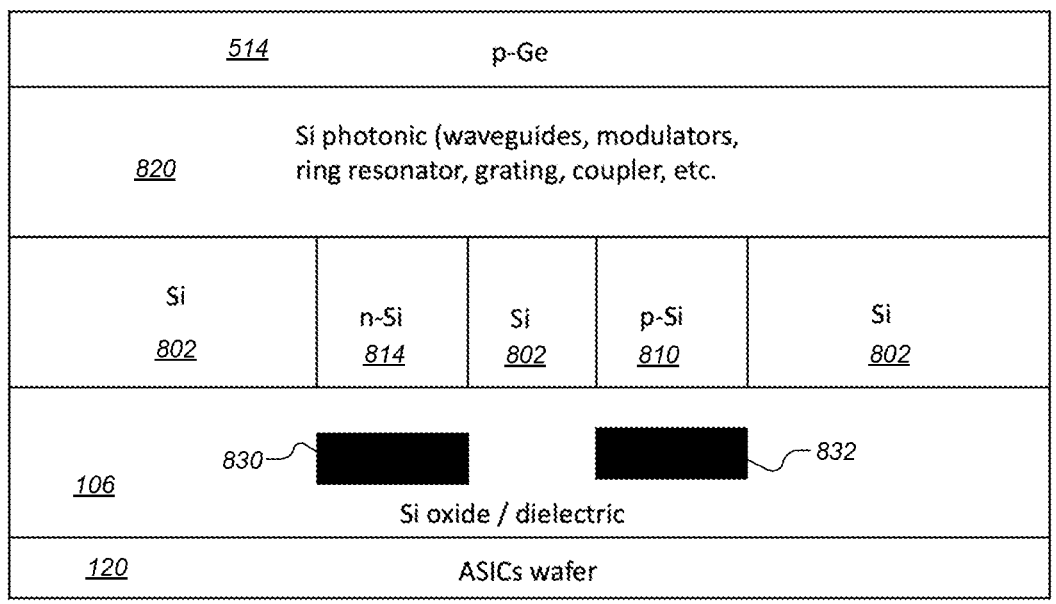
FIG. 8 shows a simple partial schematic cross section of stacking Si photonics, according to some embodiments.

FIG. 8 shows a simple partial schematic cross section of stacking Si photonics, according to some embodiments. The stacking Si photonics 820 can be any combination of waveguides, ring resonators, modulators, gratings, optical couplers, waveguide photodetectors, heaters, to name a few and can be a combination of Si, Ge, Ge alloy, dielectrics, with or without microholes. Electrical connections can be formed with either p regions 810 and/or n regions 814 (within Si region 802), and/or metal electrodes, and/or silicide connecting elements of the Si photonics through a dielectric to the bonding pads and/or connecting electrode pads that allow it to be stacked to ASICs wafers 120. Buried electrodes 830 and 832 are shown in Si oxide/dielectric region 106.

Figure 9:
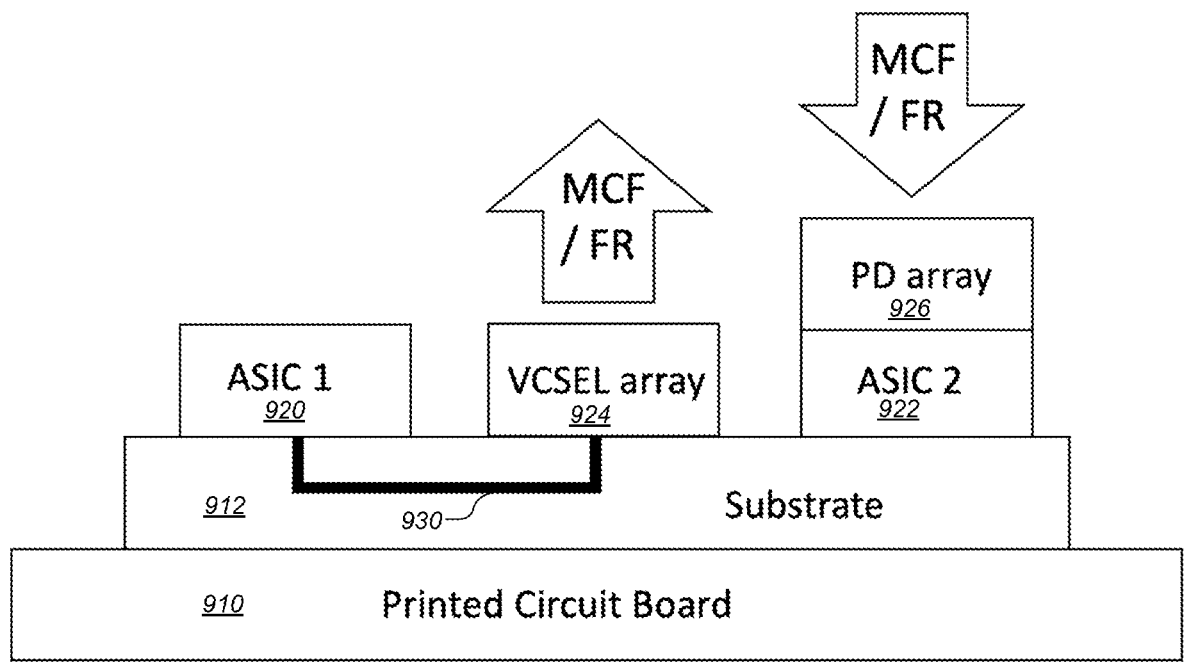
FIG. 9 shows a simple partial cross section schematic of a co-packaged optics transceiver, according to some embodiments.

FIG. 9 shows a simple partial cross section schematic of a co-packaged optics transceiver, according to some embodiments. FIG. 9 shows a vertical cavity surface emitting laser, VCSEL, array 924 with Si/Ge/SiGe photodetector array 926 stacked on one or more ASIC, (application specific integrated circuit) chip(s) 922 on a substrate 912. An ASIC 1 chip 920 is attached in close proximity with the VCSEL array 924 to drive the VCSELs via connecting electrode 930. For example, see reference Dong et al, Densely packed 1.1 μm-band vertical cavity surface emitting laser array for co-packaged optics, 2022 Jpn. J. Appl. Phys., where a VCSEL array is coupled to a multi-core fiber for co-packaging optics transmitter operating at 100 Gb/s per VCSEL for aggregated data rate of 1600 Gb/s. The current state of the art co-packaged optical receiver is shown in reference Patel et al, A 112 Gb/s −8.2 dBm Sensitivity 4-PAM Linear TIA in 16 nm CMOS with Co-Packaged Photodiodes, IEEE CICC 2022, where InP photodiode arrays are used 1×4 operating at 1310 nm wavelength and a datarate of 112 Gb/s co-package optics on a single substrate of an aggregated data rate of 448 Gb/s.

According to some embodiments described herein, Si/Ge/SiGe or any alloys of SiGe photodiodes or avalanche photodiodes can be fabricated on a single Si wafer for example, 12 inch in diameter or more, and the photodiodes can include one or more microholes to enhance near infrared, NIR optical sensitivities by a factor of 1.1 or greater, and in some cases by a factor of 1.3 or greater, or in some cases by a factor of 1.5 or greater over a similar photodiode without microholes to enhance NIR sensitivities. The Si/Ge/SiGe PD (photodiodes) or APD (avalanche photodiodes) can have a data bandwidth of 25 Gb/s or more, and in some cases the data bandwidth can be 56 Gb/s or greater and with the use of pulse amplitude modulation, PAM-4 data bandwidth can be doubled, and in some cases using PAM the data bandwidth can be more than doubled. The wavelength range of a Si PD/APD can range from 700-1000 nm, and the wavelength range for Ge or SiGe alloy (SiGe and GeSi are interchangeable) can range from 700-1700 nm, and in some cases greater than 1700 nm to 2000 nm for example. The photodetectors fabricated on a Si wafer can be wafer stacked to one or more ASIC wafers for a co-packaged optical receiver. The stacked co-packaged optical receiver has lower parasitics than a co-packaged optical receiver as described in reference Patel where the ASICs and the InP array are bonded in close proximity laterally on a single wafer, and in addition this co-packaged optical receiver is chip by chip assembly, whereas according to some embodiments described herein, the PD/APD array wafer can be stacked directly to one or more ASIC wafer(s) allowing for wafer level assembly, thereby reducing cost and allows for mass production.

The low electrical parasitics of stacked co-packaged optical receiver can be due to the extremely short distance between the PD/APD and the transimpedance amplifier, TIA, where the distance can range from a few to 10s of microns, and in some cases less than 100 microns. These electrical parasitics include inductance, capacitance, and resistance.

Co-packaged optical Rx (optical receiver) and Tx (optical transmitter) are key components for hyperscale datacenters.

The VCSELs in the VCSEL array can emit at different wavelengths in some cases and the photodetectors in the photodetector array can have bandpass optical filters to minimize crosstalk especially between adjacent photodetectors.

In some cases the VCSELs can emit at same or nearly same wavelengths and optical filters may not be required for the photodetectors.

Deep trench isolation, DTI, can be used for optical and/or electrical isolation to minimize optical and/or electrical, including RE, radio frequency, crosstalk and/or interference.

In addition, in some cases, as shown in FIGS. 5 and 6, in addition to the Bragg Reflector, an optically absorbing material can be used such as amorphous semiconductor Ge, Si, GaAs to name a few and/or metal reflector to minimize light reaching the ASIC(s). In some cases the Bragg Reflector may not be needed and only the optical absorber and/or reflector such as metal, can be used. In some cases the optical absorber and/or reflector can be fabricated anywhere between the photodetector wafer and the ASIC wafer such as for example on or in the ASIC wafer.

At wavelength near or greater than the Si bandgap wavelength 1130 nm approximately, optical absorber and/or reflector may not be necessary. For example in some cases for wavelengths 900 nm and greater, optical isolation from the PD wafer to the ASIC wafer may not be necessary.

The optical isolation between the photodetectors and ASICs, extends also under the deep trench isolation region and any other regions where light may leak onto the ASICs.

Optical isolation can consist of one or more or any combinations of; gap(s), Bragg Reflector, optical absorber, metal, dielectric layer(s), optical diffusor, scattering structures, optical attenuators to name a few.

Gap(s) can be vertical, such as DTI, or horizontal and can have one or more slopes, positive and/or negative and can be filled with one or more dielectrics. Gap separation can range from 50-500 nm and in some cases 150-250 nm and in some cases 250-1000 nm.

Figure 10:
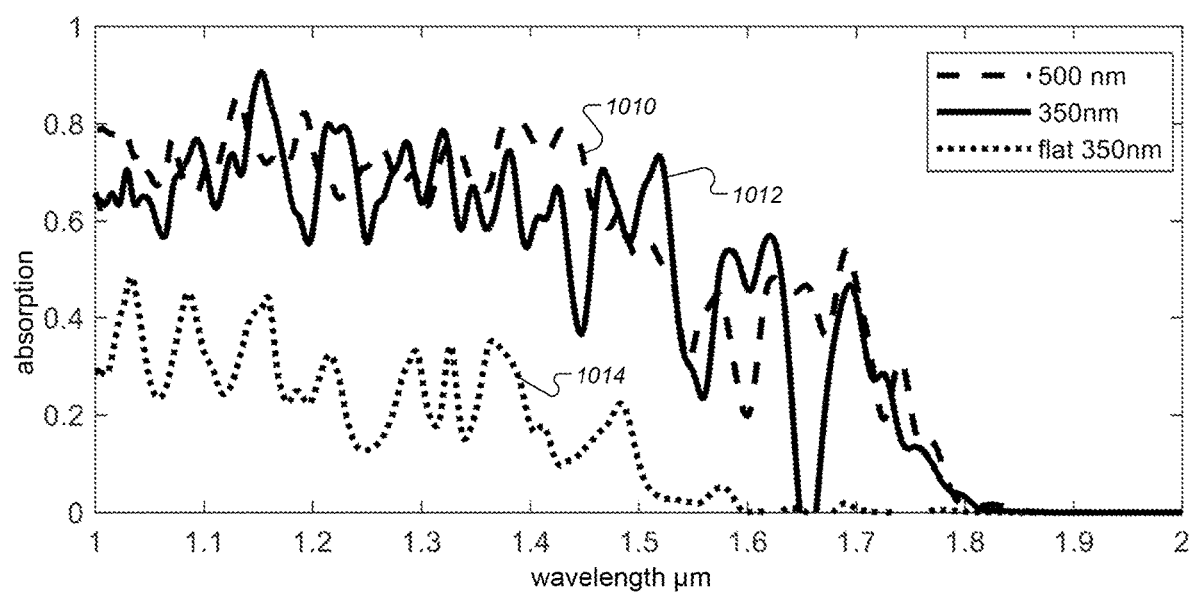
FIG. 10 is a plot showing results of a finite difference time domain, FDTD, lumerical simulation of optical absorption verses impinging wavelength for a structure according to some embodiments.

FIG. 10 is a plot showing results of a finite difference time domain, FDTD, Lumerical simulation of optical absorption verses impinging wavelength for a structure according to some embodiments. The structure is 1 to 2 microns of a 1.12 micron by 1.12 micron pixel with Ge on Si. A single 800 nm diameter cylindrical hole is etched ¾ the thickness of the Ge layer. The Ge thickness is 350 nm (curve 1012) and 500 nm (curve 1010) on 2000 nm Si on silicon dioxide of 4000 nm thickness. Deep trench isolation of 150 nm width and etched into the Si layer to a depth of 1500 nm. The DTI are formed between adjacent pixels and filled with silicon dioxide. The cylindrical holes are also filled with silicon dioxide, planarized with red-green-blue, RGB, color filters and a microlens on each pixel.

The dotted curve 1014 is for a flat, or no hole, 350 nm Ge layer pixel, the solid plot is for a 350 nm Ge layer pixel with a single hole and the dash plot is for a 500 nm Ge layer pixel with a single hole.

External quantum efficiency, EQE, is proportional to absorption, and from the plots of pixels with a single hole, the absorption is over 60% to 1550 nm at most of the wavelengths in the 1000-1550 nm range.

Pixels with a single hole have a higher optical absorption or EQE, than a similar pixel without hole, or flat pixel, over a wavelength range of 1000 nm to 1700 nm as shown in FIG. 10.

FIGS. 11A-11D show simple partial cross sections of a Ge on Si, or any alloy of Ge and/or Ge on Si, photodetectors, according to some embodiments. The photodetectors are formed using selective area growth, SAG, epitaxy. See, e.g., Sammak et al. The hole or holes can also formed by SAG epitaxy for low dark current as discussed in Sammak et al, for sensitive infrared imaging. A back side illuminated (BSI) wafer is stackable with application specific integrated circuit, ASIC, wafer(s). See, e.g., Wuu et al, for complementary metal oxide semiconductor, CMOS, imaging sensor, light distance and ranging, LiDAR, time of flight, TOF, and co-package optics, CPO, optical receiver, Rx, applications.

For simplicity, passivation, planarization, ohmic contacts, anti-reflection structures/coating, connecting electrodes from photodetectors to ASICs/transistors, bonding metal bumps, filters, microlens to name a few are not shown.

The photodetector can be photodiode, avalanche photodiode, single photon avalanche photodiode, phototransistor, photoconductor, metal semiconductor metal and any combination thereof in an array with array size ranging from 2 to a hundred million or more. The photodetector in the array can all have the same size and shape or any combination of sizes and shapes, with 0, 1 or multiple holes in the photodetector.

The hole or holes in the photodetector can be circular, square, rectangular, intersection rectangles as in a cross, tic tac toe or multiple intersecting rectangles, polygonal, oval, any geometric pattern, amoebic and/or any combination thereof. The hole can have a lateral dimension ranging from 100 nm to 10000 nm and in some cases 300 nm-2000 nm. The hole depth can range from 100 nm to 1000 nm. The holes can be periodic and/or aperiodic and/or random.

The Ge and/or Ge alloy such as GeSi, can have a thickness ranging from 200 nm to 1000 nm and can have a lateral dimension ranging from 500 nm to 20000 nm and in some cases 600 nm to 5000 nm.

Figure 11A:
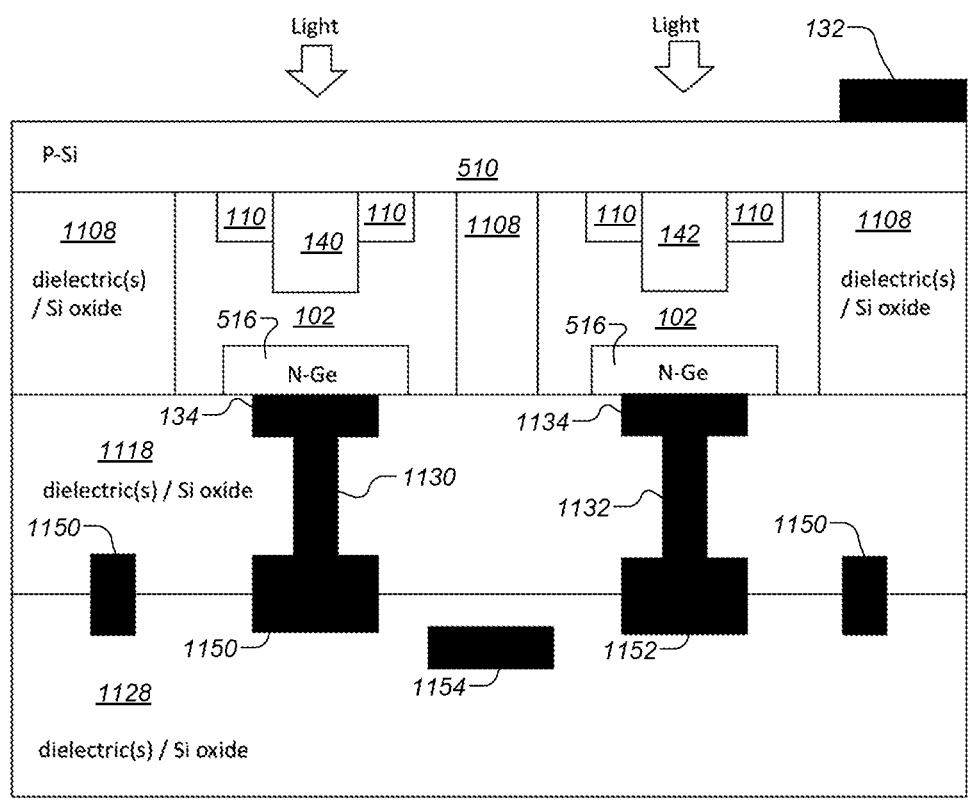
FIGS. 11A-11D show simple partial cross sections of a Ge on Si, or any alloy of Ge and/or Ge on Si, photodetector, according to some embodiments.

As shown in FIG. 11A, the Ge and/or Ge alloy has a P doped region(s) 110, an I or low doped region 102 and a N doped region 516 and the germanium, Ge, and/or Ge alloy is SAG epitaxially grown on a P silicon crystalline surface which can be a bulk wafer or silicon on insulator, SOI, wafer and the silicon, Si, can have a thickness ranging from 10 nm to 3000 nm and the silicon oxide layer thickness can range from 10 nm to 4000 nm for SOI wafers. For bulk Si wafers, the Si can be thinned to a thickness range of 600 nm to 3000 nm. for example.

P and N doping can be achieved by ion implantation process for example follow by rapid thermal anneal. P and N in some cases can be interchanged. In some cases, multiple doped regions of PIPN, PIPIN, NINP, NINIP, for avalanche photodiode for example or NIN, PIP, NPN, PNP for phototransistor for example.

The I or low doped region thickness can range from 10 nm to 900 nm and in some cases 100 nm to 800 nm with a reverse bias voltage between the anode and cathode of a photodiode or avalanche photodiode.

Reverse bias voltage can range from −0.3 volts to −30 volts, and in some cases −0.5 volts to −3 volts and in some cases −1.5 volts to −10 volts. and in some cases −0.5 volts to −1.5 volts.

In some cases, at the interface between P Si 510 and Ge and/or Ge alloys 102 a P doping in Ge 110 may not be necessary and we can have a P Si 510, I or low doped Ge 102 and N Ge 516 and in some cases P and N can be interchanged.

Anode electrodes 132 are formed on the P region 510 such as the P Si which is some cases can be common, and cathode electrodes 134 and 1134 are formed on the N region of the Ge and/or Ge alloy region 102 and both the anode and cathode electrodes are coupled to ASICs that are stacked to the photodetector wafer. For example the cathodes 134 and 1134 are connected via connecting electrodes 1130 and 1132, respectively, to ASIC connecting electrodes 1150 and 1152, respectively, for example to a stacked ASIC wafer as seen in FIG. 7A. Also shown are bonding metal pads 1150, and an ASIC connecting electrode 1154.

The photodetectors, fabricated using SAG epitaxy, are separated by a dielectric such as silicon oxide or nitride, Al oxide to name a few, and are optically and/or electrically isolated without deep trench isolation, DTI, however in some cases shallow trench isolation. STI, and/or DTI can be used for electrical and/or optical isolation. In some cases, transparent metal oxide TMO such as indium tin oxide, ITO, can be used to reduce series electrical resistance as part of the anode electrode for example for P Si 502 that can cover partially or entirely the light impinging surface, in case the Si is N doped, then the TMO can be part of the cathode and can cover partially or entirely the light impinging surface.

Figure 11B:
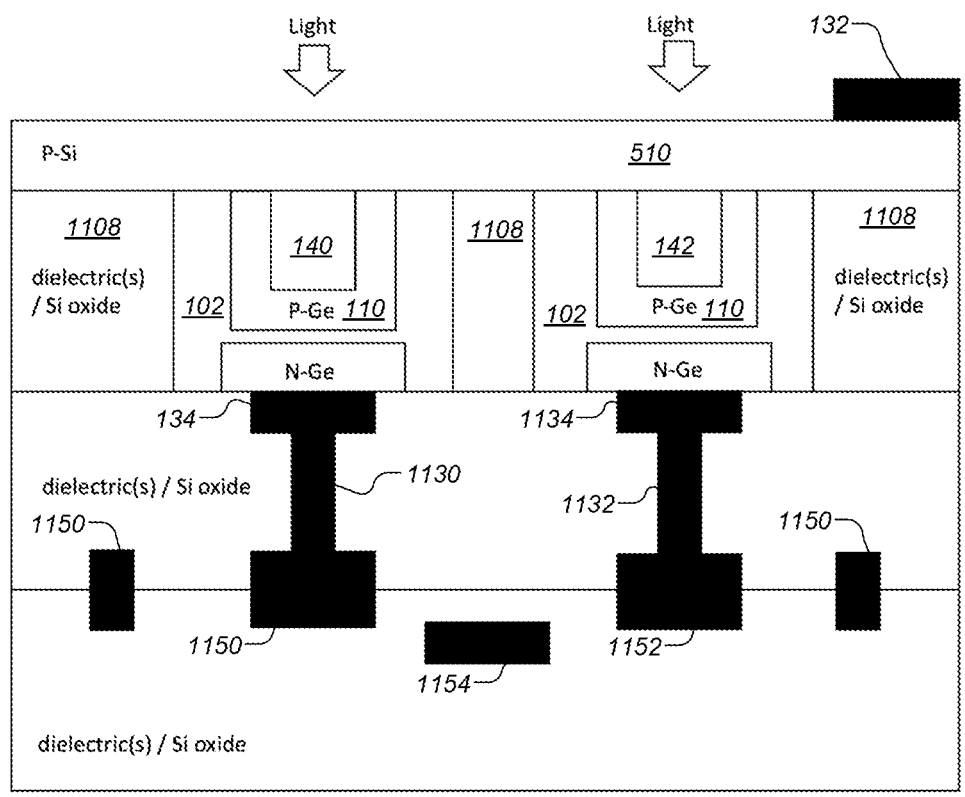

In some cases, when I or low doped Ge, Ge alloy, is epitaxially grown on a doped Si layer of certain polarity the I or low doped Ge, Ge alloy may not require a doped region of that certain polarity. For example, as shown in FIGS. 11A, 11B and 11D, the Si layer 510 is P doped and the intentionally P doped regions 110 in I or low dope Ge may not be needed. The Si P layer 510 forms a heterojunction with the I or low doped Ge 102, and with the N doped regions 516 in the I or low doped Ge, a P(Si)I(Ge)N(Ge) diode. In some cases, P and N can be interchanged. Multiple P and/or N doped region can be formed for PIPN, PIPIN, PN, PIP, NIN doping profiles for avalanche photodiode, APD, single photon APD, SPAD, phototransistors, photoconductors, photodiodes for example.

In selective area growth, SAG, epitaxy of Ge and/or Ge alloys on crystalline Si surfaces, dielectrics such as Si oxide, Si nitride, Al oxide to name a few, can be used to mask areas on the Si surface where SAG epitaxial growth of Ge and/or Ge alloys are not desired.

The shape and size of microstructure hole(s) in Ge and/or Ge alloys using SAG can be formed by the thickness and shape of the dielectric. For example, a cylindrical shaped dielectric forms an approximate cylindrical hole in the Ge during SAG of approximate same dimensions as the dielectric cylinder. Other shapes and depths of hole(s) in Ge and/or Ge alloys such as conical, inverted pyramids, square, rectangular, polygonal, circular, oval, cross, tictactoe, donut, intersecting rectangles, overlapping shapes, clover, amoebic to name a few formed by corresponding dielectric forms.

The lateral dimensions of the hole can range from 100 nm to 10000 nm and in some cases 300 nm to 6000 nm and in some cases 800 nm to 2000 nm. The depth of the hole can range from 100 nm to 3000 nm and in some cases 100 nm to 1000 nm. The cross-sectional sidewalls can have vertical or slanted with positive and/or negative slopes, curved, hourglass, triangular, trapezoid, to name a few.

In the case of multiple holes, the spacing between adjacent holes can range from overlapping and/or intersecting to 2000 nm and in some cases 20 nm to 1000 nm. The holes can be periodic, aperiodic or randomly arranged and can have same and/or different size and/or shape and can have same or different depths.

In the case of Ge and/or Ge alloy hole or holes formed by SAG, the dielectric preform remains in place. During SAG epitaxial growth of Ge and/or Ge alloys around and over the dielectric preform for the hole may in some cases leave voids at certain boundaries between the dielectric preform and Ge and/or Ge alloys depending on factors such as crystal planes.

Pixel or photodetector lateral dimensions can range from 200 nm to 20000 nm and in some cases 300 nm to 3000 nm and in some cases 1000 nm to 10000 nm.

Rise times of the pixel, photodetector due to an optical pulse can range from 0.1 picosecond, ps, to 100 ps and in some cases 0.01-15 ps. Full width half maximum, FWHM, can range from 1-100 ps and in some cases 0.1-5 ps.

FIG. 11B is similar to FIG. 11A except the hole(s) 140 and/or 142 are entirely in a doped region, in this case, P doped regions 110. P and N can be interchanged in some cases.

In some cases as in FIG. 5G, hole or holes can be formed in the Si layer 510. The hole or holes can be partially etched into the Si 510 or entirely through the Si layer 510 on which light impinges. The hole or holes can be filled with dielectric and planarized for subsequent processing for optical filters, microlens, connecting electrodes to name a few.

The photodetectors and/or pixels structures according to some embodiments described herein are configured to be stackable to ASICs wafer(s) where the ASICs can include biasing circuits, amplifiers, signal acquisition and conditioning, artificial intelligence, AI, graphic processing units, GPU, central processing unit, CPU, memory, machine vision, signal transmission, neuromorphic computing and circuits, to name a few.

Wavelength range 1000 nm to 1800 nm and in some cases 1100 nm to 1600 nm, and in some cases with Si removed entirely or partially over the Ge photodetector, the wavelength range can range from 400 nm to 1800 nm and in some cases 400 nm to 1600 nm and in some cases 1000 nm to 1600 nm.

In some cases, for Si thickness less than 100 nm, 10 nm for example Si is semitransparent in the visible wavelengths and the operating wavelength can extend from visible to infrared.

Figure 11C:
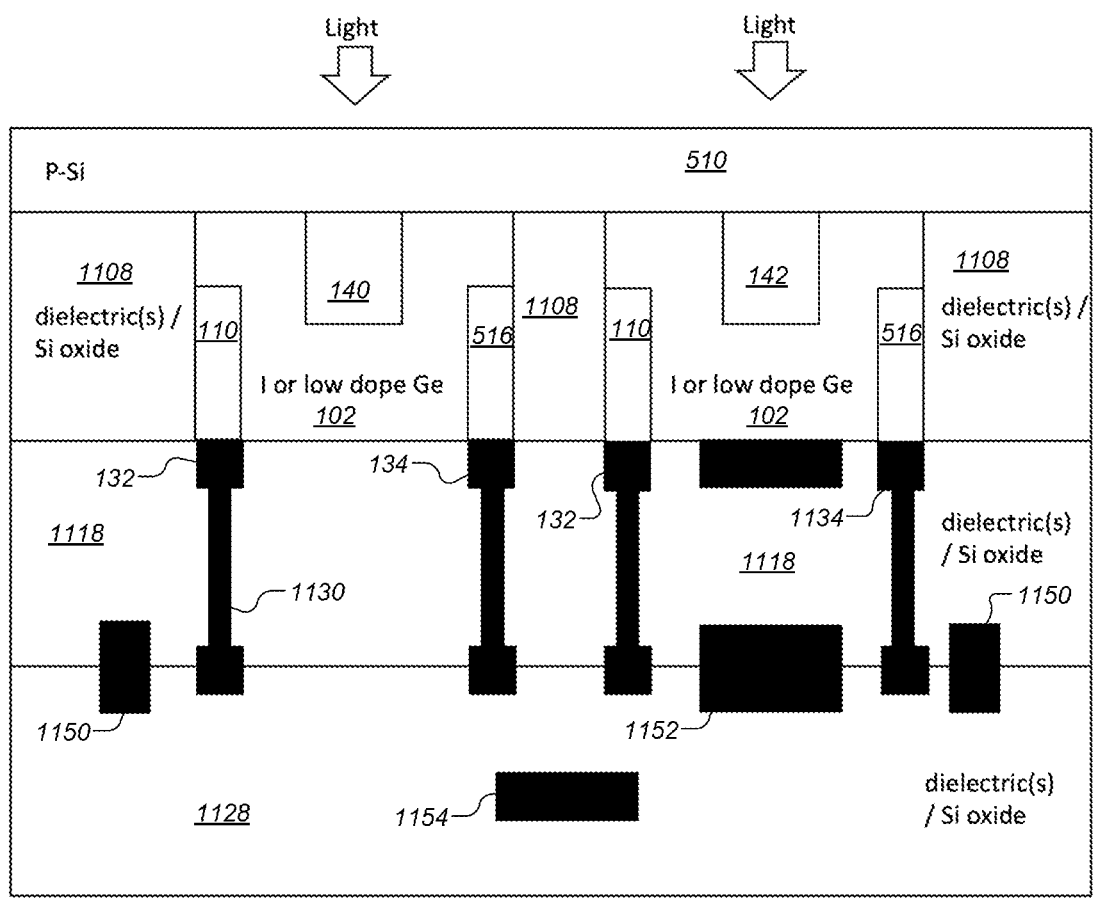
Figure 11D:
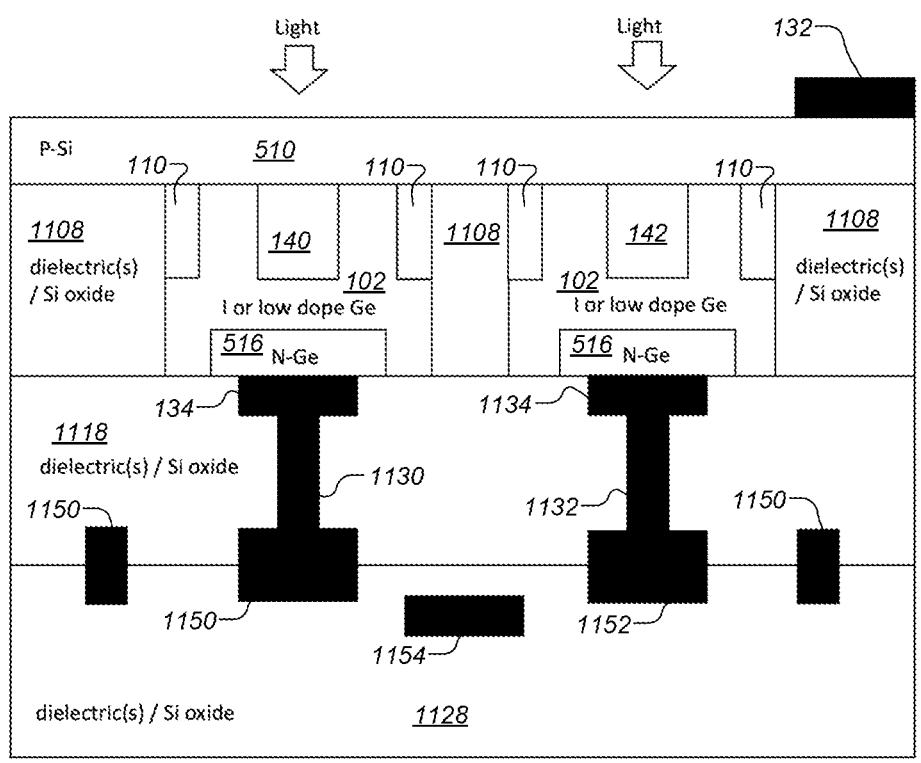

FIG. 11C is similar to FIGS. 11A and 11B, except the P and N doped regions 110, 516 are lateral instead of vertical. The doped regions 110, 516 of opposite polarities are on opposite sides of the side walls of the pixel or photodetector as shown in FIG. 11C. Various lateral doping configurations can be implemented, for example P and N doping on opposite sidewalls, two side walls with P doping and two sidewalls with N doping, three side walls with one polarity doping and one side wall with opposite polarity doping. And in some cases doping can be at one or more corners on the pixel and/or one or more side walls and one or more P and N doped regions, to name a few. In some cases, doped region or regions can partially and/or entirely extend the thickness of the pixel or photodetector. In some cases, the doped region and/or regions can cover partially and/or entirely one or more sidewalls.

As shown in FIG. 11C, both electrodes, anode and cathode are connected on the bottom surface, the surface facing the ASIC wafer that is under dielectric 1128 but for simplicity is not shown in FIGS. 11A-D In some cases, one electrode can be connected to the bottom surface and a second electrode to the top surface where light impinges. In some cases, a conductive region or layer can be a part of the conductive electrode. Electrodes can be metal, silicide, ohmic contact metal alloys, transparent conducting metal oxide, doped semiconductor crystalline or amorphous, to name a few.

FIG. 11D shows an example of a combination of lateral and vertical doping can be implemented, where a doped region of one polarity can be formed at the bottom of the pixel or photodetector as in FIGS. 11A and 11B, and a lateral doped region or regions of the opposite polarity as in FIG. 11C. The doped regions can be formed by ion implantation and/or diffusion. The silicon layer 510 on which light impinges can be removed in some cases.

The pixel or photodetector operate at a reverse bias voltage where the anode has a more negative potential than the cathode and where the reversed biased photodiode can operate in photodiode, avalanche photodiode and/or single photon avalanche photodiode.

Pixels/photodetectors with hole(s) have a higher external quantum efficiency than a similar pixel/photodetector without hole(s) at most infrared wavelength ranges of 800-1800 nm for Ge, Ge alloy on Si, or Ge Ge alloy with Si removed, and 700-1100 nm for Si pixels/photodetectors.

Optical filters can include color filters such as red, green blue, RGB, and in some cases near infrared/infrared NIR/IR, and in some cases RGB and NIR/IR and in some cases no optical filters and in some cases any combination thereof. Optical filters can be bandpass, low pass, high pass or any combination thereof.

Microlens, ML, can be coated with anti reflection coating, ARC, or without ARC. ML can be over a single pixel and/or over multiple pixels, and in some cases ML may not be needed and in some cases ARC can be applied on pixel surfaces and in some cases without ARC and in some cases any combinations thereof.

DTI in some cases can be covered or partially or fully filled by optically opaque or semitransparent or absorbing material(s) or any combination thereof to reduce optical cross talk between adjacent pixels or photodetectors.

Applications include imaging in visible and/or NIR/IR wavelengths, time of flight, TOF such as LiDAR for example. and high speed optical communication, employing wafer level stacking technology.

Figure 12A:
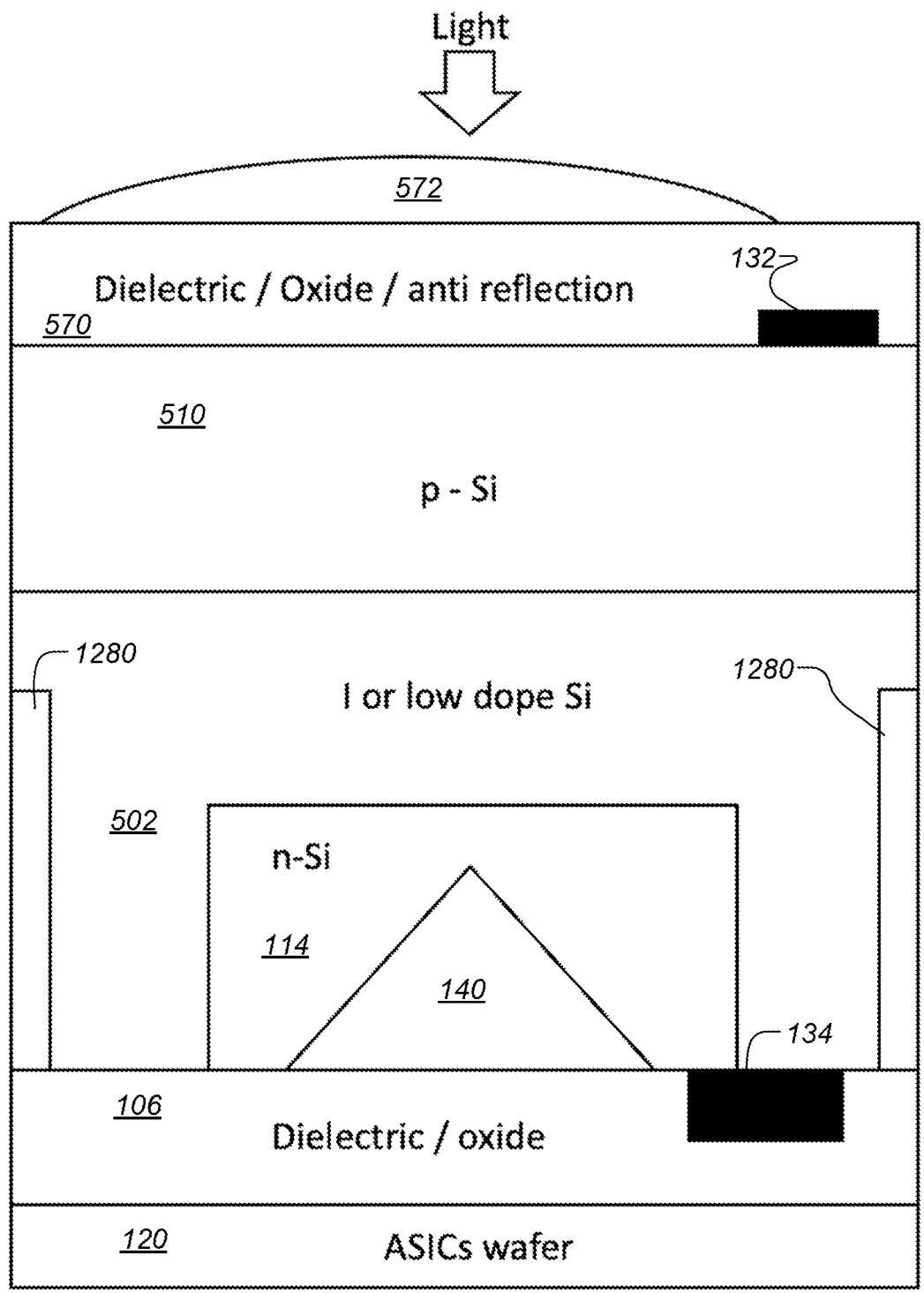
FIGS. 12A and 12B show a simple partial cross section of a pixel or high speed photodetector having a I or low dope Si region, according to some embodiments.
Figure 12B:
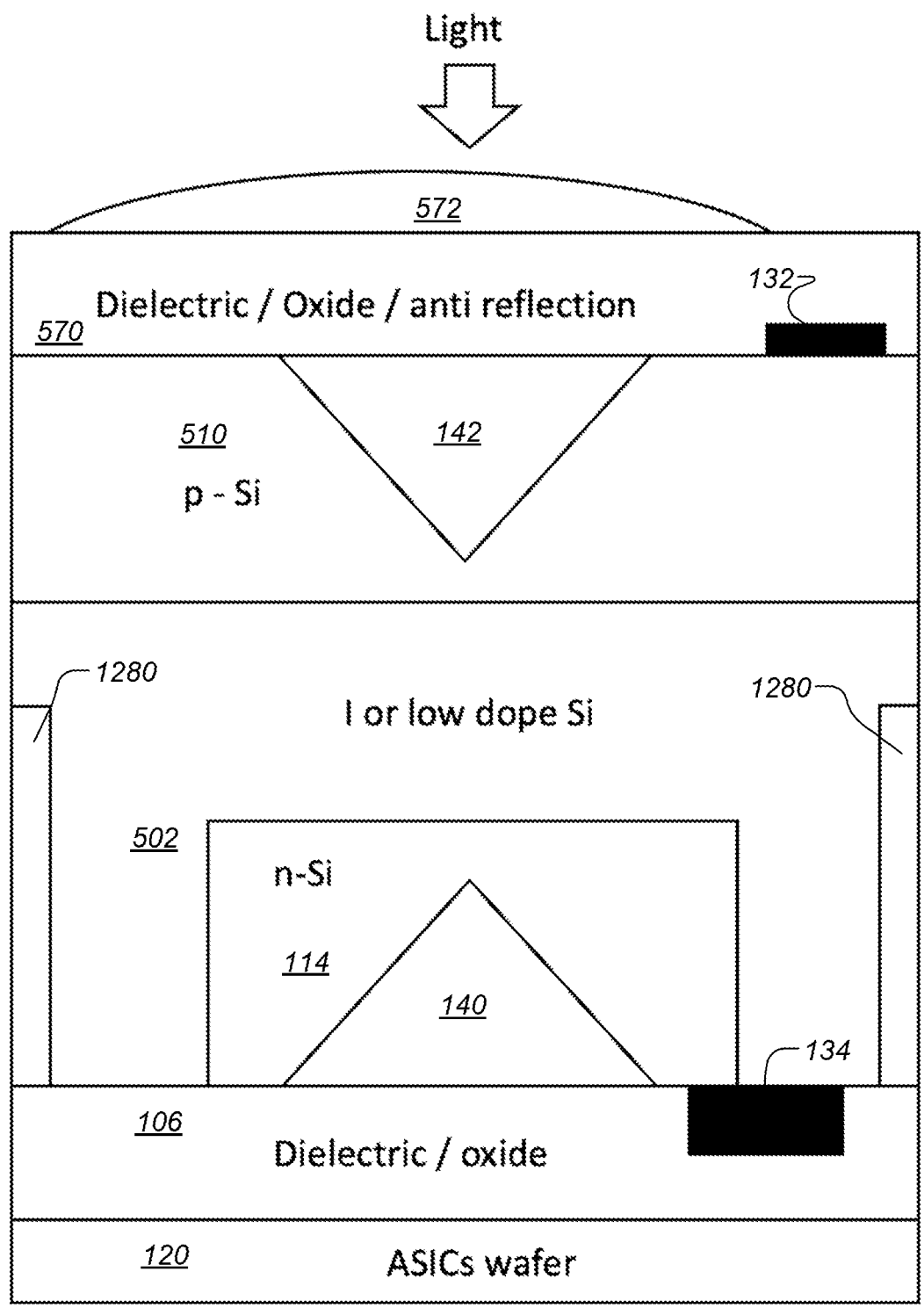

FIGS. 12A and 12B show a simple partial cross section of a pixel or high speed photodetector having an I or low dope Si region 102, according to some embodiments. FIG. 12A is similar to FIG. 5M except that the deep trench isolation, DTI, 1280 that can be etched on the surface on which the microstructure hole(s) 140, in this case pyramid, is etched. The DTI 1280 can be partially etched into the Si such that a common doped region between adjacent pixels or photodetectors.

The DTI can be filled with dielectric, and passivated as discussed in Wuu et al. Forming DTI and hole(s) prior to wafer bonding, such as discussed in Wuu et al, may allow greater flexibility in processing for example not constrained by thermal budget as compared to after wafer bonding of photosensor wafer with integrated circuit wafer.

FIG. 12B is similar to FIG. 12A except for the addition of microstructure hole(s) 142 on the opposite Si surface. The hole(s) 140 and 142 can be same, different size, shape, depths and can be periodic and/or aperiodic on one or both Si surfaces. In some cases, hole or holes can be on one Si surface or on both Si surfaces.

According to some embodiments, hole or holes 140 and/or 142 are filled with dielectrics, passivated and the dielectrics planarized for further processing which in some cases can include electrodes, transparent electrode, optical filters, microlens, to name a few. Electrodes can include, metal, metal silicide, transparent conducting metal oxide, doped semiconductor that can be crystalline, polycrystalline, amorphous, to name a few.

According to some embodiments, other doping profiles can be used, such as shown in FIGS. 7 and 11 of Wuu et al. In addition, FIG. 1 of Ref. Ebiko et al, Low power consumption and high resolution 1280×960 Gate Assisted Photonic Demodulator pixel for indirect Time of flight, IEDM, 2020 (referred herein as "Ebiko et al"), shows a phototransistor like doping profile which can also be incorporated in structures in this disclosure. Other doping configuration can include PN, PIN, PIPN, PIPIN, PIP, NIN, PNP, NPN, where I can be intrinsic, undoped, or low dope and where P and N can be interchanged in some cases. In some cases, two or more electrode or electrical contacts may be used for operation of the photodetector, for example a gate or base electrode. In some cases, metal oxide semiconductor, MOS, and metal semiconductor Schottky contacts may be incorporated in the photodetector.

Multiple P and N doped regions, one or more I regions which can include depleted regions, and one or more N regions and one or more P regions and one or more MOS and/or Schottky contacts can be used. Junctions can be homo or heterojunctions of same or opposite doping polarities.

In some cases, application specific integrated circuits, ASIC, can be included in the photodetector wafer. For further details, see, e.g.: Wuu et al, FIG. 7, (a cross section of a pixel) and FIG. 11 (ASIC with pixel); and Ebiko et al, FIG. 2. The ASIC can consist of transistors, capacitors, resistors, inductors, memristors for signal acquisition, read out, selector, processing, amplification, stoppage, integration, transmission, to name a few, and can include analog digital converter, multiplexer, demultiplexer, transimpedance amplifier, normalizer, equalizer, to name a few.

Applications can include CMOS (complementary metal oxide semiconductor) image sensor, CIS, direct and indirect time of flight, high speed optical communication and the number of photodetectors/photosensors/pixels can range from 1 to 1000 million with or without stacking technology.

Microstructure holes in some cases can have one or more lateral dimensions ranging from 10-10,000 nm and can have a depth ranging from 30-5,000 nm. In some cases, the microstructure hole lateral dimension can vary with depth, and can have one or more lateral dimensions ranging from 0 (coming to a point such as the point of an inverted pyramid) to 10,000 nm, and in some cases from 0-2,500 nm. The microstructure hole cross section can have negative and/or positive slopes and can be conical, pyramidal, inverted pyramid, triangular, trapezoidal, cylindrical, gourd shaped, hourglass shaped, and/or any geometric shapes and/or any combination of shapes. The photodetector/pixel can have one or more microstructure holes, and in the case of multiple holes, the holes can have different lateral dimensions, different shapes, and different depths. The shape of the microstructure hole can be circular, oval, square, polygonal, rectangular, and can intersect to form more complex shapes such as cross, tic-tac-toe, for example, and also can involve the intersection of different shapes such as a circle with rectangles, or 2 circles intersecting, or rectangles intersecting in a star pattern for example to name a few. In the case of multiple holes, the holes can be arranged in a periodic and/or aperiodic, and/or random pattern. In the case of a single microstructure hole, which in some cases can be composed of a multitude of smaller holes, can be positioned at the center of the pixel or off center on the pixel. The microstructure hole can be formed on one or more surfaces of the semiconductor; for example it can be formed on opposing surfaces of the semiconductor as shown and described herein, and can have the same shape and/or different shapes, and in some cases for multiple holes can have the same number of holes on the semiconductor surface and/or different number of holes of the semiconductor surface. In addition, in some cases the depth and lateral dimension of the holes on each semiconductor surface can be different for each of the semiconductor surfaces.

In some cases, for CMOS image sensors, ASICs such as signal acquisition, integrator, processing, transmission, memory, to name a few are monolithically integrated with the photosensors on the same wafer. The ASICs on the sensor wafer are electrically connected to the logic wafer and or memory wafer by means of the wafer stacking process as discussed in Wuu et al. In addition, the photodiode has a pinned region and a gating integrated circuit, as shown in FIG. 11 of Wuu et al.

Figure 13:
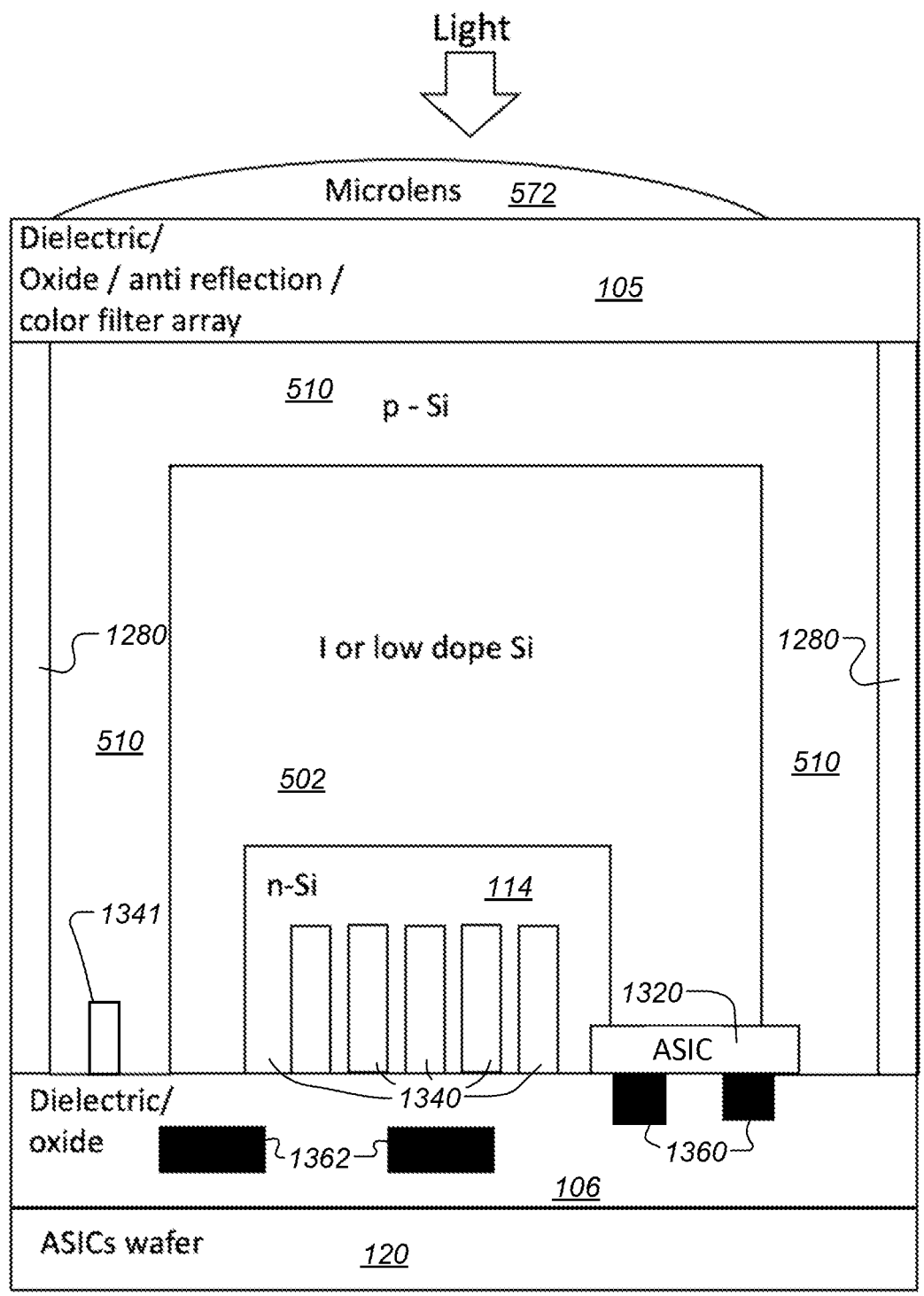
FIG. 13 shows a simple partial cross section of a silicon CMOS image sensor, CIS, pixel or photodetector with one or more nanoholes on the bottom surface or surface on the opposite side of the surface on which light imping on, according to some embodiments.

FIG. 13 shows a simple partial cross section of a silicon CMOS image sensor, CIS, pixel or photodetector with one or more nanoholes on the bottom surface or surface on the opposite side of the surface on which light imping on, according to some embodiments.

The pixel/photodetector is a mesa structure where adjacent mesas are separated by a deep trench isolation 1280, DTI, and where the DTI 1280 can be partially etched into the silicon, Si 510, or etched entirely through the Si 510. The DTI 1280 is partially or entirely filled with solid dielectric. The dielectric can be grown by thermal oxidation and or deposited. In some cases, voids regions lacking solid dielectric can form in DTI 1280. In this example, a top doped regions 510 is p-doped, a bottom doped region 114 is N-doped, i.e. to an opposite polarity, and I-region 502 that is undoped or doped less than regions 410 and 114, is between regions 510 and 114. This, doped regions 114 is at one side of I-region 502 and doped regions 510 is at another side of I-region 502 (and in this example is at the three sides of I-region 502 that do not dielectric region 106).

The Si material 510 thickness can range from 100-7000 nm and in some cases 20-1000 nm. The Si material is cladded top and bottom surfaces by substantially solid dielectric.

The surface onto which light impinges on is planarized and a common electrode that can be a grid and or semitransparent connects a plurally of mesas.

In some cases, the nanoholes 1340 can be on the Si 114 surface on which light impinges on and in some cases nanoholes 1340 can be on more than a single surface.

In the case of CIS pixels wafer, CMOS ASICs 1320 can be monolithically integrated on the CIS pixel wafer and the ASICs 1320 can comprise active silicon, Si, electronics such as transistors and other circuit elements such as capacitors, inductors, resistors, memristor that can be electrically coupled to the CIS pixel for functions such as biasing, signal acquisition, integration, processing, storage, transmission to name a few. The ASICs on the CIS pixel wafer are electrically coupled to one or more CIS pixel/photodetectors.

The ASICs on the pixel wafer are electrically coupled to ASICs on the ASIC wafer(s) 120 via stacking technology, Ref. WUU. Other application can include time of flight, TOF, imaging.

The pixel/photodetector, P/P, can have doping configuration of PN, PIN, PNP, NPN, PIP. NIN. PIPN, PIPIN, NINP to operate as a photodiode, avalanche photodiode, phototransistor, photoconductor, photo capacitor, photo memristor. In some cases, P and N can be interchanged. P and N regions are electrically coupled to monolithically integrated ASIC for biasing and signal processing.

Doping regions of P and N type dopants can be along the periphery of the pixel/Photodetector and the holes can be within a doped region, such as n-Si region 114 and can include a region of lower doping of P or N or undoped material. In some cases, pinned P or N region together with PNP or NPN doping configuration can significantly increase photogenerated carrier lifetimes, in some cases by one order of magnitude or more.

Voltage bias can range 0.1-10 volts, V, and in some cases 1-4 V and in some cases 1-25 V. P/P can have transistor or avalanche/multiplication gain of 2 or more and in some cases gain of 10 to 1000.

The nanoholes 1340 can have same or different size, shape, depth and spacing between adjacent nanoholes. Nanoholes 1340 can overlap and intersect to form more complex shapes.

Hole shape can be circular, oval, square, rectangular, polygonal, cross, chevron, irregular amoebic or any combination thereof. The hole cross section can be inverted pyramid, funnel, conical, cylindrical, rectangular, triangle, trapezoidal, polygonal, icicle, irregular, gourd, hourglass, any combination thereof.

The nanoholes 1340 can be filled or partially filled with solid dielectric such as Si oxide, metal oxide by oxidation and or deposition. In some cases, voids, regions without solid dielectric can be formed in nanoholes as solid dielectrics are grown and or deposited in the nanoholes or hole.

Lateral dimension of holes can range from 10-10000 nm, hole depth can range from 20-5000 nm and spacing between adjacent holes can range from 0-2000 nm and the holes can be periodic, aperiodic, randomly, pseudo randomly, arranged and any combination thereof.

In some cases, one or more additional nanoholes 1341 can be formed in the bottom surface of portions of the top doped region 510 that extend along the lateral sides of I-region 502. The hole or holes 1341 can be narrower and/or shallower that holes 1340.

Elements such as microlens 572, filters such as color filter arrays, anti-reflection coating, passivation oxides, connecting electrodes, bonding metal pads for stacking, to name a few and other components are shown simply or not shown at all for simplicity, may be used to complete a functional sensor array or high speed photodetector array for CIS imaging, TOF imaging or data center optical interconnect applications.

Pixel, photodetectors can be square, circular, hexagonal polygonal and can have different sizes and shapes in an array. The pixels and photodetectors can have lateral dimensions in the ranges 0.2-25 microns and in some cases greater than 25 microns.

Wavelength range of operation for a Si pixel/photodetector can be 300-1100 nm and in some cases 300-1050 nm.

In the case of high speed pixel/photodetector, data −3 dB bandwidth can range from 3-100 gigahertz, GHz. Full width half maximum pulse response can range from 3-100 picoseconds, ps, and rise times range of 1-50 ps.

Pixel/photodetectors with one or more nanoholes have a greater absorption efficiency and or external quantum efficiency than a similar pixel/photodetector lacking one or more nanohole by a factor of 1.1 or more at certain wavelengths ranges from visible to near infrared and in some cases the factor can be 1.3 or grater and in some cases the factor can be 2 or greater.

Also shown in FIG. 13 are connecting electrodes 1360 can be used for biasing and/or signal transmission, and other connecting electrodes 1362.

Figure 14:
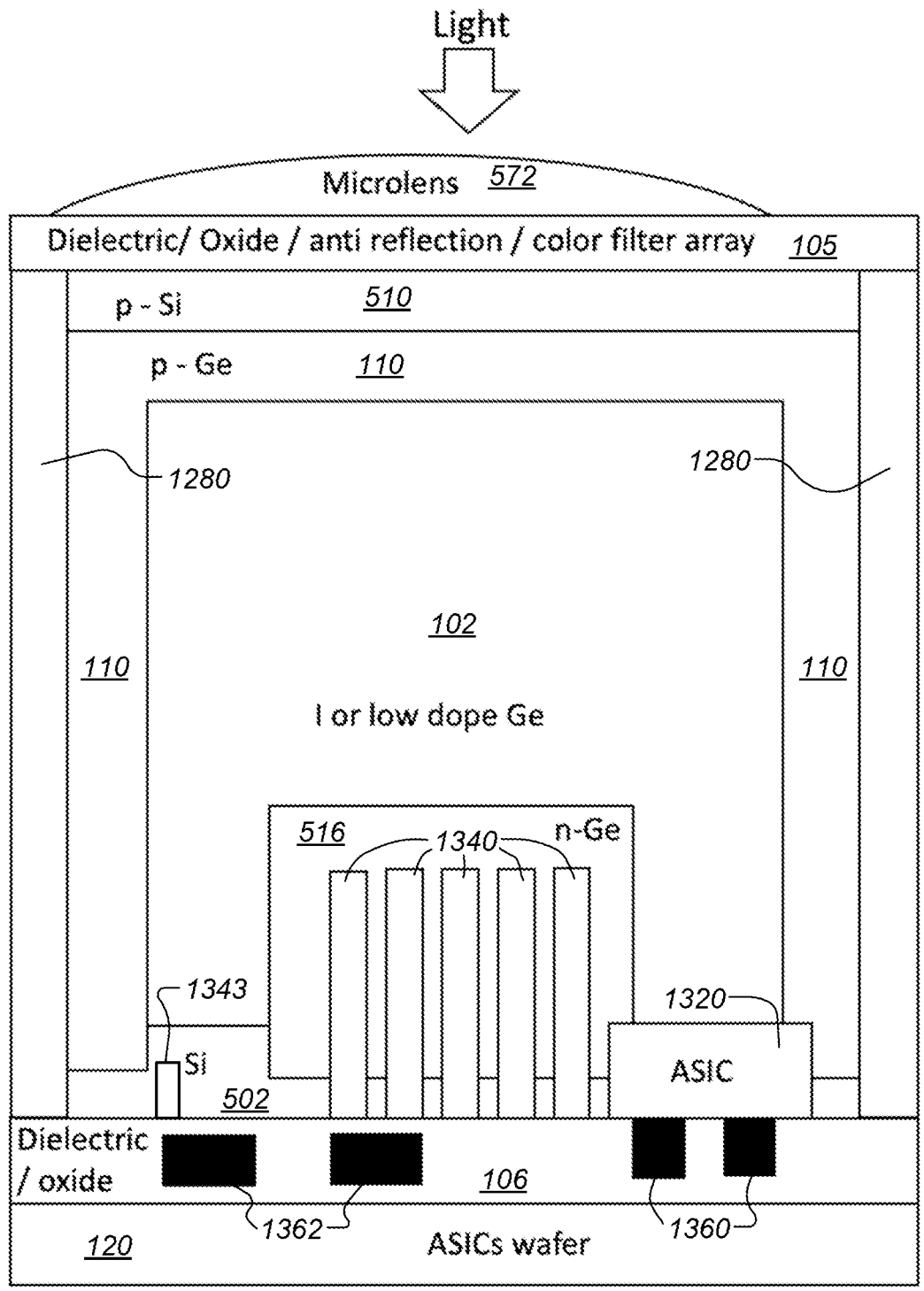
FIG. 14 shows a simple partial cross section of an image sensor, CIS, pixel or photodetector with one or more nanoholes on the bottom surface or surface on the opposite side of the surface on which light imping on, according to some embodiments.

FIG. 14 shows a simple partial cross section of an image sensor, CIS, pixel or photodetector with one or more nanoholes on the bottom surface or surface on the opposite side of the surface on which light impinge, according to some embodiments. FIG. 14 is similar to FIG. 13 except the material is silicon on germanium, germanium alloy on silicon, Si on Ge, Ge alloy on Si. In some cases, the structure can be Ge, Ge alloy on Si. The structure is cladded by substantially solid dielectric. According to some embodiments, electrodes and bonding metallization for stacking with one or more ASICs wafer are provided as shown in FIG. 13. Si region 502 can be doped or can be an undoped portion of a Si substrate in which regions 102, 110, 510, and 516 are formed and ASIC is formed.

Applications for the structure shown includes CIS imaging, TOF imaging and optical interconnect all using stacking technology, stacking pixel/photodetector wafer with monolithically integrated ASICs which can include interposer in the case of optical interconnect optical receiver with high speed photodetector array with one or more ASIC wafers.

Also as shown in FIG. 13, CMOS, complementary metal oxide semiconductor, ASICs can be monolithically integrated in or on the pixel/photodetector wafer and electrically coupled to one or more pixel/photodetector for functions such as biasing, signal acquisition, processing, transmission to stacked ASICs wafers.

The Ge, Ge alloy thickness can range from 20-1000 nm and the Si thicknesses can range from 10-2000 nm.

Nanohole(s) 1340 are etched into the Ge 516 through the Si 502 with hole ranges, shapes, cross sections as discussed in FIG. 13. Doping profiles are also similar to FIG. 13 and as discussed in earlier figures, in APD operation, multiplication gain can occur in Si. In some cases, one or more additional nanoholes 1343 can be formed extending up from the bottom surface of Si region 502, and can be narrower and/or shallower than holes 1340.

Operational wavelength can range from 900-1700 nm and in some cases 1100-1800 nm and in some cases 300-1800 nm or more.

In the case of high speed pixel/photodetector, data −3 dB bandwidth can range from 3-100 gigahertz, GHz. Full width half maximum pulse response can range from 3-100 picoseconds, ps, and rise times range of 1-50 ps.

The addition of nanohole or holes 1340 improves the absorption efficiency and/or external quantum efficiency of the pixel/photodetector by a factor of 1.1 or greater than a similar pixel/photodetector lacking one or more nanoholes over certain wavelength ranges from visible to near infrared.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

The invention claimed is:

1. A semiconductor device comprising:
an I-region of undoped or low doped semiconductor material configured to generate electrical charges in response to light;
a top doped region of semiconductor material over at least a central part of the I-region configured for passage of said light to the I-region to generate said electrical charges;
a bottom doped region of semiconductor material under at least a part of the I-region;
wherein the top and bottom doped regions are doped to opposite polarities such that one is P-doped and the other is N-doped and each is doped more than the I-region;
one or more deliberately formed nanoholes extending up from a bottom surface of the bottom doped region and having closed contours and said bottom surface and centers spaced from each other in two orthogonal dimensions;
wherein the top doped region has a top surface free of deliberately formed nanoholes;
a cover layer and a microlens over said top doped layer;
a dielectric base region comprising solid material that is under said bottom doped region;
an ASIC monolithically integrated with said I-region and doped regions such that the ASIC, the I-region and the doped regions are in a single wafer of semiconductor material;
an ASIC wafer mounted under said dielectric base region;
a first set of electrical contacts in said dielectric base region operatively coupled with said ASIC and a second set of electrical contacts in said dielectric base region operatively coupled with said ASIC wafer; and
deep trench insulation at lateral sides of said I-region and top and bottom doped regions.

2. The semiconductor device of claim 1, in which the one or more nanoholes have lateral dimensions of 10-10,000 nm and heights of 20-5,000 nm.

3. The semiconductor device of claim 1, in which the top doped region comprises a portion over a top side of said I-region and side portions that are between said deep trench insulation and said lateral sides of said I-regions.

4. The semiconductor device of claim 3, further comprising at least one nanohole extending up from a bottom surface of at least one of said side portions of the top doped region.

5. The semiconductor device of claim 4, in which said one or more nanoholes extending up from at least one of the side portions of the top doped region are narrower and/or shallower that said one or more nanoholes extending up from a bottom surface of said bottom doped layer.

6. The semiconductor device of claim 1, in which the I-region and the top and bottom doped regions comprise Si.

7. The semiconductor device of claim 4, in which said cover layer comprises one or more of a solid dielectric material, an antireflection material, and a color filter.

8. A semiconductor device comprising:
an I-region of undoped or low doped semiconductor material comprising Ge or an alloy thereof;
a first top doped region of semiconductor material comprising Ge or an alloy thereof over at least a part of the I-region;

a second top doped region of semiconductor material comprising Si over said first doped region;

a bottom doped region of semiconductor material comprising Ge or an alloy thereof under at least a part of the I-region;

wherein the first and second top doped regions are doped to one polarity and the bottom doped region is doped to another polarity and each is doped more than the I-region;

one or more deliberately formed nanoholes extending up from a bottom surface of the bottom doped region;

wherein the second top doped region has a top surface free of deliberately formed nanoholes;

a cover layer and a microlens over said top doped layer;

a dielectric base region comprising solid material that is under said bottom doped layer;

an ASIC monolithically integrated with said I-region and doped regions;

an ASIC wafer mounted under said dielectric base region;

a first set of electrical contacts in said dielectric base region operatively coupled with said ASIC and a second set of electrical contacts in said dielectric base region operatively coupled with said ASIC wafer; and deep trench insulation (1280) at each lateral side of said I-region and top and bottom doped regions.

9. The semiconductor device of claim 8, in which the one or more nanoholes have lateral dimensions of 10-10,000 nm and heights of 20-5,000 nm.

10. The semiconductor device of claim 8 in which at least one of said first and second top doped regions comprises side portions that are adjacent to lateral sides of said I-region.

11. The semiconductor device of claim 10, further comprising at least one nanohole extending up from a top surface of said dielectric base region.

12. The semiconductor device of claim 11, in which said one or more nanoholes extending up from said dielectric base region are narrower and/or shallower that said one or more nanoholes extending up from a bottom surface of said bottom doped layer.

13. The semiconductor device of claim 12, further including a semiconductor region that is under the bottom doped region.

14. The semiconductor device of claim 13, in which said one or more nanoholes extending up from the bottom surface of the bottom doped region and said one or more nanoholes extending up from said dielectric base region pass through said semiconductor region that is under the bottom doped region.

15. The semiconductor device of claim 8 in which said cover layer comprises one or more of a solid dielectric material, an antireflection material, and a color filter.

16. A semiconductor device comprising:

an I-region of undoped or low doped semiconductor material material configured to generate electrical charges in response to light;

a first doped region of semiconductor material at one side of the I-region configured for passage of said light to the I-region to generate said electrical charges;

a second doped region of semiconductor material at another side of the I-region;

wherein the first and second doped regions are doped to opposite polarities such that one is P-doped and the other is N-doped and each is doped more than the I-region;

one or more deliberately formed nanoholes extending into the second doped region from a surface thereof that faces away from the I-region and having closed contours at said surface and centers spaced from each other in two orthogonal dimensions;

wherein the first doped region has a surface that faces away from the I-region and is free of deliberately formed nanoholes;

a cover layer and a microlens over said first doped layer;

a dielectric base region comprising solid material that is adjacent to said surface of the second doped region that faces away from the I-region;

an ASIC monolithically integrated with said I-region and doped regions such that the I-region, the doped regions and the ASIC are in a single wafer of semiconductor material;

an ASIC wafer mounted adjacent said dielectric base region;

a first set of electrical contacts in said dielectric base region operatively coupled with said ASIC and a second set of electrical contacts in said dielectric base region operatively coupled with said ASIC wafer; and deep trench insulation at outwardly facing sides of said I-region and top and bottom doped regions.

17. The semiconductor device of claim 16, in which the one or more nanoholes have lateral dimensions of 10-10,000 nm and heights of 20-5,000 nm.

18. The semiconductor device of claim 16, in which the first doped region comprises a top portion over a top side of said I-region and side portions that are between said deep trench insulation and lateral sides of said I-regions.

19. The semiconductor device of claim 16, further comprising at least one additional nanohole extending from said dielectric base region into material that is outside said second doped region.

20. The semiconductor device of claim 19, in which said one or more nanoholes extending from said dielectric base region into said material that is outside the second doped region are narrower and/or shallower that said one or more nanoholes extending into said second doped layer.

* * * * *